(12) United States Patent
Valentine et al.

(10) Patent No.: US 11,210,096 B2
(45) Date of Patent: Dec. 28, 2021

(54) VECTOR FRIENDLY INSTRUCTION FORMAT AND EXECUTION THEREOF

(71) Applicant: Intel Corporation, Santa Clara, CA (US)

(72) Inventors: Robert C. Valentine, Kiryat Tivon (IL); Jesus Corbal San Adrian, King City, OR (US); Roger Espasa Sans, Barcelona (ES); Robert D. Cavin, San Francisco, CA (US); Bret L. Toll, Hillsboro, OR (US); Santiago Galan Duran, Molins de Rei (ES); Jeffrey G. Wiedemeier, Austin, TX (US); Sridhar Samudrala, Austin, TX (US); Milind Baburao Girkar, Sunnyvale, CA (US); Edward Thomas Grochowski, San Jose, CA (US); Jonathan Cannon Hall, Hillsboro, OR (US); Dennis R. Bradford, Portland, OR (US); Elmoustapha Ould-Ahmed-Vall, Chandler, AZ (US); James C Abel, Phoenix, AZ (US); Mark Charney, Lexington, MA (US); Seth Abraham, Tempe, AZ (US); Suleyman Sair, Phoenix, AZ (US); Andrew Thomas Forsyth, Kirkland, WA (US); Lisa Wu, New York, NY (US); Charles Yount, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 17/004,711

(22) Filed: Aug. 27, 2020

(65) Prior Publication Data
US 2020/0394042 A1    Dec. 17, 2020

Related U.S. Application Data

(63) Continuation of application No. 16/289,506, filed on Feb. 28, 2019, now Pat. No. 10,795,680, which is a
(Continued)

(51) Int. Cl.
*G06F 9/30* (2018.01)
*G06F 9/34* (2018.01)

(52) U.S. Cl.
CPC ........ *G06F 9/30145* (2013.01); *G06F 9/3001* (2013.01); *G06F 9/30014* (2013.01);
(Continued)

(58) Field of Classification Search
None
See application file for complete search history.

(56) References Cited

U.S. PATENT DOCUMENTS

| | | |
|---|---|---|
| 4,490,786 A | 12/1984 | Nakatani |
| 4,873,630 A | 10/1989 | Rusterholz et al. |

(Continued)

FOREIGN PATENT DOCUMENTS

| | | |
|---|---|---|
| CN | 1688966 A | 10/2005 |
| CN | 1834899 A | 9/2006 |

(Continued)

OTHER PUBLICATIONS

Rahman,R., Xeon Phi Vector Architecture and Instruction Set, 2013, Apress, Intel Xeon PHi Coprocessor Architecture and tools Chapter 3, pp. 31-47. (Year: 2013).*
(Continued)

*Primary Examiner* — Eric Coleman
(74) *Attorney, Agent, or Firm* — Nicholson, De Vos, Webster & Elliott, LLP

(57) ABSTRACT

A vector friendly instruction format and execution thereof. According to one embodiment of the invention, a processor
(Continued)

is configured to execute an instruction set. The instruction set includes a vector friendly instruction format. The vector friendly instruction format has a plurality of fields including a base operation field, a modifier field, an augmentation operation field, and a data element width field, wherein the first instruction format supports different versions of base operations and different augmentation operations through placement of different values in the base operation field, the modifier field, the alpha field, the beta field, and the data element width field, and wherein only one of the different values may be placed in each of the base operation field, the modifier field, the alpha field, the beta field, and the data element width field on each occurrence of an instruction in the first instruction format in instruction streams.

28 Claims, 40 Drawing Sheets

Related U.S. Application Data continuation of application No. 13/976,707, filed as application No. PCT/US2011/054303 on Sep. 30, 2011, now abandoned.

(60) Provisional application No. 61/471,043, filed on Apr. 1, 2011.

(52) U.S. Cl.
CPC ...... *G06F 9/30025* (2013.01); *G06F 9/30032* (2013.01); *G06F 9/30036* (2013.01); *G06F 9/30047* (2013.01); *G06F 9/30149* (2013.01); *G06F 9/30181* (2013.01); *G06F 9/30185* (2013.01); *G06F 9/30192* (2013.01); *G06F 9/34* (2013.01); *G06F 9/30018* (2013.01)

(56) References Cited

U.S. PATENT DOCUMENTS

| | | | |
|---|---|---|---|
| 4,933,839 A | 6/1990 | Kinoshita et al. | |
| 4,945,479 A | 7/1990 | Rusterholz et al. | |
| 5,207,132 A | 5/1993 | Goss et al. | |
| 5,418,973 A | 5/1995 | Ellis et al. | |
| 5,446,912 A | 8/1995 | Colwell et al. | |
| 5,561,808 A | 9/1996 | Kuma et al. | |
| 5,903,769 A | 5/1999 | Arya | |
| 6,185,670 B1 | 2/2001 | Huff et al. | |
| 6,189,094 B1 | 2/2001 | Hinds et al. | |
| 6,625,724 B1 | 9/2003 | Kahn et al. | |
| 7,302,627 B1* | 11/2007 | Mimar | G06F 11/27 714/30 |
| 7,590,009 B2 | 9/2009 | Yoon | |
| 7,627,735 B2 | 11/2009 | Espasa et al. | |
| 7,917,734 B2 | 3/2011 | Coke et al. | |
| 7,966,476 B2 | 6/2011 | Coke et al. | |
| 7,984,273 B2 | 7/2011 | Sprangle et al. | |
| 8,281,109 B2* | 10/2012 | Valentine | G06F 9/3017 712/209 |
| 2002/0130874 A1 | 9/2002 | Baldwin | |
| 2004/0030862 A1 | 2/2004 | Paver et al. | |
| 2005/0125641 A1 | 6/2005 | Ford et al. | |
| 2006/0149939 A1 | 7/2006 | Paver et al. | |
| 2006/0176807 A1 | 8/2006 | Wu et al. | |
| 2007/0074007 A1 | 3/2007 | Topham et al. | |
| 2007/0079179 A1 | 4/2007 | Jourdan et al. | |
| 2007/0157030 A1 | 7/2007 | Feghali et al. | |
| 2007/0162726 A1* | 7/2007 | Gschwind | G06F 9/3836 712/209 |
| 2007/0233766 A1* | 10/2007 | Gschwind | G06F 9/30174 708/490 |
| 2008/0046683 A1* | 2/2008 | Codrescu | G06F 9/3885 712/7 |
| 2008/0077779 A1 | 3/2008 | Zohar et al. | |
| 2008/0082799 A1 | 4/2008 | Bloomfield et al. | |
| 2008/0100628 A1 | 4/2008 | Mejdrich et al. | |
| 2009/0055712 A1 | 2/2009 | Hsu | |
| 2009/0064095 A1* | 3/2009 | Wallach | G06F 8/447 717/106 |
| 2009/0119489 A1 | 5/2009 | Pechanek et al. | |
| 2009/0171994 A1 | 7/2009 | Sprangle et al. | |
| 2009/0172291 A1 | 7/2009 | Sprangle et al. | |
| 2009/0172348 A1 | 7/2009 | Cavin | |
| 2009/0172349 A1 | 7/2009 | Sprangle et al. | |
| 2009/0172356 A1* | 7/2009 | Valentine | G06F 9/382 712/208 |
| 2009/0172364 A1 | 7/2009 | Sprangle et al. | |
| 2009/0172365 A1 | 7/2009 | Orenstien et al. | |
| 2009/0187739 A1 | 7/2009 | Nemirovsky et al. | |
| 2009/0259708 A1 | 10/2009 | Elmer et al. | |
| 2010/0191939 A1 | 7/2010 | Muff et al. | |
| 2010/0217854 A1 | 8/2010 | Durairaj et al. | |
| 2010/0217954 A1 | 8/2010 | Liao et al. | |
| 2010/0241834 A1 | 9/2010 | Moudgill | |
| 2011/0040955 A1 | 2/2011 | Hooker et al. | |
| 2011/0099333 A1 | 4/2011 | Sprangle et al. | |
| 2011/0153983 A1 | 6/2011 | Hughes et al. | |
| 2011/0173418 A1 | 7/2011 | Coke et al. | |
| 2012/0078992 A1 | 3/2012 | Wiedemeier et al. | |
| 2012/0079233 A1 | 3/2012 | Wiedemeier et al. | |
| 2012/0079253 A1 | 3/2012 | Wiedemeier et al. | |
| 2012/0144167 A1 | 6/2012 | Yates et al. | |
| 2012/0166761 A1 | 6/2012 | Hughes et al. | |
| 2012/0185670 A1 | 7/2012 | Toll et al. | |
| 2012/0254588 A1 | 10/2012 | Adrian et al. | |
| 2012/0254589 A1 | 10/2012 | Corbal et al. | |
| 2012/0254591 A1 | 10/2012 | Hughes et al. | |
| 2012/0254592 A1 | 10/2012 | San et al. | |
| 2012/0254593 A1 | 10/2012 | San et al. | |
| 2013/0305020 A1 | 11/2013 | Valentine et al. | |
| 2014/0149724 A1 | 5/2014 | Valentine et al. | |
| 2014/0297991 A1 | 10/2014 | Corbal et al. | |

FOREIGN PATENT DOCUMENTS

| | | |
|---|---|---|
| CN | 1890630 A | 1/2007 |
| CN | 101145384 A | 3/2008 |
| CN | 101488084 A | 7/2009 |
| EP | 1267257 A2 | 12/2002 |
| EP | 2275930 A1 | 1/2011 |
| EP | 1151374 B1 | 8/2017 |
| JP | 61-210430 A | 9/1986 |
| JP | 04-156613 A | 5/1992 |
| JP | 04-163628 A | 6/1992 |
| JP | 11-154144 A | 6/1999 |
| JP | 2002-536712 A | 10/2002 |
| JP | 2005-535966 A | 11/2005 |
| JP | 2010-066893 A | 3/2010 |
| JP | 2014-510350 A | 4/2014 |
| JP | 2014-510351 A | 4/2014 |
| JP | 2014-510352 A | 4/2014 |
| JP | 2014-513340 A | 5/2014 |
| JP | 2014-513341 A | 5/2014 |
| JP | 2016-029598 A | 3/2016 |
| JP | 2016-040737 A | 3/2016 |
| JP | 2017-010573 A | 1/2017 |
| JP | 6274672 B2 | 2/2018 |
| KR | 10-2008-0087171 A | 9/2008 |
| TW | 200935304 A | 8/2009 |
| TW | 201042542 A | 11/2010 |
| TW | 201140448 A | 11/2011 |
| WO | 2004/015563 A1 | 2/2004 |
| WO | 2008/039908 A2 | 4/2008 |
| WO | 2012/134532 A1 | 10/2012 |

(56) References Cited

FOREIGN PATENT DOCUMENTS

WO 2013/095553 A1 6/2013
WO 2013/095657 A1 6/2013

OTHER PUBLICATIONS

Second Office Action, CN App. No. 201610804703.9, dated Oct. 19, 2018, 8 pages.
Advisory Action Office Action, U.S. Appl. No. 13/976,707, dated Jan. 20, 2017, 7 pages.
Advisory Action Office Action, U.S. Appl. No. 13/976,707, dated Oct. 19, 2017, 4 pages.
Allowance Decision of Examination, TW App. No. 100145056, dated Sep. 12, 2014, 2 pages.
Communication pursuant to Article 94(3) EPC, EP App. No. 18177235.1, dated Jan. 31, 2020, 4 pages.
Communication pursuant to Rules 161(2) and 162 EPC, EP App. No. 11862801.5, dated Nov. 8, 2013, 3 pages.
Decision to Grant a Patent, JP App. No. 2016-237947, dated Mar. 13, 2018, 27 pages.
Decision to Grant, JP App. No. 2014-502538, dated Mar. 24, 2015, 3 pages.
Decision to Grant, JP App. No. 2015-087178, dated Nov. 8, 2016, 3 pages.
Examination Report, IN App. No. 8495/CHENP/2013, dated Jul. 31, 2019, 6 pages.
Extended European Search Report and Search Opinion, EP App. No. 11862801.5, dated Apr. 28, 2017, 6 pages.
Extended European Search Report and Search Opinion, EP App. No. 18177235.1, dated Mar. 13, 2019, 5 pages.
Final Office Action from U.S. Appl. No. 13/994,060, dated Nov. 9, 2016, 39 pages.
Final Office Action, U.S. Appl. No. 13/976,707, dated Dec. 13, 2018, 25 pages.
Final Office Action, U.S. Appl. No. 13/976,707, dated Jul. 13, 2017, 19 pages.
Final Office Action, U.S. Appl. No. 13/976,707, dated Oct. 6, 2016, 33 pages.
Final Office Action, U.S. Appl. No. 13/994,060, dated Jul. 26, 2017, 18 pages.
First Office Action and Search report, CN App. No. 201510464707, dated Mar. 2, 2017, 14 pages.
First Office Action and Search Report, CN App. No. 201610804703.9, dated Apr. 2, 2018, 13 pages.
First Office Action, CN App. No. 201180070598.6, dated Mar. 23, 2015, 17 pages.
First Office Action, CN App. No. 201180075835.8, dated Jan. 6, 2016, 10 pages.
First Office Action, JP App. No. 2015-087178, dated Mar. 22, 2016, 14 pages.
First Office Action, TW App. No. 100145056, dated May 27, 2014, 8 pages.
Intention to grant, EP App. No. 11862801.5, dated Mar. 9, 2018, 131 pages.
International Preliminary Report on Patentability, PCT App. No. PCT/US2011/054303, dated May 16, 2013, 117 pages.
International Preliminary Report on Patentability, PCT App. No. PCT/US2011/066998, dated Jul. 3, 2014, 6 pages.
International Search Report and Written Opinion, PCT App. No. PCT/US2011/054303, dated May 25, 2012, 10 pages.
International Search Report and Written Opinion, PCT App. No. PCT/US2011/066998, dated Aug. 17, 2012, 9 pages.
Non Final Office Action, U.S. Appl. No. 13/994,060, dated Mar. 6, 2017, 17 pages.
Non-Final Office Action, U.S. Appl. No. 13/976,707, dated Feb. 10, 2017, 19 pages.
Non-Final Office Action, U.S. Appl. No. 13/976,707, dated Jun. 15, 2016, 15 pages.
Non-Final Office Action, U.S. Appl. No. 13/976,707, dated May 16, 2018, 16 pages.
Non-Final Office Action, U.S. Appl. No. 13/994,060, dated Dec. 29, 2017, 17 pages.
Non-Final Office Action, U.S. Appl. No. 13/994,060, dated Mar. 4, 2016, 43 pages.
Non-Final Office Action, U.S. Appl. No. 14/170,397, dated Feb. 10, 2016, 65 pages.
Notice of Allowance, KR App. No. 10-2013-7029045, dated Nov. 13, 2015, 3 pages.
Notice of Allowance, TW App. No. 101145911, dated Apr. 30, 2015, 3 pages.
Notice of Allowance, TW App. No. 103135824, dated Jul. 22, 2015, 4 pages.
Notice of Allowance, U.S. Appl. No. 13/994,060, dated Aug. 8, 2018, 13 pages.
Notice of Allowance, U.S. Appl. No. 14/170,397, dated Jul. 29, 2016, 9 pages.
Notice of Allowance, U.S. Appl. No. 14/170,397, dated Jun. 24, 2016, 17 pages.
Notice of Allowance, U.S. Appl. No. 16/289,506, dated Jun. 22, 2020, 10 pages.
Notice of Preliminary Rejection, KR App. No. 10-2013-7029045, dated Mar. 26, 2015, 16 pages.
Notice of Reasons for Rejection, JP App. No. 2014-502538, dated Dec. 2, 2014, 8 pages.
Notice on Grant of Patent right for Invention, CN App. No. 201610804703.9, dated Mar. 29, 2019, 4 pages.
Notice on Grant of Patent, CN App. No. 201510464707.2, dated Aug. 3, 2017, 4 pages.
Notice on Grant, CN App. No. 201180070598.6, dated Jun. 21, 2016, 4 pages.
Office Action, CN App No. 201710936456.2, dated Mar. 11, 2020, 10 pages (5 pages of English Translation and 5 pages of Original Document).
Restriction Requirement, U.S. Appl. No. 13/976,707, dated Mar. 1, 2016, 7 pages.
Search Report, TW App. No. 101145911, dated Nov. 17, 2014, 4 pages.
Second Office Action, CN App. No. 201180070598.6, dated Dec. 4, 2015, 6 pages.
Notice on Grant of Patent Right for Invention, CN App. No. 201710936456.2, dated Sep. 24, 2020, 4 pages (2 pages of English Translation and 2 pages of Original Document).
Office Action, EP App. No. 18177235.1, dated Feb. 19, 2021, 5 pages.
Partial European Search Report and Search Opinion, EP App. No. 20199439.9, dated Feb. 25, 2021, 10 pages.
Abrash, M., "A First Look at the Larrabee New Instructions (LRBni)," Apr. 1, 2009, 14 pages, Dr. Dobb's the World of Software Development, United Business Media LLC, downloaded from http://drdobbs.com/article/print?articleId=216402188&siteSectionName= on Nov. 8, 2011.
Abrash, M., "Rasterization on Larrabee: A First Look at the Larrabee New Instructions (LRBni) in Action," Mar. 2009, 116 pages.
AMD64 Technology, AMD64 Architecture Programme's Manual vol. 3: General-Purpose and System Instructions, Feb. 2005, 5 pages, Publication No. 24594, Rev 3.1 0, Advanced Micro Devices.
C++ Larrabee Prototype Library, 18 pages, downloaded from http://software.intel.com/en-US/articles/prototype-primitives-guide/ on Sep. 1, 2010, Intel Corporation.
Data Conversion Rules (Windows), 2010, 4 pages, downloaded from http://msdn.microsoft.com/en-US/library/dd607323(VS.85,printer).aspx on Sep. 28, 2010, Microsoft Corporation.
Forsyth, T., "Larrabee: Software is the New Hardware," 2008, SIGGRAPH2008, Beyond Programmable Shading Fundamentals, Intel Corporation, 41 pages.
Forsyth, T., "SIMD Programming with Larrabee," VCG Visual Computing Group, Intel Corporation, downloaded from http://software.intel.com/sites/default/files/m/d/4/1/d/8/GDC09_Forsyth_Larrabee_final.pdf on Aug. 25, 2010, 58 pages.

(56) References Cited

OTHER PUBLICATIONS

Fu et al., "A Study of the Performance Potential for Dynamic Instruction Hints Selection," 2006, Springer-Verlag Bertin Heidelberg, pp. 67-80.
Intel Advanced Vector Extensions Programming Reference, Aug. 2010, entire document, specifically pp. 105-116, Intel Corporation.
Intel Advanced Vector Extensions Programming Reference, Jun. 2010, 798 pages, Intel Corporation.
Intel Advanced Vector Extensions Programming Reference, Jun. 2011, 595 pages, Intel Corporation.
Intel Architecture Software Developer's Manual, 1997, vol. 2: Instruction Set Reference, first edition, Intel Corporation, pp. 2-1 to 2-6.
Intel Architecture Software Developer's Manual, 1999, entire document, specifically pp. 31-40, vol. 2: Instruction Set Reference, Intel Corporation.
Intel Architecture Software Developers Manual, 1999, vol. 1: Basic Architecture, Intel Corporation, 369 pages.
Intel AVX: New Frontiers in Performance Improvements and Energy Efficiency, May 2008, 9 pages, Intel Corporation.
Intel IA-64 and IA-32 Architectures Software Developer's Manual, Oct. 2011, 4181 pages, Combined vols. 1, 2A, 2B, 2C, 3A, 3B and 3C, Intel Corporation.
Intel IA-64 and IA-32 Architectures Software Developers Manual, Jun. 2010, entire document, specifically pp. 33-49, vol. 2A: Instruction Set Reference, A-M, Intel Corporation.
Intel IA-64 and IA-32 Architectures Software Developers Manual, Jun. 2010, entire document, specifically pp. 693-808, vol. 2B: Instruction Set Reference, N-Z, Intel Corporation.
Intel IA-64 Architecture Software Developer's Manual, Jan. 2000, 76 pages, vol. 4: Itanium Processor Programmer's Guide, Intel Corporation.
Intel Itanium Architecture Software Developer's Manual, May 2010, 796 pages, vol. 1: Application Architecture, Revision 2.3, Intel Corporation.
Intel SSE4 Programming Reference, Jul. 2007, entire document, specifically pp. 43-51, Intel Corporation.
Kousaku Yoshida, "Instruction Set of SH7045F and Assembler Programming (Characteristics of Instructions of SH7045) and (Instruction Set of SH7045)," Transistor Technology Special, CQ Publishing Co., Ltd., Jan. 1, 2003, No. 81, pp. 43-53.
Lecture MIMD1, Fall 2001, 4 pages.
Mehrotra et al., "How to Optimize Your Software for the Upcoming Intel.RTM. Advanced Vector Extensions (Intel.RTM. AVX)," 2009, 115 pages, IDF2009 Intel Developer Forum, Intel Corporation.
Patterson et al., "Computer Organization and Design: the Hardware/Software Interface", 2nd Edition, 1998, book cover page, title page, publication page, p. 751, Morgan Kaufmann Publishers, Inc., San Francisco, California.
Seiler, et al., "Larrabee: A Many-Core x86 Architecture for Visual Computing," Aug. 2008, ACM Transactions on Graphics, vol. 27, No. 3, Article 18, 15 pages.
Short Vector Extensions in Commercial Microprocessors, Nov. 21, 1998, 5 pages, downloaded from http://www.eecg.toronto.edu/.about.corinna/vector/svx/ on Aug. 23, 2011.
Snuffle 2005: the Salsa20 encryption function, 12 pages, downloaded from http://cr.yp.to/snuffle.hlmt#speed on Aug. 23 2011.
Stokes, J., "SIMD architectures," downloaded from http://arstechnica.com/old/content/2000/03/simd.arson Aug. 23, 2011, 2 pages.
Wyatt, Rob, "Wyatt's World: Cracking Open the Pentium III," 2010, UBM Techweb, downloaded from http://www.gamasutra.com/view/feature/3345/wyatts_world_cracking_open_the_.php?print=1 on Aug. 23, 2011, 17 pages.
ZiLABS ZMS-05 ARM 9 Media Processor. 5 pages. 2011 ZiiLABS Pte Ltd., downloaded from https://secure.ziilabs.com/products/processors/zms05.aspx on Aug. 23, 2011.

* cited by examiner

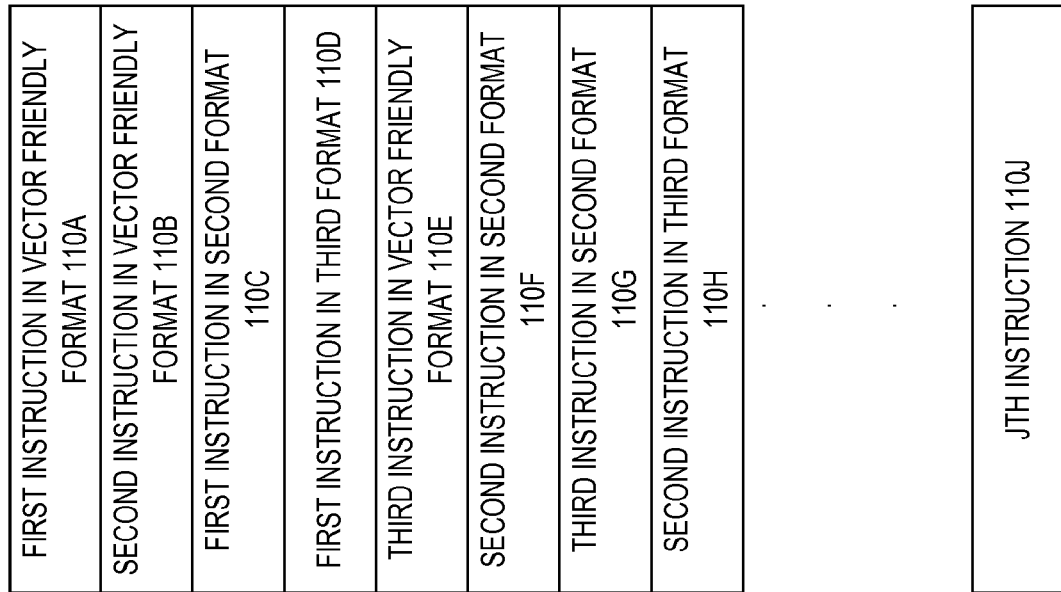
FIG. 1B
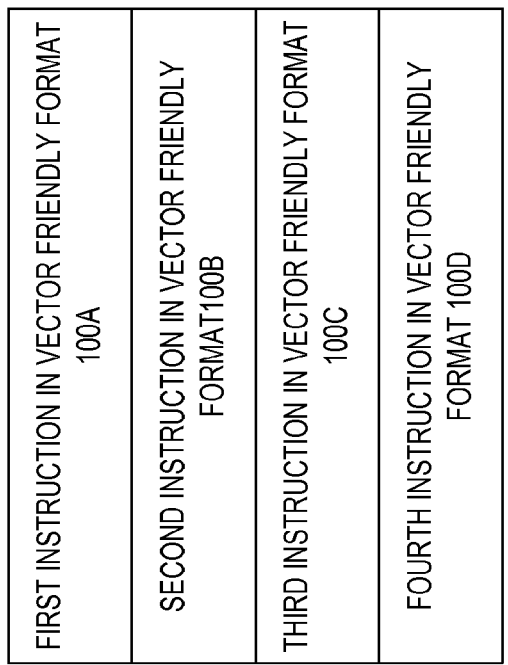
FIG. 1A

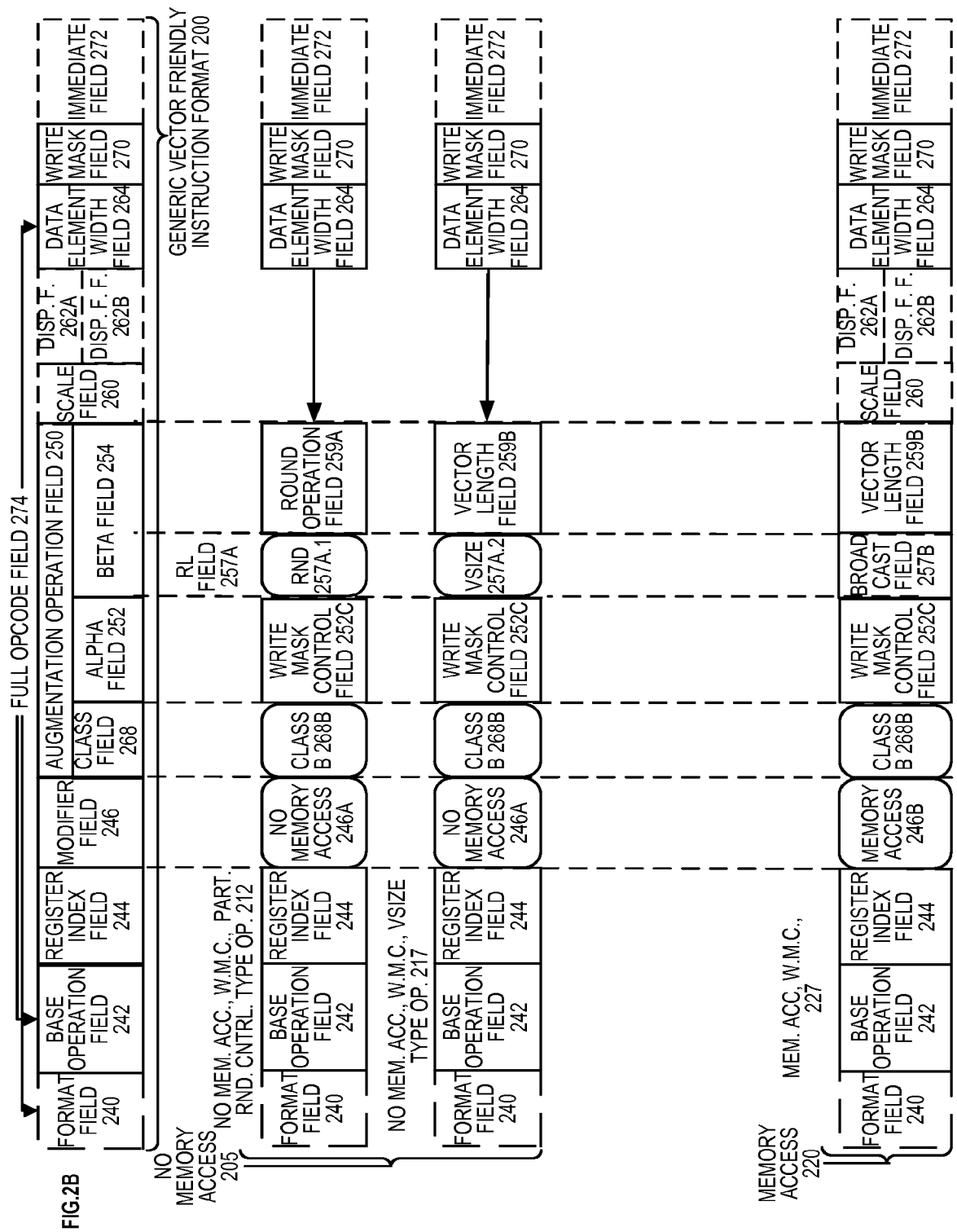

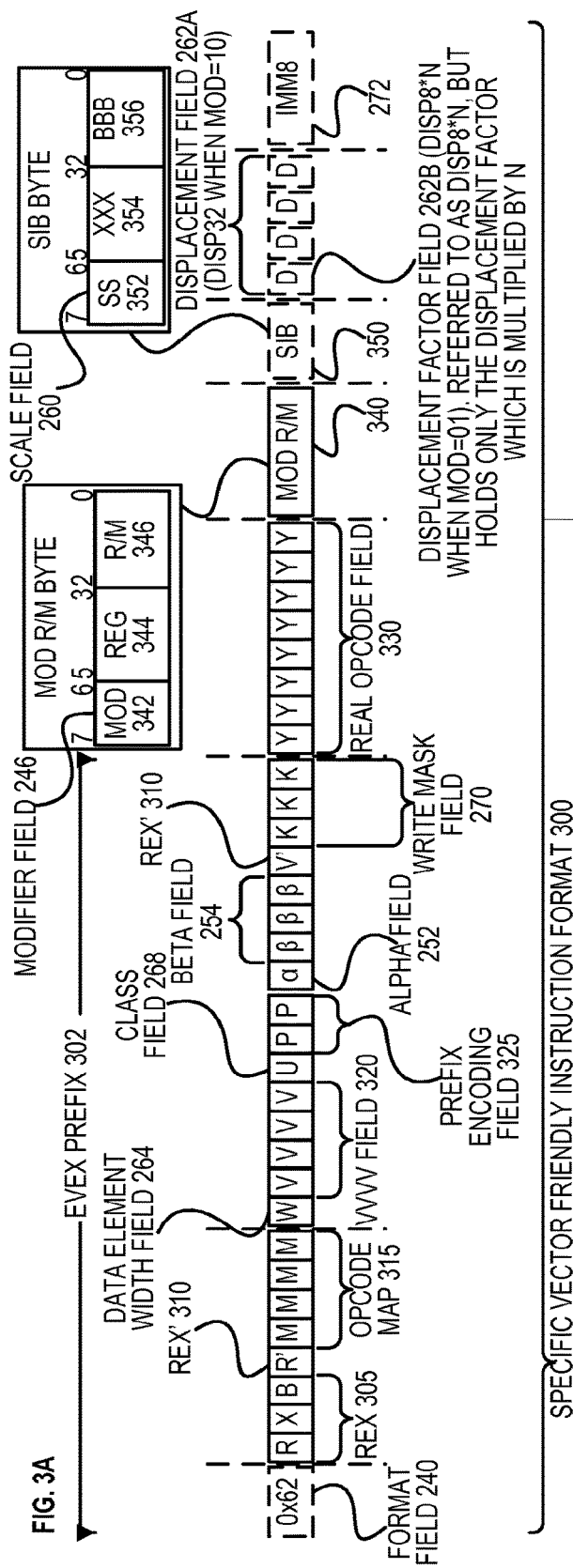

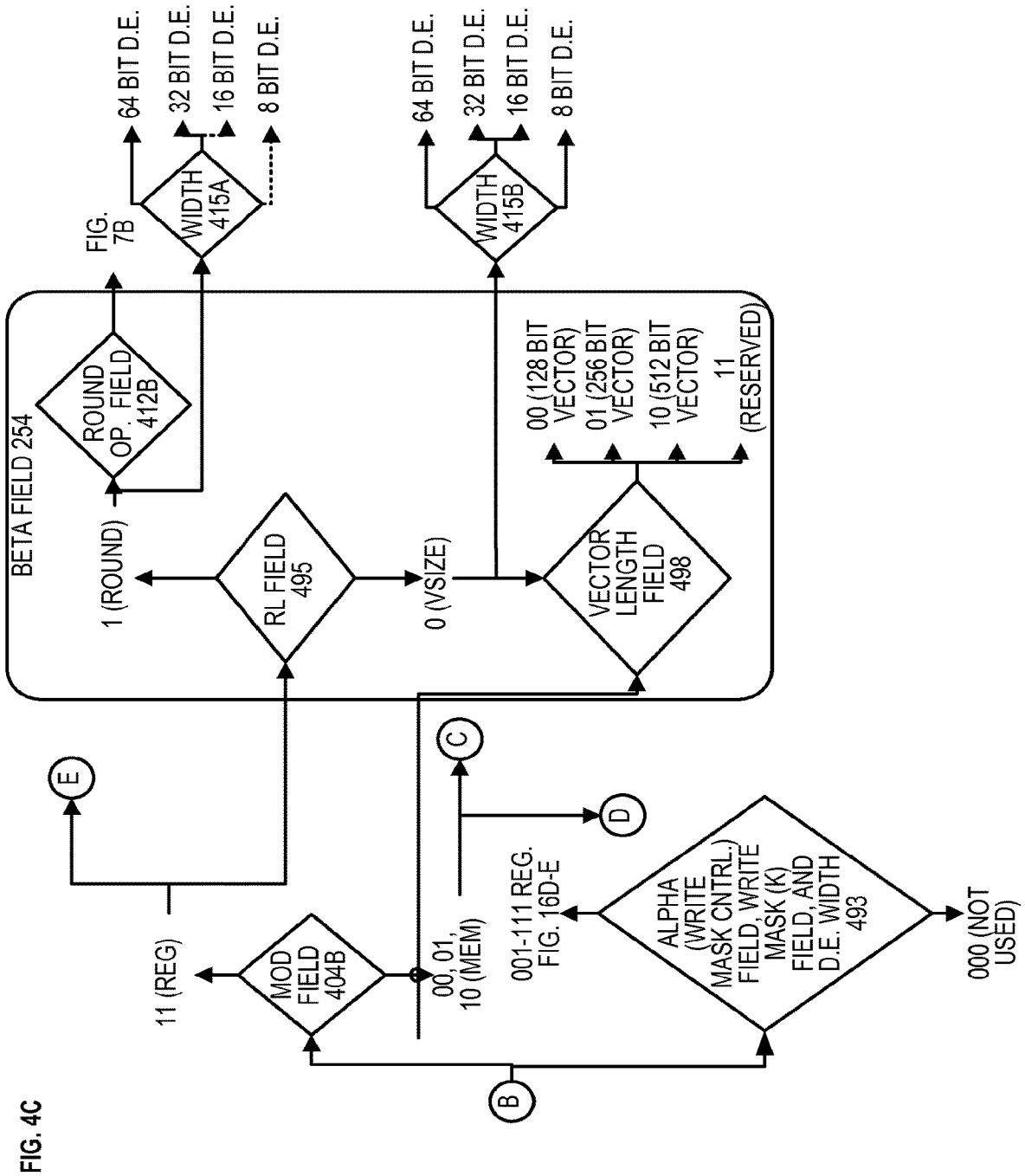

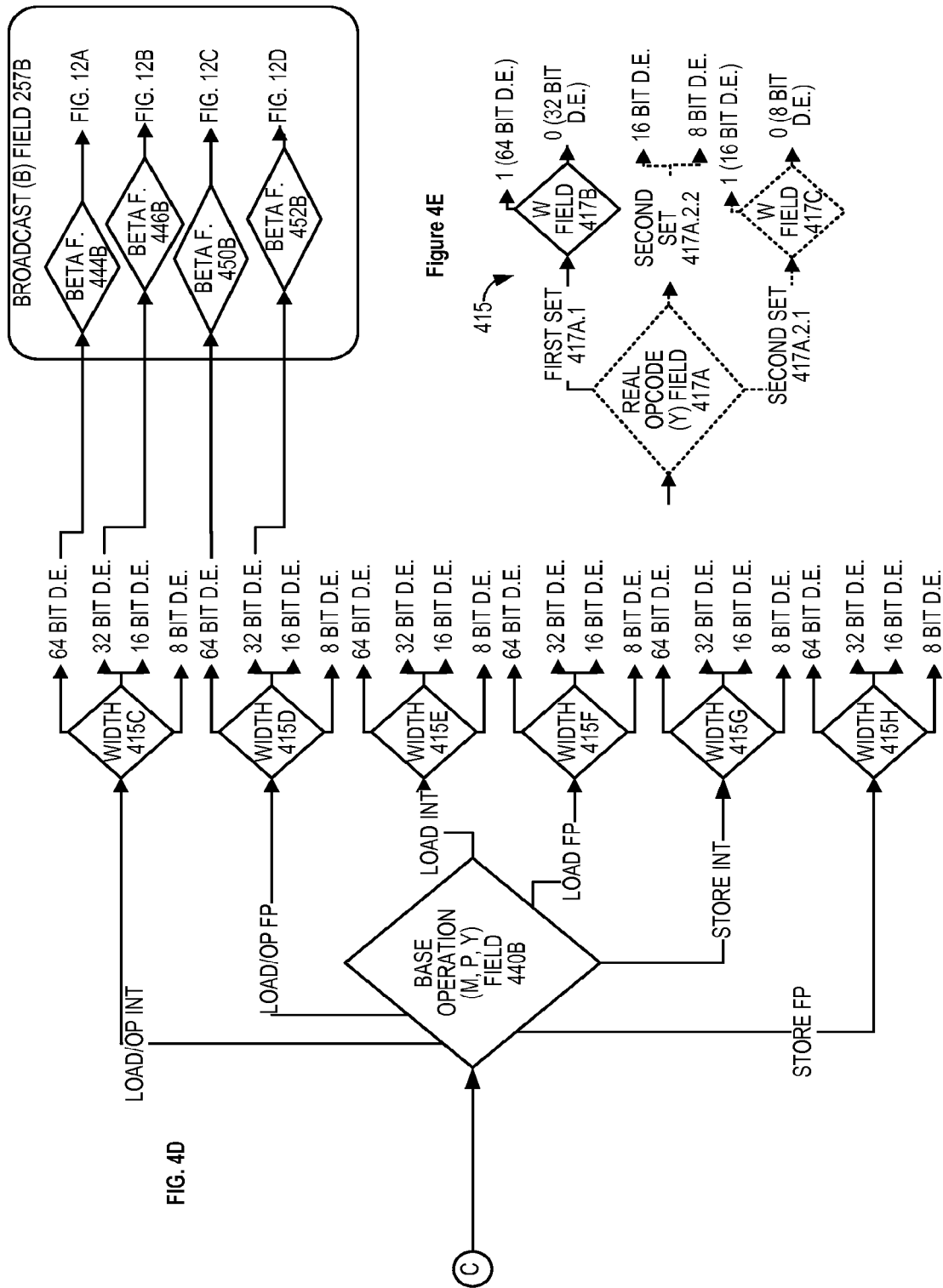

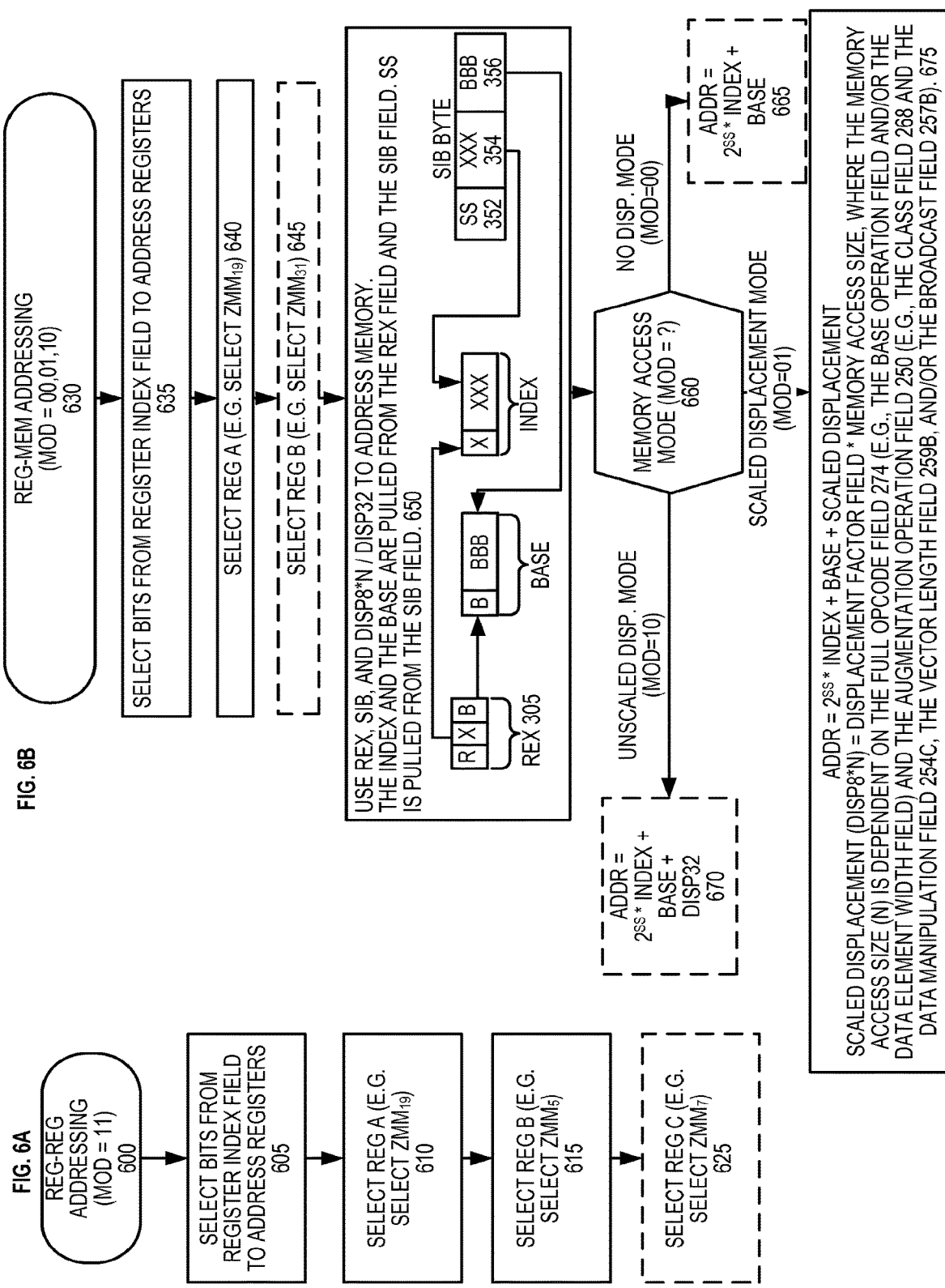

| BYTE | DISP8 FIELD (1 BYTE) -128 TO 127 | DISP32 FIELD (4 BYTES) $-2^{31}$ TO $2^{31}-1$ | EXEMPLARY DISP8*N FIELD†(1 BYTE) -128 TO 127 | | |
|---|---|---|---|---|---|
| | | | WITH N=1 | WITH N=2 | WITH N=64 |
| -128 | • | • | | | • |
| ... | | | | | |
| 0 | • | • | • | • | • |
| 1 | • | • | • | | |
| 2 | • | • | • | • | |
| 3 | • | • | • | | |
| 4 | • | • | • | • | |
| 5 | • | • | • | | |
| 6 | • | • | • | • | |
| 7 | • | • | • | | |
| ... | | | | | |
| 64 | • | • | • | • | • |
| ... | | | | | |
| 127 | • | • | • | | |
| ... | | | | | |
| 254 (127*2) | | • | | • | |
| ... | | | | | |
| 8128 (127*64) | | • | | | • |
| ... | | | | | |
| $2^{31}-1$ | | • | | | |

† DISP8*N REFERS TO THE CONCEPT OF A SCALED DISP., AND THUS AT DIFFERENT TIME DISP8*N REFERS TO THE SOURCES OF THE VALUES (DISP. FACTOR FIELD AND/OR N) DRIVING THE COMP. AND/OR THE RESULTANT (THE SCALED DISP.).

ROUND CONTROL FIELD 254A

| BETA FIELD | ROUNDING MODE | USAGE |
|---|---|---|
| 0.00 | ROUND TO NEAREST (EVEN) | ,{RN} |
| 0.01 | ROUND DOWN (-INF) | ,{RD} |
| 0.10 | ROUND UP (+INF) | ,{RU} |
| 0.11 | ROUND TOWARD ZERO | ,{RZ} |
| 1.00 | ROUND TO NEAREST (EVEN) | ,{RN-SAE} |
| 1.01 | ROUND DOWN (-INF) | ,{RD-SAE} |
| 1.10 | ROUND UP (+INF) | ,{RU-SAE} |
| 1.11 | ROUND TOWARD ZERO | ,{RZ-SAE} |

DO NOT SUPPRESS EXCEPTIONS

SUPPRESS EXCEPTIONS

SAE FIELD 256   ROUND OPERATION FIELD 258

FIG. 7B

| RND OP. FIELD 259A | ROUNDING MODE | USAGE |
|---|---|---|
| 00 | ROUND TO NEAREST (EVEN) | ,{RN-SAE} |
| 01 | ROUND DOWN (-INF) | ,{RD-SAE} |
| 10 | ROUND UP (+INF) | ,{RU-SAE} |
| 11 | ROUND TOWARD ZERO | ,{RZ-SAE} |

SUPPRESS EXCEPTIONS

FIG. 8A 418  64-bit Register SwizzUpConv

| $S_2S_1S_0$ | Function: 4 x 64-bits | Usage |
|---|---|---|
| 000 | no swizzle | zmm0 or zmm0 {dcba} |
| 001 | swap (inner) pairs | zmm0 {cdab} |
| 010 | swap with two-away | zmm0 {badc} |
| 011 | cross-product swizzle | zmm0 {dacb} |
| 100 | broadcast a element across 4-element packets | zmm0 {aaaa} |
| 101 | broadcast b element across 4-element packets | zmm0 {bbbb} |
| 110 | broadcast c element across 4-element packets | zmm0 {cccc} |
| 111 | broadcast d element across 4-element packets | zmm0 {dddd} |

DATA TRANSFORM
FIELD 254B

FIG. 8B 420  32-bit Register SwizzUpConv

| $S_2S_1S_0$ | Function: 4 x 32-bits | Usage |
|---|---|---|
| 000 | no swizzle | zmm0 or zmm0 {dcba} |
| 001 | swap (inner) pairs | zmm0 {cdab} |
| 010 | swap with two-away | zmm0 {badc} |
| 011 | cross-product swizzle | zmm0 {dacb}  — 815 |
| 100 | broadcast a element across 4-element packets | zmm0 {aaaa} — 820 |
| 101 | broadcast b element across 4-element packets | zmm0 {bbbb} |
| 110 | broadcast c element across 4-element packets | zmm0 {cccc} |
| 111 | broadcast d element across 4-element packets | zmm0 {dddd} |

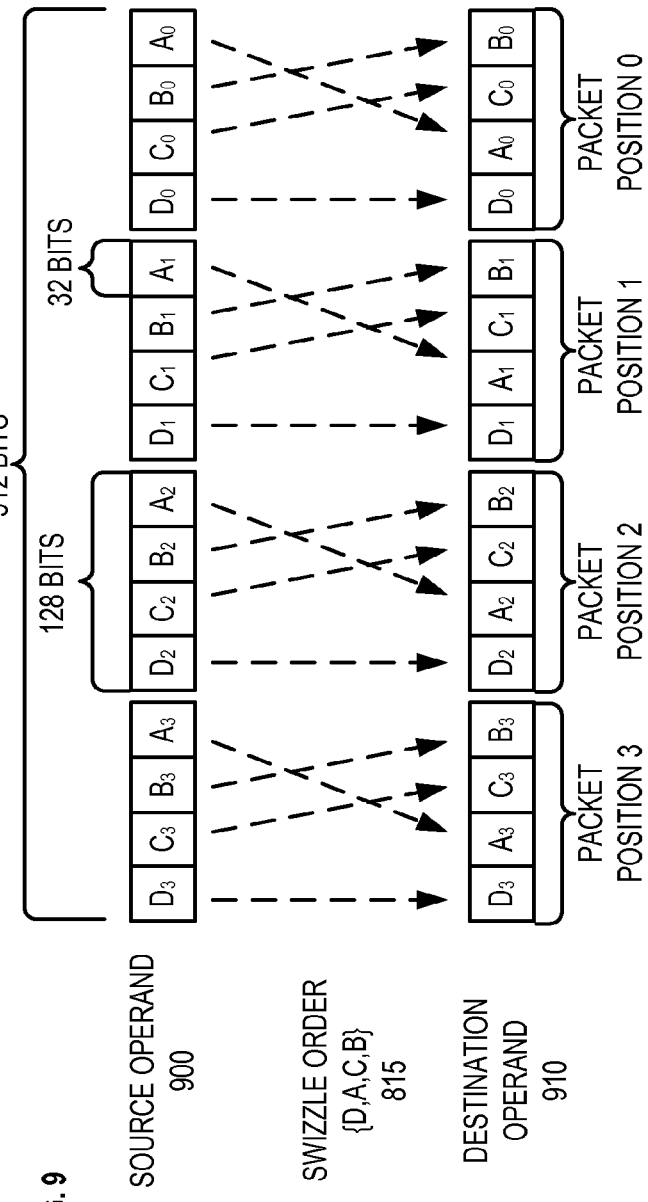

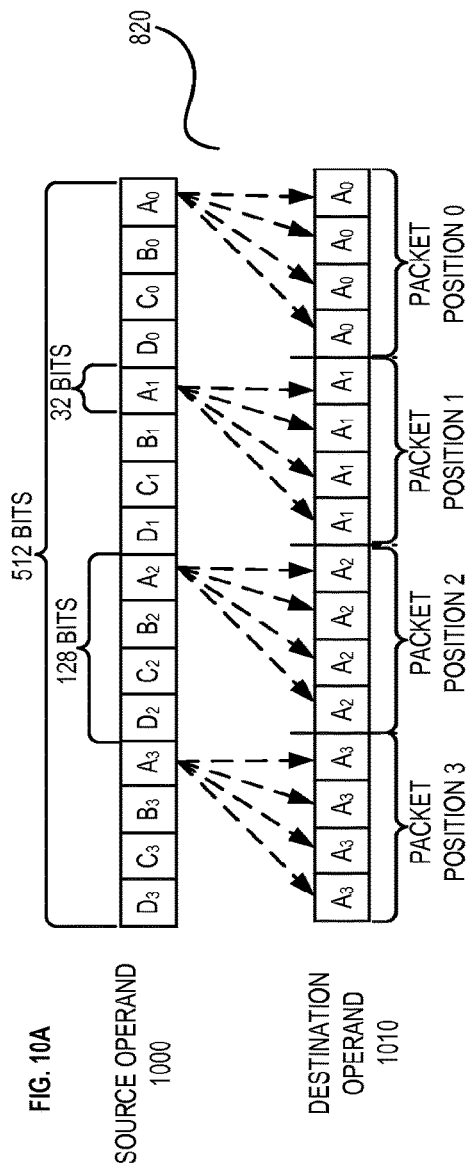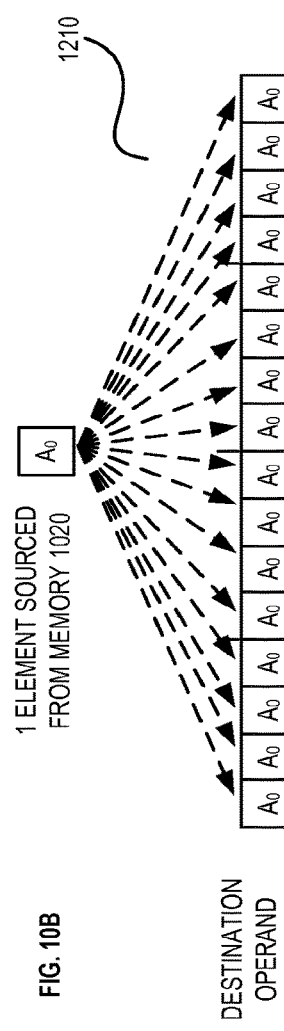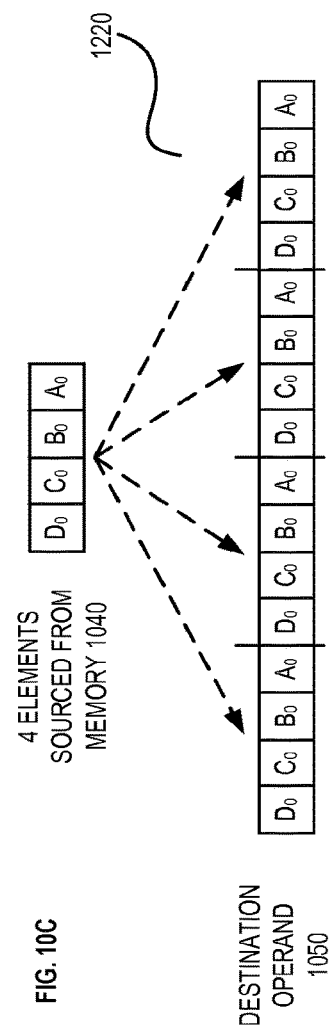

FIG. 11A

| OPCODE MAP MMMM | IMPLIED LEADING OPCODE BYTES | IMMEDIATE |
|---|---|---|
| 0000 | RESERVED | |
| 0001 | 0000 1111 (0x0F) | SOME INSTRUCTIONS |
| 0010 | 0000 1111 0011 1000 (0x0F38) | NO INSTRUCTIONS |
| 0011 | 0000 1111 0011 1010 (0x0F3A) | ALL INSTRUCTIONS |
| 0100 – 1111 | RESERVED | |

FIG. 11B

| PP FIELD | PREFIX MEANING |
|---|---|
| 00 | NO PREFIX |
| 01 | 66 PREFIX / OPCODE EXTENSION |
| 10 | F3 PREFIX / OPCODE EXTENSION |
| 11 | F2 PREFIX / OPCODE EXTENSION |

FIG. 12A 444  64-bit Integer Load-op SwizzUpConv

| S₂S₁S₀ | Function: | Usage |
|---|---|---|
| 000 | no conversion | [rax] {8to8} or [rax] |
| 001 | broadcast 1 element (x8) | [rax] {1to8} |
| 010 | broadcast 4 elements (x2) | [rax] {4to8} |
| 011 | reserved (must #UD) | N/A |
| 100 | reserved (must #UD) | N/A |
| 101 | reserved (must #UD) | N/A |
| 110 | reserved (must #UD) | N/A |
| 111 | reserved (must #UD) | N/A |

BROADCAST FIELD 257B

DATA MANIPULATION FIELD 254C

FIG. 12B 446  32-bit Integer Load-op SwizzUpConv

| S₂S₁S₀ | Function: | Usage |
|---|---|---|
| 000 | no conversion | [rax] {16to16} or [rax]  — 1210 |
| 001 | broadcast 1 element (x16) | [rax] {1to16}  — 1220 |
| 010 | broadcast 4 elements (x4) | [rax] {4to16} |
| 011 | reserved (must #UD) | N/A |
| 100 | uint8 to uint32 | [rax] {uint8} |
| 101 | sint8 to sint32 | [rax] {sint8} |
| 110 | uint16 to uint32 | [rax] {uint16} |
| 111 | sint16 to sint32 | [rax] {sint16} |

BROADCAST FIELD 257B 450    64-bit Floating-point Load-op SwizzUpConv

| $S_2S_1S_0$ | Function: | Usage |
|---|---|---|
| 000 | no conversion | [rax] {8to8} or [rax] |
| 001 | broadcast 1 element (x8) | [rax] {1to8} |
| 010 | broadcast 4 elements (x2) | [rax] {4to8} |
| 011 | reserved (must #UD) | N/A |
| 100 | reserved (must #UD) | N/A |
| 101 | reserved (must #UD) | N/A |
| 110 | reserved (must #UD) | N/A |
| 111 | reserved (must #UD) | N/A |

BROADCAST FIELD 257B = $S_2S_1S_0$

DATA MANIPULATION FIELD 254C

FIG. 12C

452    32-bit Floating-point Load-op SwizzUpConv

| $S_2S_1S_0$ | Function: | Usage |
|---|---|---|
| 000 | no conversion | [rax] {16to16} or [rax] |
| 001 | broadcast 1 element (x16) | [rax] {1to16} |
| 010 | broadcast 4 elements (x4) | [rax] {4to16} |
| 011 | float16 to float32 | [rax] {float16} |
| 100 | uint8 to float32 | [rax] {uint8} |
| 101 | unorm8 to float32 | [rax] {unorm8} |
| 110 | uint16 to float32 | [rax] {uint16} |
| 111 | sint16 to float32 | [rax] {sint16} |

BROADCAST FIELD 257B = $S_2S_1S_0$

456 UpConv$_{i64}$ (INT64)

| $S_2S_1S_0$ | Function: | Usage |
|---|---|---|
| 000 | no conversion | [rax] {8to8} or [rax] |
| 001 | reserved (must #UD) | N/A |
| 010 | reserved (must #UD) | N/A |
| 011 | reserved (must #UD) | N/A |
| 100 | reserved (must #UD) | N/A |
| 101 | reserved (must #UD) | N/A |
| 110 | reserved (must #UD) | N/A |
| 111 | reserved (must #UD) | N/A |

DATA MANIPULATION
FIELD 254C

FIG. 13B

458 UpConv$_{i32}$ (INT32)

| $S_2S_1S_0$ | Function: | Usage |
|---|---|---|
| 000 | no conversion | [rax] {16to16} or [rax] |
| 001 | reserved (must #UD) | N/A |
| 010 | reserved (must #UD) | N/A |
| 011 | reserved (must #UD) | N/A |
| 100 | uint8 to uint32 | [rax] {uint8} |
| 101 | sint8 to sint32 | [rax] {sint8} |
| 110 | uint16 to uint32 | [rax] {uint16} |
| 111 | sint16 to sint32 | [rax] {sint16} |

462 UpConv$_{f64}$ (FP64)

| $S_2S_1S_0$ | Function: | Usage |
|---|---|---|
| 000 | no conversion | [rax] {8to8} or [rax] |
| 001 | reserved (must #UD) | N/A |
| 010 | reserved (must #UD) | N/A |
| 011 | reserved (must #UD) | N/A |
| 100 | reserved (must #UD) | N/A |
| 101 | reserved (must #UD) | N/A |
| 110 | reserved (must #UD) | N/A |
| 111 | reserved (must #UD) | N/A |

DATA MANIPULATION FIELD 254C

FIG. 13C

464 UpConv$_{f32}$ (FP32)

| $S_2S_1S_0$ | Function: | Usage |
|---|---|---|
| 000 | no conversion | [rax] {16to16}[1] or [rax] |
| 001 | reserved (must #UD) | N/A |
| 010 | reserved (must #UD) | N/A |
| 011 | float16 to float32 | [rax] {float16} |
| 100 | uint8 to float32 | [rax] {uint8} |
| 101 | sint8 to float32 | [rax] {sint8} |
| 110 | uint16 to float32 | [rax] {uint16} |
| 111 | sint16 to float32 | [rax] {sint16} |

FIG. 13D

470 DownConv$_{i64}$ (INT64)

| $S_2S_1S_0$ | Function: | Usage |
|---|---|---|
| 000 | no conversion | zmm1 |
| 001 | reserved (must #UD) | N/A |
| 010 | reserved (must #UD) | N/A |
| 011 | reserved (must #UD) | N/A |
| 100 | reserved (must #UD) | N/A |
| 101 | reserved (must #UD) | N/A |
| 110 | reserved (must #UD) | N/A |
| 111 | reserved (must #UD) | N/A |

FIG. 14A

DATA MANIPULATION
FIELD 254C

472 DownConv$_{32}$ (INT32)

| $S_2S_1S_0$ | Function: | Usage |
|---|---|---|
| 000 | no conversion | zmm1 |
| 001 | reserved (must #UD) | N/A |
| 010 | reserved (must #UD) | N/A |
| 011 | reserved (must #UD) | N/A |
| 100 | uint32 to uint8 | zmm1 {uint8} |
| 101 | sint32 to sint8 | zmm1 {sint8} |
| 110 | uint32 to uint16 | zmm1 {uint16} |
| 111 | sint32 to sint16 | zmm1 {sint16} |

FIG. 14B

476 DownConv$_{f64}$ (FP64)

| S$_2$S$_1$S$_0$ | Function: | Usage |
|---|---|---|
| 000 | no conversion | zmm1 |
| 001 | reserved (must #UD) | N/A |
| 010 | reserved (must #UD) | N/A |
| 011 | reserved (must #UD) | N/A |
| 100 | reserved (must #UD) | N/A |
| 101 | reserved (must #UD) | N/A |
| 110 | reserved (must #UD) | N/A |
| 111 | reserved (must #UD) | N/A |

FIG. 14C

DATA MANIPULATION FIELD 254C

478 DownConv$_{f32}$ (FP32)

| S$_2$S$_1$S$_0$ | Function: | Usage |
|---|---|---|
| 000 | no conversion | zmm1 |
| 001 | reserved (must #UD) | N/A |
| 010 | reserved (must #UD) | N/A |
| 011 | float32 to float16 | zmm1 {float16} |
| 100 | float32 to uint8 | zmm1 {uint8} |
| 101 | float32 to sint8 | zmm1 {sint8} |
| 110 | float32 to uint16 | zmm1 {uint16} |
| 111 | float32 to sint16 | zmm1 {sint16} |

FIG. 14D

480
UpConv$_{g32}$ (GR. FP32)

FIG. 15A

| $S_2S_1S_0$ | Function: | Usage |
|---|---|---|
| 000 | no conversion | [rax] {16to16}[1] or [rax] |
| 001 | reserved (must #UD) | N/A |
| 010 | srgb8 to float32 | [rax] {srgb8} |
| 011 | reserved (must #UD) | N/A |
| 100 | unorm8 to float32 | [rax] {unorm8} |
| 101 | snorm8 to float32 | [rax] {snorm8} |
| 110 | unorm16 to float32 | [rax] {unorm16} |
| 111 | snorm16 to float32 | [rax] {snorm16} |

DATA MANIPULATION
FIELD 254C

482
UpConv$_{pg32}$ (P.GR. FP32)

FIG. 15B

| $S_2S_1S_0$ | Function: | Usage |
|---|---|---|
| 000 | no conversion | [rax] {16to16}[1] or [rax] |
| 001 | float10C:11B:11A slot A | [rax] {float11A} |
| 010 | float10C:11B:11A slot B | [rax] {float11C} |
| 011 | float10C:11B:11A slot C | [rax] {float10C} |
| 100 | unorm2D:10C:10B:10A slot A | [rax] {unorm10A} |
| 101 | unorm2D:10C:10B:10A slot B | [rax] {unorm10B} |
| 110 | unorm2D:10C:10B:10A slot C | [rax] {unorm10C} |
| 111 | unorm2D:10C:10B:10A slot D | [rax] {unorm2D} |

484
DownConv$_{g32}$ (GR. FP32)

FIG. 15C

| $S_2S_1S_0$ | Function: | Usage |
|---|---|---|
| 000 | no conversion | zmm1 |
| 001 | reserved (must #UD) | N/A |
| 010 | reserved (must #UD) | N/A |
| 011 | float32 to float16 with RZ | zmm1 {float16rz} |
| 100 | float32 to unorm8 | zmm1 {unorm8} |
| 101 | float32 to snorm8 | zmm1 {snorm8} |
| 110 | float32 to unorm16 | zmm1 {unorm16} |
| 111 | float32 to snorm16 | zmm1 {snorm16} |

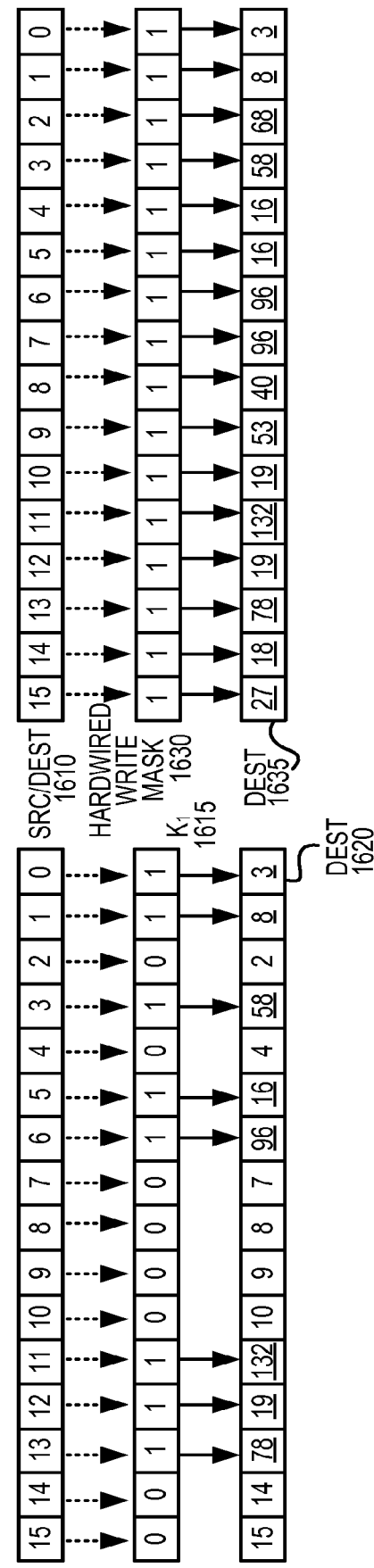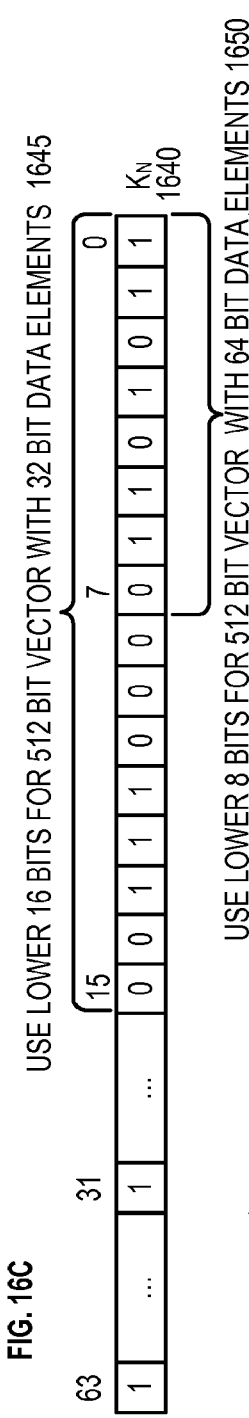
FIG. 16A
FIG. 16B
FIG. 16C

FIG. 16D

MERGING USING WRITE MASK IN K₁ AND 32 BIT DATA ELEMENTS 1660

| SRC A 1605 | 12 | 4 | 65 | 7 | 121 | 9 | 44 | 32 | 89 | 90 | 11 | 12 | 55 | 66 | 7 | 3 |
|---|---|---|---|---|---|---|---|---|---|---|---|---|---|---|---|---|
| | + | + | + | + | + | + | + | + | + | + | + | + | + | + | + | + |
| SRC B | 15 | 14 | 13 | 12 | 11 | 10 | 9 | 8 | 7 | 6 | 5 | 4 | 3 | 2 | 1 | 0 |
| K₁ 1615 | 0 | 0 | 1 | 1 | 1 | 0 | 0 | 0 | 0 | 1 | 1 | 0 | 1 | 0 | 1 | 1 |
| DEST 1620 | 15 | 14 | 78 | 19 | 132 | 10 | 9 | 8 | 7 | 96 | 16 | 4 | 58 | 2 | 8 | 3 |

FIG. 16E

ZEROING USING WRITE MASK IN K₁ AND 32 BIT DATA ELEMENTS 1666

| SRC A 1605 | 12 | 4 | 65 | 7 | 121 | 9 | 44 | 32 | 89 | 90 | 11 | 12 | 55 | 66 | 7 | 3 |
|---|---|---|---|---|---|---|---|---|---|---|---|---|---|---|---|---|
| | + | + | + | + | + | + | + | + | + | + | + | + | + | + | + | + |
| SRC B 1662 | 15 | 14 | 13 | 12 | 11 | 10 | 9 | 8 | 7 | 6 | 5 | 4 | 3 | 2 | 1 | 0 |
| K₁ 1615 | 0 | 0 | 1 | 1 | 1 | 0 | 0 | 0 | 0 | 1 | 1 | 0 | 1 | 0 | 1 | 1 |
| DEST 1664 | 0 | 0 | 78 | 19 | 132 | 0 | 0 | 0 | 0 | 96 | 16 | 0 | 58 | 0 | 8 | 3 |

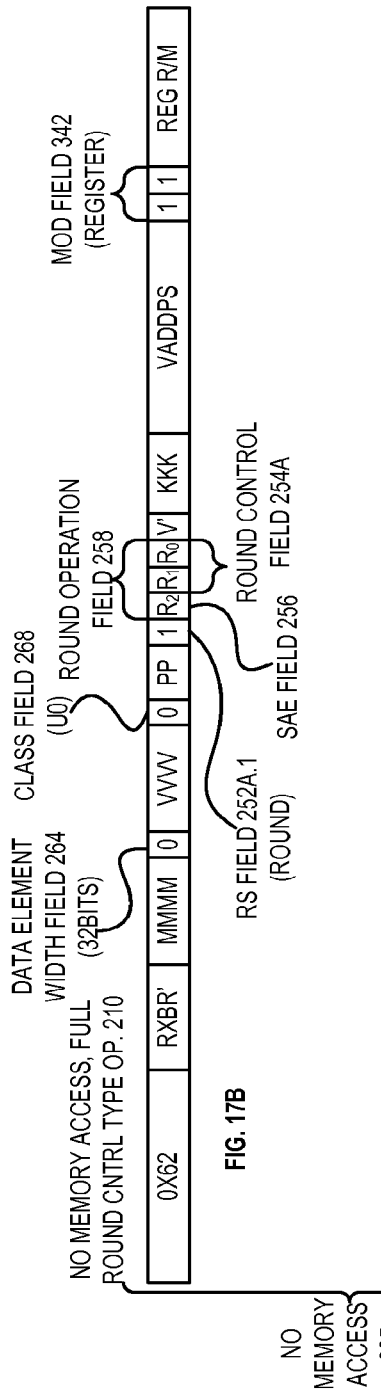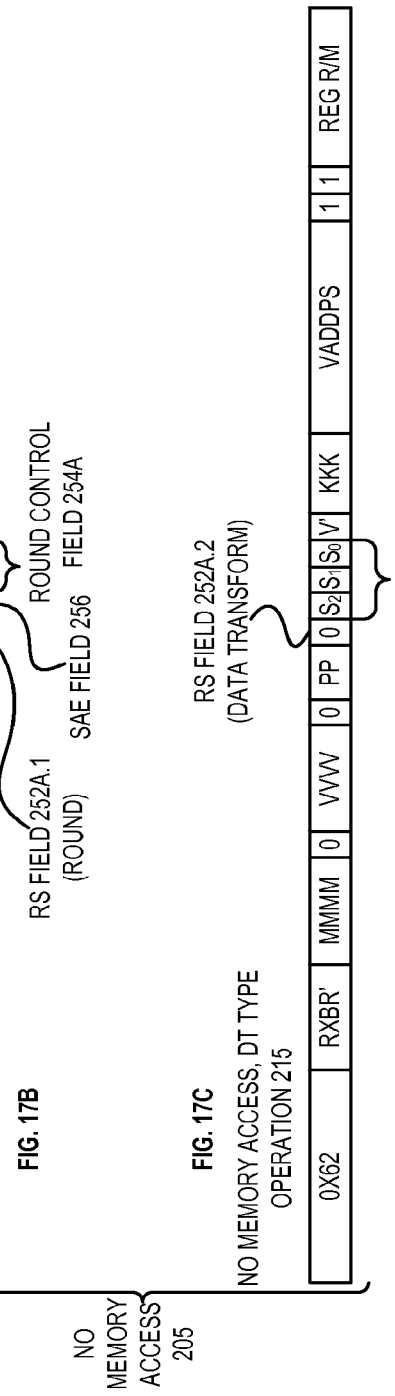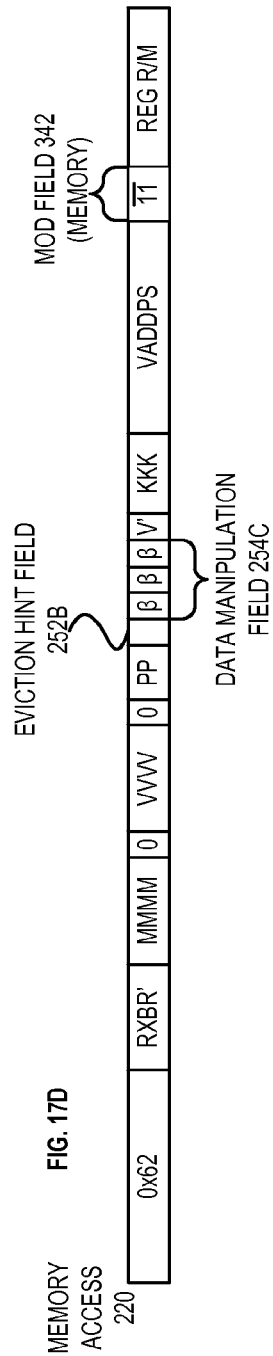

FIG. 18A

NO MEM. ACC., W.M.C., PART. RND. CNTRL. TYPE OP. 212

| 0X62 | RXBR' | MMMM | W | VVVV | U | PP | α | β | β | V' | KKK | Y | Y | Y | Y | Y | MOD REG R/M |

- DATA ELEMENT WIDTH FIELD 264 (32BITS)
- CLASS FIELD 268 (U1)
- ROUND OPERATION FIELD 259A
- MOD FIELD 342 (REGISTER)

FIG. 18B

| 0X62 | RXBR' | MMMM | 0 | VVVV | 1 | PP | α | R₁ | R₀ | 1 | V' | KKK | 1 | 1 | REG R/M |

- WRITE MASK CONTROL FIELD 252C (MERGING OR ZEROING)
- ROUND 257A.1 (RL FIELD 257A)

FIG. 18C

VSIZE 257A.2 (RL FIELD 257A)

| 0X62 | RXBR' | MMMM | 0 | VVVV | 1 | PP | α | 1 | 0 | 0 | V' | KKK | 1 | 1 | REG R/M |

VECTOR LENGTH FIELD 259B (512BITS)

FIG. 18D

| 0X62 | RXBR' | MMMM | 0 | VVVV | 1 | PP | α | 0 | 1 | 0 | V' | KKK | 1 | 1 | REG R/M |

VECTOR LENGTH FIELD 259B (256BITS)

FIG. 18E

| 0X62 | RXBR' | MMMM | 0 | VVVV | 1 | PP | α | 0 | 0 | 0 | V' | KKK | 1 | 1 | REG R/M |

VECTOR LENGTH FIELD 259B (128BITS)

NO MEMORY ACCESS 205
NO MEM. ACC., W.M.C., VSIZE TYPE OP. 217

FIG. 18F

MEM. ACC., W.M.C., 227

| 0X62 | RXBR' | MMMM | 0 | VVVV | 1 | PP | α | L₁ | L₀ | B | V' | KKK | VADDPS | MOD FIELD 342 (MEMORY) | 1 1 | REG R/M |

- VECTOR LENGTH FIELD 259B
- BROADCAST FIELD 257B

MEMORY ACCESS 220

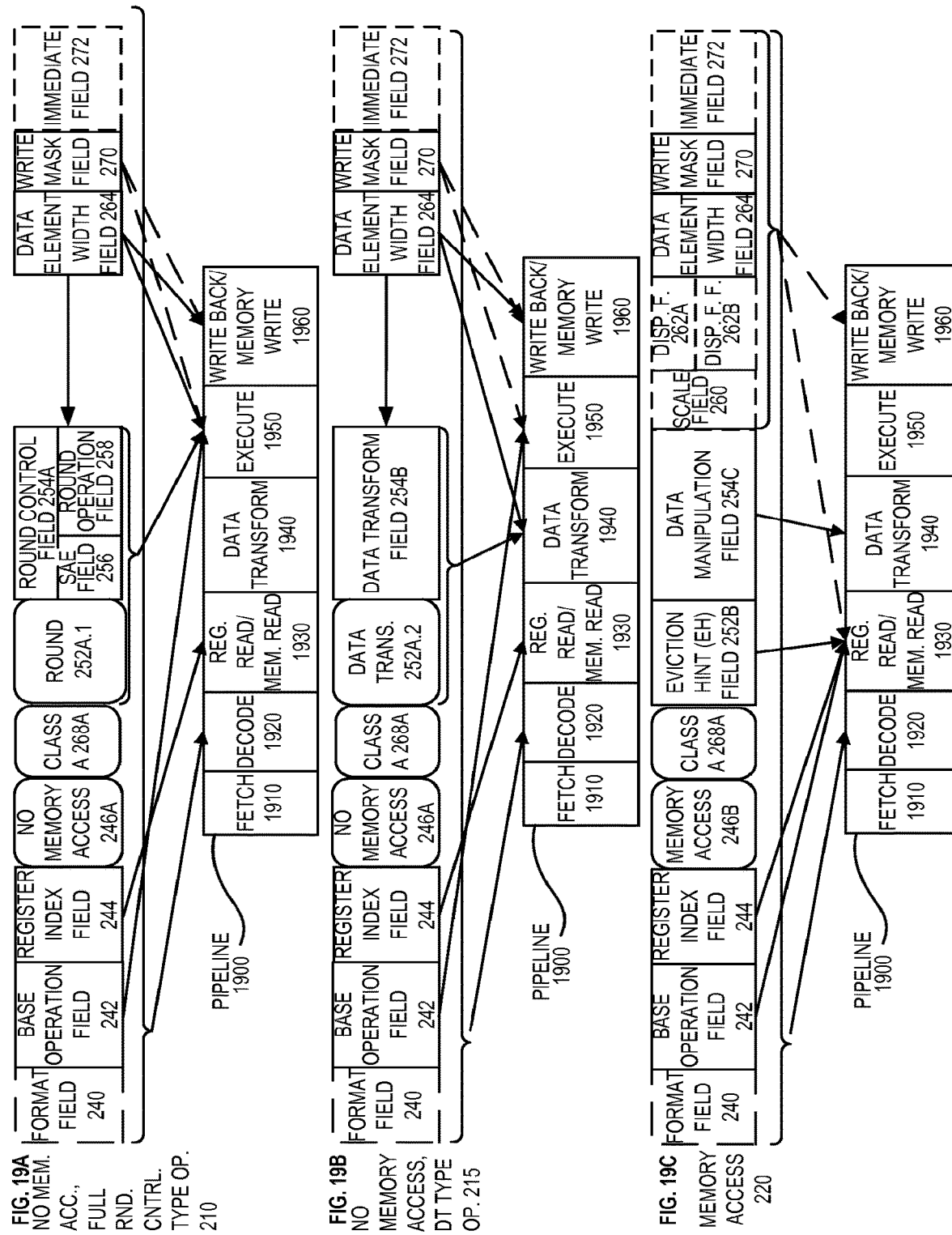

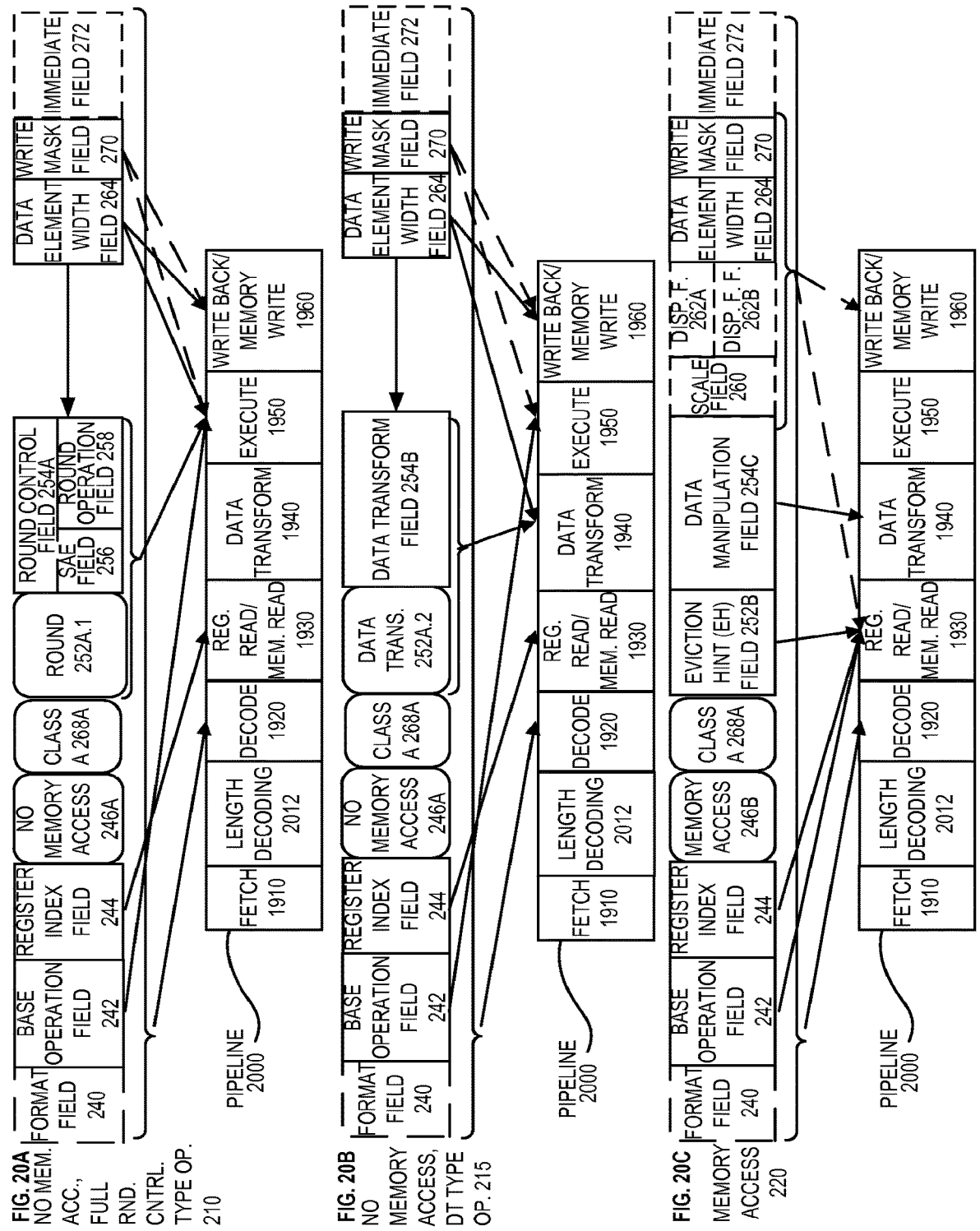

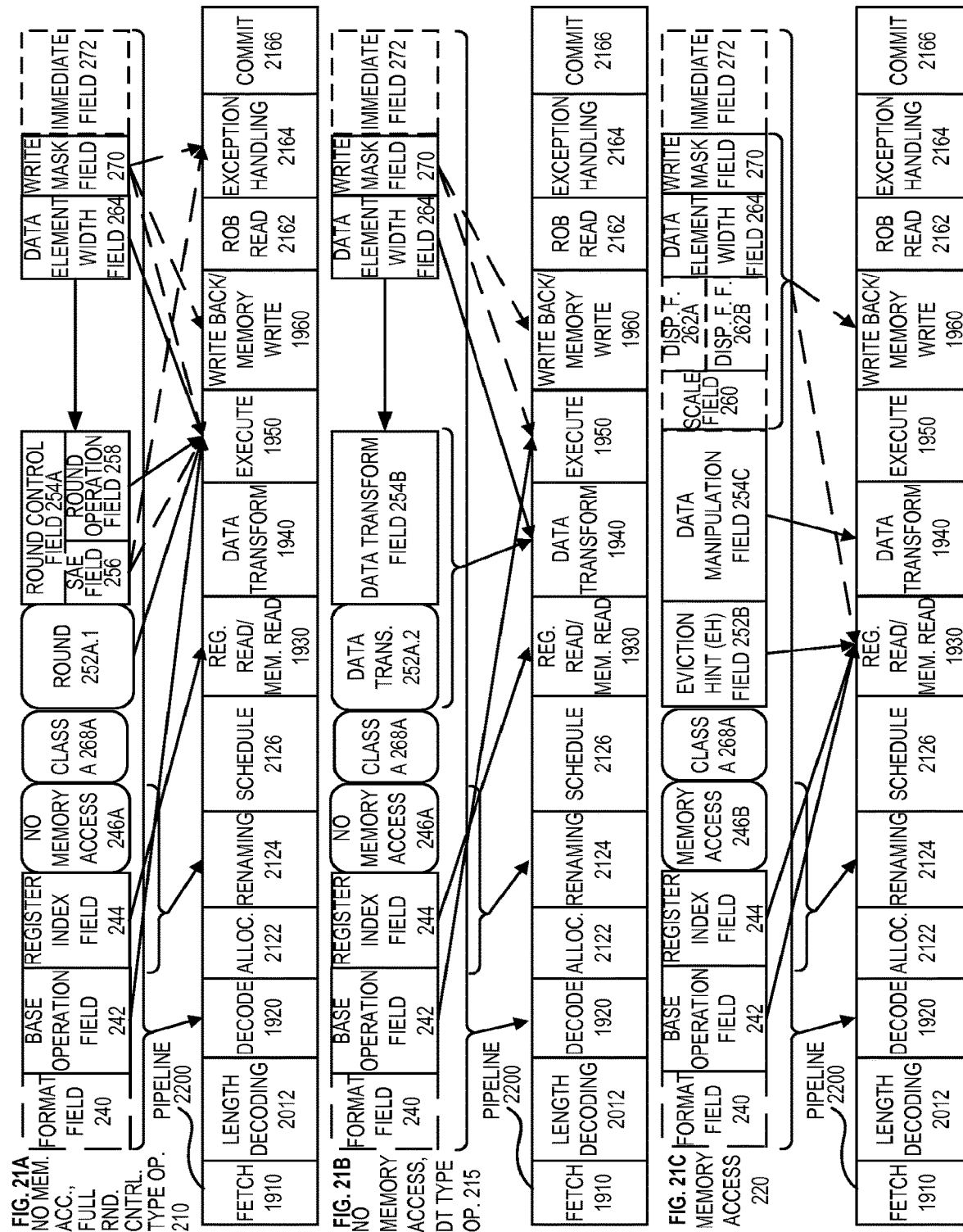

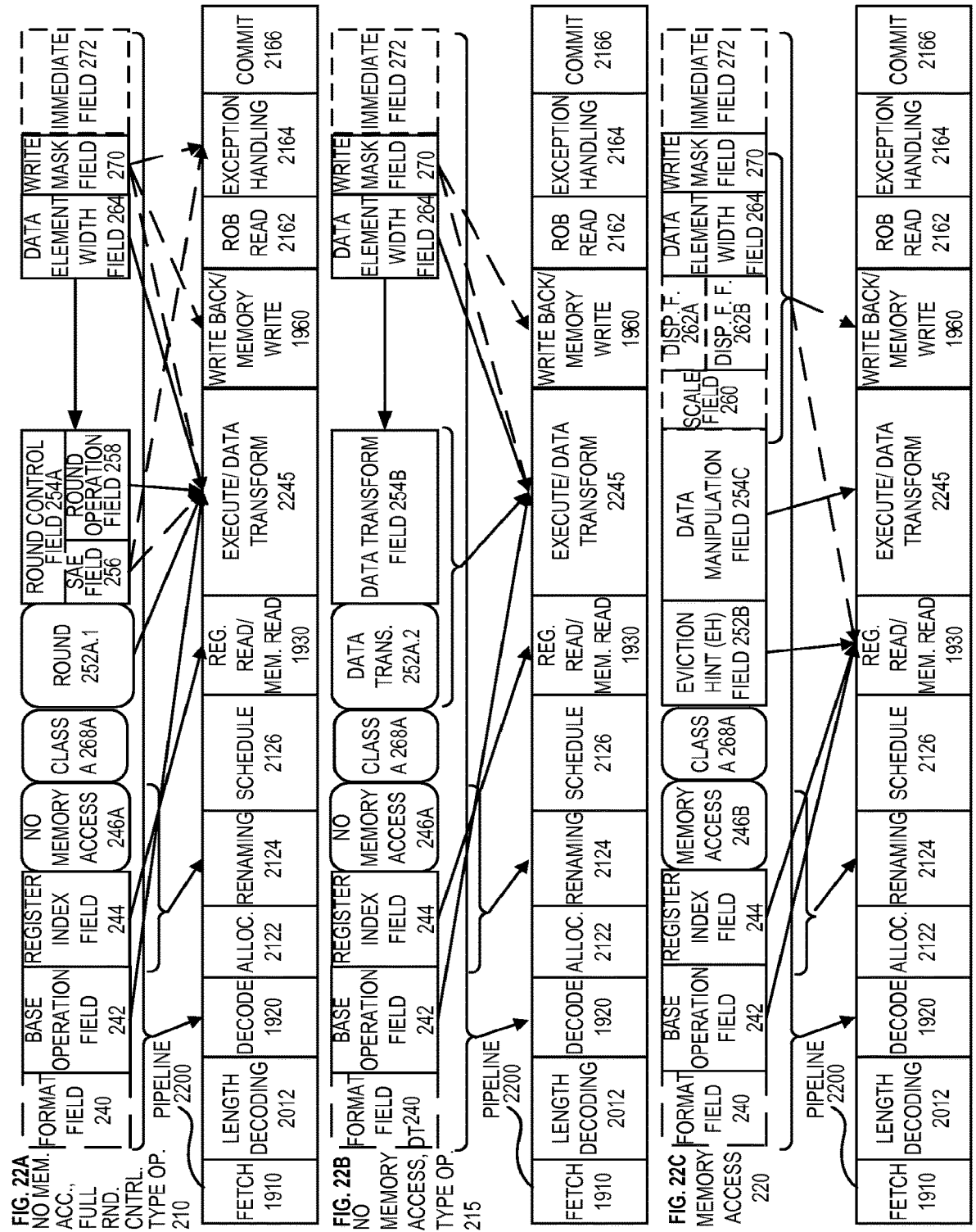

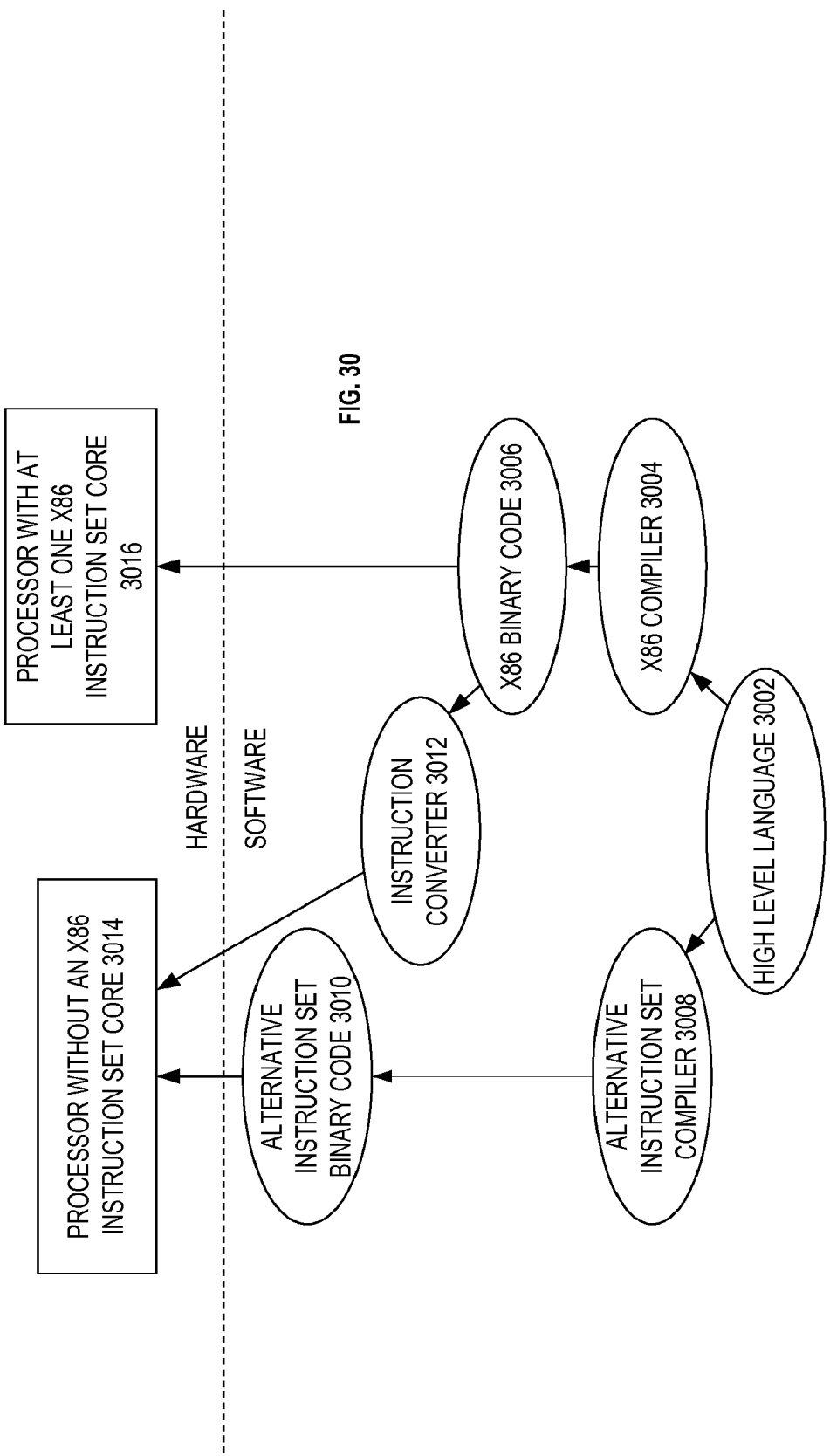

VECTOR FRIENDLY INSTRUCTION FORMAT AND EXECUTION THEREOF

CROSS-REFERENCE TO RELATED APPLICATIONS

This application is a continuation of Ser. No. 16/289,506, filed Feb. 28, 2019, which is a continuation of U.S. application Ser. No. 13/976,707, which is a national stage of International Application No. PCT/US2011/054303, filed Sep. 30, 2011, which claims the benefit of U.S. Provisional Application No. 61/471,043, filed Apr. 1, 2011, which are hereby incorporated by reference.

This application is related to U.S. Pat. No. 9,513,917, issued Dec. 6, 2016.

BACKGROUND

Field

Embodiments of the invention relate to the field of computers; and more specifically, to instruction sets supported by processors.

Background

An instruction set, or instruction set architecture (ISA), is the part of the computer architecture related to programming, including the native data types, instructions, register architecture, addressing modes, memory architecture, interrupt and exception handling, and external input and output (I/O). It should be noted that the term instruction generally refers herein to macro-instructions—that is instructions that are provided to the processor for execution—as opposed to micro-instructions or micro-ops—that is the result of a processor's decoder decoding macro-instructions).

The instruction set architecture is distinguished from the microarchitecture, which is the set of processor design techniques used to implement the instruction set. Processors with different microarchitectures can share a common instruction set. For example, Intel Pentium 4 processors, Intel Core processors, and Advanced Micro Devices, Inc. of Sunnyvale Calif. processors implement nearly identical versions of the x86 instruction set (with some extensions have been added with newer versions), but have different internal designs. For example, the same register architecture of the ISA may be implemented in different ways in different microarchitectures using well known techniques, including dedicated physical registers, one or more dynamically allocated physical registers using a register renaming mechanism (e.g., the use of a Register Alias Table (RAT), a Reorder Buffer (ROB) and a retirement register file as described in U.S. Pat. No. 5,446,912; the use of multiple maps and a pool of registers as described in U.S. Pat. No. 5,207,132), etc. Unless otherwise specified, the phrases register architecture, register file, and register are used herein to that which is visible to the software/programmer and the manner in which instructions specify registers. Where a distinction is required, the adjective logical, architectural, or software visible will be used to indicate registers/files in the register architecture, while different adjectives will be used to designation registers in a given microarchitecture (e.g., physical register, reorder buffer, retirement register, register pool).

An instruction set includes one or more instruction formats. A given instruction format defines various fields (number of bits, location of bits) to specify, among other things, the operation to be performed and the operand(s) on which that operation is to be performed. Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. A given instruction is expressed using a given instruction format (and, if defined, in a given one of the instruction templates of that instruction format) and specifies the operation and the operands. An instruction stream is a specific sequence of instructions, where each instruction in the sequence is an occurrence of an instruction in an instruction format (and, if defined, a given one of the instruction templates of that instruction format).

Scientific, financial, auto-vectorized general purpose, RMS (recognition, mining, and synthesis)/visual and multimedia applications (e.g., 2D/3D graphics, image processing, video compression/decompression, voice recognition algorithms and audio manipulation) often require the same operation to be performed on a large number of data items (referred to as "data parallelism"). Single Instruction Multiple Data (SIMD) refers to a type of instruction that causes a processor to perform the same operation on multiple data items. SIMD technology is especially suited to processors that can logically divide the bits in a register into a number of fixed-sized data elements, each of which represents a separate value. For example, the bits in a 64-bit register may be specified as a source operand to be operated on as four separate 16-bit data elements, each of which represents a separate 16-bit value. This type of data is referred to as the packed data type or vector data type, and operands of this data type are referred to as packed data operands or vector operands. In other words, a packed data item or vector refers to a sequence of packed data elements; and a packed data operand or a vector operand is a source or destination operand of a SIMD instruction (also known as a packed data instruction or a vector instruction).

By way of example, one type of SIMD instruction specifies a single vector operation to be performed on two source vector operands in a vertical fashion to generate a destination vector operand (also referred to as a result vector operand) of the same size, with the same number of data elements, and in the same data element order. The data elements in the source vector operands are referred to as source data elements, while the data elements in the destination vector operand are referred to as a destination or result data elements. These source vector operands are of the same size and contain data elements of the same width, and thus they contain the same number of data elements. The source data elements in the same bit positions in the two source vector operands form pairs of data elements (also referred to as corresponding data elements). The operation specified by that SIMD instruction is performed separately on each of these pairs of source data elements to generate a matching number of result data elements, and thus each pair of source data elements has a corresponding result data element. Since the operation is vertical and since the result vector operand is the same size, has the same number of data elements, and the result data elements are stored in the same data element order as the source vector operands, the result data elements are in the same bit positions of the result vector operand as their corresponding pair of source data elements in the source vector operands. In addition to this exemplary type of SIMD instruction, there are a variety of other types of SIMD instructions (e.g., that has only one or has more than two source vector operands; that operate in a horizontal fashion; that generates a result vector operand that is of a different size, that has a different size data elements, and/or that has a different data element order). It should be understood that the term destination vector operand (or destination operand) is defined as the direct result of performing the operation specified by an instruction, including the storage of that destination operand at a location (be it a register or at a memory address specified by that instruction) so that it may be accessed as a source operand by another instruction (by specification of that same location by the another instruction).

The SIMD technology, such as that employed by the Intel® Core™ processors having an instruction set including x86, MMX™, Streaming SIMD Extensions (SSE), SSE2, SSE3, SSE4.1, and SSE4.2 instructions, has enabled a significant improvement in application performance (Core™ and MMX™ are registered trademarks or trademarks of Intel Corporation of Santa Clara, Calif.). An additional set of future SIMD extensions, referred to the Advanced Vector Extensions (A VX) and using the VEX coding scheme, has been published.

BRIEF DESCRIPTION OF THE DRAWINGS

The invention may best be understood by referring to the following description and accompanying drawings that are used to illustrate embodiments of the invention. In the drawings:

FIG. 1A is a block diagram illustrating an instruction stream having only instructions in the vector friendly instruction format according to one embodiment of the invention;

FIG. 1B is a block diagram illustrating an instruction stream with instructions in multiple instruction formats according to one embodiment of the invention;

FIG. 2B is a block diagram illustrating the generic vector friendly instruction format and class B instruction templates thereof according to embodiments of the invention;

FIG. 3A is a block diagram illustrating an exemplary specific vector friendly instruction format according to embodiments of the invention;

FIG. 3B is a block diagram illustrating the fields of the specific vector friendly instruction format 300 that make up the full opcode field 274 according to one embodiment of the invention;

FIG. 3C is a block diagram illustrating the fields of the specific vector friendly instruction format 300 that make up the register index field 244 according to one embodiment of the invention;

FIG. 4C is a third part of the flow diagram showing the inter relationship of some of the fields of the vector friendly instruction format according to one embodiment of the invention;

FIG. 4D is the rest of the flow diagram showing the inter relationship of some of the fields of the vector friendly instruction format according to one embodiment of the invention;

FIG. 4E is an exploded view of each of blocks 415A-H according to one embodiment of the invention;

FIG. 6A is a flow diagram for the register index field 244 for a no memory access type operation according to embodiments of the invention;

FIG. 6B is a flow diagram illustrating the use of the register index field 244, the scale field 260, the displacement field 262A, and the displacement factor field 262B for a memory access type operation according to embodiments of the invention;

FIG. 6C is a table illustrating the differences between disp8, disp32, and variations of the scaled displacement according to embodiments of the invention;

FIG. 7 A is a table illustrating the group of possible operations that may be specified by the round control field 254A according to embodiments of the invention;

FIG. 7B is a table illustrating the group of possible operations that may be specified by the round control field 259A according to embodiments of the invention;

FIG. 8A is a table illustrating the group of possible data transform operations that may be specified by the data transform field 254B when the data element width is 64 bits according to embodiments of the invention;

FIG. 8B is a table illustrating the group of possible data transform operations that may be specified by the data transform field 254B when the data element width is 32 bits according to embodiments of the invention;

FIG. 9 is a block diagram illustrating the cross product swizzle 815 according to embodiments of the invention;

FIG. 10A is a block diagram illustrating the broadcast of an element across 4-element packets 820 according to embodiments of the invention;

FIG. 10B is a block diagram illustrating the broadcast of 1-element granularity for a 32 bit data element width according to embodiments of the invention;

FIG. 10C is a block diagram illustrating the broadcast of 4-element granularity for 32 bit data elements according to embodiments of the invention;

FIG. 11A is a table illustrating the group of possible opcode maps that may be specified by the opcode map field according to embodiments of the invention;

FIG. 11B is a table illustrating the group of possible prefix encodings that may be specified by the opcode map field according to embodiments of the invention;

FIG. 12A is a table illustrating the group of possible data manipulation operations that may be specified by the data manipulation field 254C and broadcast field 257B for a load/op int where the data element width is 64 bits according to embodiments of the invention;

FIG. 12B is a table illustrating the group of possible data manipulation operations that may be specified by the data manipulation field 254C and broadcast field 257B for a load/op int where the data element width is 32 bits according to embodiments of the invention;

FIG. 12C is a table illustrating the group of possible data manipulation operations that may be specified by the data manipulation field 254C and broadcast field 257B for a load/op fp where the data element width is 64 bits according to embodiments of the invention;

FIG. 12D is a table illustrating the group of possible data manipulation operations that may be specified by the data manipulation field 254C and broadcast field 257B for a load/op fp where the data element width is 32 bits according to embodiments of the invention;

FIG. 13A is a table illustrating the group of possible data manipulation operations that may be specified by the data manipulation field 254C for a load int where the data element width is 64 bits according to embodiments of the invention;

FIG. 13B is a table illustrating the group of possible data manipulation operations that may be specified by the data manipulation field 254C for a load int where the data element width is 32 bits according to embodiments of the invention;

FIG. 13C is a table illustrating the group of possible data manipulation operations that may be specified by the data manipulation field 254C for a load fp where the data element width is 64 bits according to embodiments of the invention;

FIG. 13D is a table illustrating the group of possible data manipulation operations that may be specified by the data manipulation field 254C for a load fp where the data element width is 32 bits according to embodiments of the invention;

FIG. 14A is a table illustrating the group of possible data manipulation operations that may be specified by the data manipulation field 254C for a store int where the data element width is 64 bits according to embodiments of the invention;

FIG. 14B is a table illustrating the group of possible data manipulation operations that may be specified by the data manipulation field 254C for a store int where the data element width is 32 bits according to embodiments of the invention;

FIG. 14C is a table illustrating the group of possible data manipulation operations that may be specified by the data manipulation field 254C for a store fp where the data element width is 64 bits according to embodiments of the invention;

FIG. 14D is a table illustrating the group of possible data manipulation operations that may be specified by the data manipulation field 254C for a store fp where the data element width is 64 bits according to embodiments of the invention;

FIG. 15A is a table illustrating the group of possible data manipulation operations that may be specified by the data manipulation field 254C for a load graphics where the data element width is 32 bits according to embodiments of the invention;

FIG. 15B is a table illustrating the group of possible data manipulation operations that may be specified by the data manipulation field 254C for a load packed graphics where the data element width is 32 bits according to embodiments of the invention;

FIG. 15C is a table illustrating the group of possible data manipulation operations that may be specified by the data manipulation field 254C for a store graphics where the data element width is 32 bits according to embodiments of the invention;

FIG. 16A is a block diagram illustrating an exemplary operation 1600 that merges using the write mask in write mask register K1 where the data element width is 32 bits and where the second source and destination are the same according to embodiments of the invention;

FIG. 16B is a block diagram illustrating an exemplary operation 1625 that merges using the hardwired mask of all ones (the hardwired write mask is used by instructions that specify write mask register K0) where the data element width is 32 bits and where the second source and destination are the same according to embodiments of the invention;

FIG. 16C is a block diagram illustrating the correspondence of bits in the-write mask registers to the data element positions of a 512 bit vector for the 8, 16, 32, and 64 bit data element widths according to embodiments of the invention;

FIG. 16D is a block diagram illustrating an exemplary operation 1660 that merges using the write mask in write mask register K1 where the data element width is 32 bits and where the second source and destination are different according to embodiments of the invention;

FIG. 16E is a block diagram illustrating an exemplary operation 1666 that zeros using the write mask in write mask register K1 where the data element width is 32 bits and where the second source and destination are different according to embodiments of the invention;

FIG. 17A illustrates a subset of fields from an exemplary specific vector friendly instruction format according to embodiments of the invention;

FIG. 17B illustrates a subset of fields from an exemplary specific vector friendly instruction encoded in the specific vector friend instruction format of FIG. 17A according to embodiments of the invention;

FIG. 17C illustrates a subset of fields from an exemplary specific vector friendly instruction encoded in the specific vector friend instruction format of FIG. 17A according to embodiments of the invention;

FIG. 17D illustrates a subset of fields from an exemplary specific vector friendly instruction encoded in the specific vector friend instruction format of FIG. 17A according to embodiments of the invention;

FIG. 18A illustrates a subset of fields from an exemplary specific vector friendly instruction format according to embodiments of the invention;

FIG. 18B illustrates a subset of fields from an exemplary specific vector friendly instruction encoded in the specific vector friend instruction format of FIG. 18A according to embodiments of the invention;

FIG. 18C illustrates a subset of fields from an exemplary specific vector friendly instruction encoded in the specific vector friend instruction format of FIG. 18A according to embodiments of the invention;

FIG. 18D illustrates a subset of fields from an exemplary specific vector friendly instruction encoded in the specific vector friend instruction format of FIG. 18A according to embodiments of the invention;

FIG. 18E illustrates a subset of fields from an exemplary specific vector friendly instruction encoded in the specific vector friend instruction format of FIG. 18A according to embodiments of the invention;

FIG. 18F illustrates a subset of fields from an exemplary specific vector friendly instruction encoded in the specific vector friend instruction format of FIG. 18A according to embodiments of the invention;

FIG. 19A is a block diagram illustrating which fields of the no memory access, full round control type operation 210 instruction template of class A are utilized in different stages of a first exemplary processor pipeline according to embodiments of the invention;

FIG. 19B is a block diagram illustrating which fields of the no memory access, data transform type operation 215 instruction template of class A are utilized in different stages of a first exemplary processor pipeline according to embodiments of the invention;

FIG. 19C is a block diagram illustrating which fields of the memory access 220 instruction template of class A are utilized in different stages of a first exemplary processor pipeline according to embodiments of the invention;

FIG. 20A is a block diagram illustrating which fields of the no memory access, full round control type operation 210 instruction template of class A are utilized in different stages of a second exemplary processor pipeline according to embodiments of the invention;

FIG. 20B is a block diagram illustrating which fields of the no memory access, data transform type operation 215 instruction template of class A are utilized in different stages of a second exemplary processor pipeline according to embodiments of the invention;

FIG. 20C is a block diagram illustrating which fields of the memory access 220 instruction template of class A are utilized in different stages of a second exemplary processor pipeline according to embodiments of the invention;

FIG. 21A is a block diagram illustrating which fields of the no memory access, full round control type operation 210 instruction template of class A are utilized in different stages of a third exemplary processor pipeline according to embodiments of the invention;

FIG. 21B is a block diagram illustrating which fields of the no memory access, data transform type operation 215 instruction template of class A are utilized in different stages of a third exemplary processor pipeline according to embodiments of the invention;

FIG. 21C is a block diagram illustrating which fields of the memory access 220 instruction template of class A are utilized in different stages of a third exemplary processor pipeline according to embodiments of the invention;

FIG. 22A is a block diagram illustrating which fields of the no memory access, full round control type operation 210 instruction template of class A are utilized in different stages of a fourth exemplary processor pipeline according to embodiments of the invention;

FIG. 22B is a block diagram illustrating which fields of the no memory access, data transform type operation 215 instruction template of class A are utilized in different stages of a fourth exemplary processor pipeline according to embodiments of the invention;

FIG. 22C is a block diagram illustrating which fields of the memory access 220 instruction template of class A are utilized in different stages of a fourth exemplary processor pipeline according to embodiments of the invention;

FIG. 30 is a block diagram contrasting the use of a software instruction converter to convert binary instructions in a source instruction set to binary instructions in a target instruction set according to embodiments of the invention.

DESCRIPTION OF EMBODIMENTS

Figure 2A:
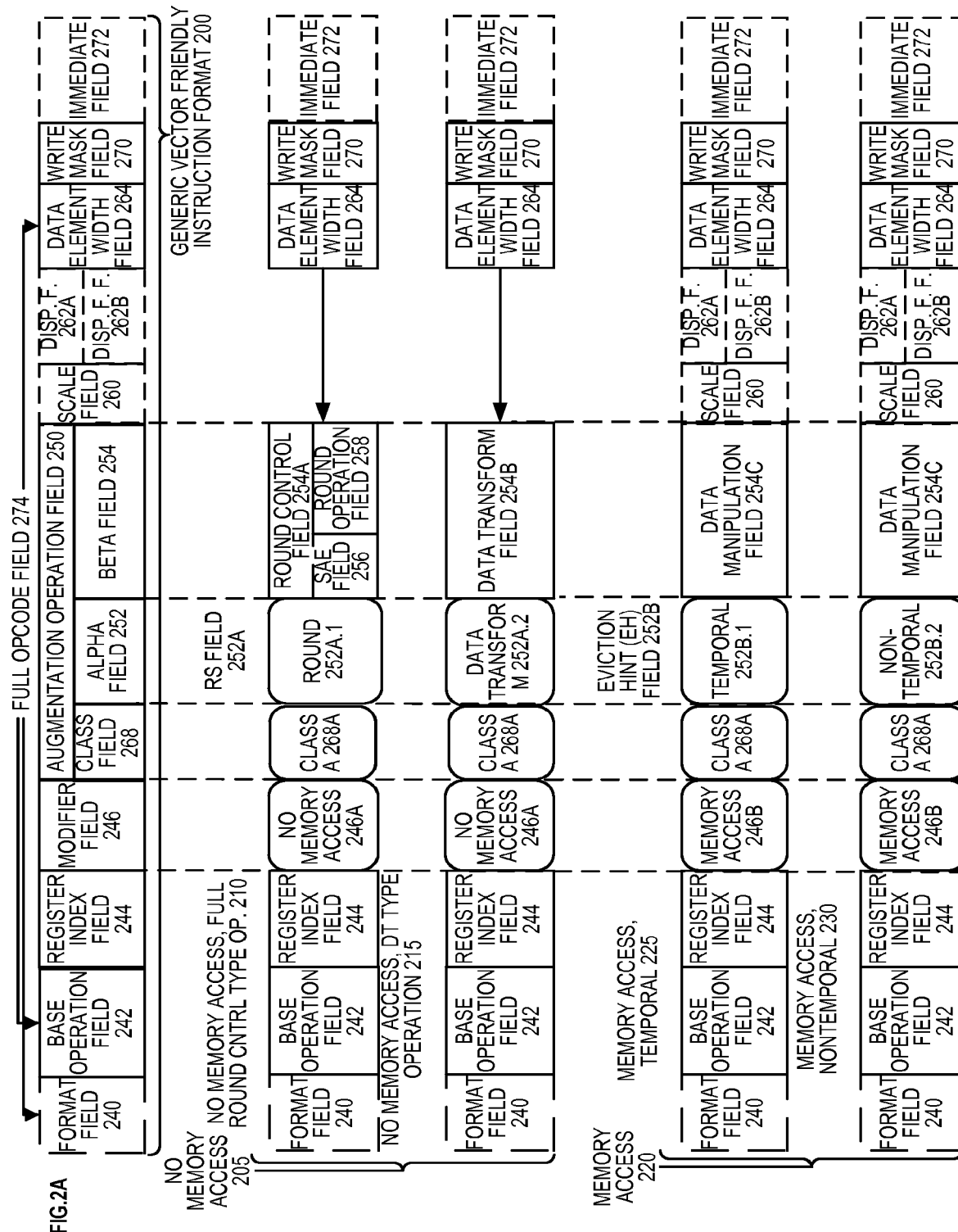
FIG. 2A is a block diagram illustrating a generic vector friendly instruction format and class A instruction templates thereof according to embodiments of the invention.

In the following description, numerous specific details such as logic implementations, opcodes, ways to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

It should also be appreciated that reference throughout this specification to "one embodiment", "an embodiment", or "one or more embodiments", for example, means that a particular feature may be included in the practice of embodiments of the invention, but every embodiment may not necessarily include the particular feature. Similarly, it should be appreciated that in the description various features are sometimes grouped together in a single embodiment, figure, or description thereof for the purpose of streamlining the disclosure and aiding in the understanding of various inventive aspects. Further, when a particular feature, structure, or characteristic is described in connection with an embodiment, it is submitted that it is within the knowledge of one skilled in the art to effect such feature, structure, or characteristic in connection with other embodiments whether or not explicitly described. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The operations of the flow diagrams will be described with reference to the exemplary embodiments of the block diagrams. However, it should be understood that the operations of flow diagrams can be performed by embodiments of the invention other than those discussed with reference to the block diagrams, and the embodiments discussed with reference to the block diagrams can perform operations different than those discussed with reference to the flow diagrams.

To ease understanding, dashed lines have been used in the figures to signify the optional nature of certain items (e.g., features not supported by a given implementation of the invention; features supported by a given implementation, but used in some situations and not in others).

Vector Friendly Instruction Format—FIGS. 1-16

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Number of Instruction Formats—FIG. 1A-1B

One Instruction Format—FIG. 1A

FIG. 1A is a block diagram illustrating an instruction stream having only instructions in the vector friendly instruction format according to one embodiment of the invention. The instruction stream includes a sequence of J instructions that are all in the vector friendly format 100A-100J. In one embodiment of the invention a processor supports only the vector instruction format and can execute this instruction stream.

Multiple Instruction Formats—FIG. 1B

FIG. 1B is a block diagram illustrating an instruction stream with instructions in multiple instruction formats according to one embodiment of the invention. Each instruction in the instruction stream is expressed in the vector friendly instruction format, a second format, or a third format. The instruction stream includes J instructions 110A-110J. In one embodiment of the invention a processor supports multiple instruction formats (including the formats shown in FIG. 1B) and can execute the instruction streams in both FIGS. 1A-1B.

Exemplary Generic Vector Friendly Instruction Format—FIG. 2A-B

FIGS. 2A-B are block diagrams illustrating a generic vector friendly instruction format and instruction templates thereof according to embodiments of the invention. FIG. 2A is a block diagram illustrating a generic vector friendly instruction format and class A instruction templates thereof according to embodiments of the invention; while FIG. 2B is a block diagram illustrating the generic vector friendly instruction format and class B instruction templates thereof according to embodiments of the invention. Specifically, a generic vector friendly instruction format 200 for which are defined class A and class B instruction templates, both of which include no memory access 205 instruction templates and memory access 220 instruction templates. The term generic in the context of the vector friendly instruction format refers to the instruction format not being tied to any specific instruction set. While embodiments will be described in which instructions in the vector friendly instruction format operate on vectors that are sourced from either registers (no memory access 205 instruction templates) or registers/memory (memory access 220 instruction templates), alternative embodiments of the invention may support only one of these. Also, while embodiments of the invention will be described in which there are load and store instructions in the vector instruction format, alternative embodiments instead or additionally have instructions in a different instruction format that move vectors into and out of registers (e.g., from memory into registers, from registers into memory, between registers). Further, while embodiments of the invention will be described that support two classes of instruction templates, alternative embodiments may support only one of these or more than two.

While embodiments of the invention will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 2A include: 1) within the no memory access 205 instruction templates there is shown a no memory access, full round control type operation 210 instruction template and a no memory access, data transform type operation 215 instruction template; and 2) within the memory access 220 instruction templates there is shown a memory access, temporal 225 instruction template and a memory access, non-temporal 230 instruction template. The class B instruction templates in FIG. 2B include: 1) within the no memory access 205 instruction templates there is shown a no memory access, write mask control, partial round control type operation 212 instruction template and a no memory access, write mask control, vsize type operation 217 instruction template; and 2) within the memory access 220 instruction templates there is shown a memory access, write mask control 227 instruction template.

Format

The generic vector friendly instruction format 200 includes the following fields listed below in the order illustrated in FIGS. 2A-B.

Format field 240—a specific value (an instruction format identifier value) in this field uniquely identifies the vector friendly instruction format, and thus occurrences of instructions in the vector friendly instruction format in instruction streams. Thus, the content of the format field 240 distinguish occurrences of instructions in the first instruction format from occurrences of instructions in other instruction formats, thereby allowing for the introduction of the vector friendly instruction format into an instruction set that has other instruction formats. As such, this field is optional in the sense that it is not needed for an instruction set that has only the generic vector friendly instruction format.

Base operation field 242—its content distinguishes different base operations. As described later herein, the base operation field 242 may include and/or be part of an opcode field.

Register index field 244—its content, directly or through address generation, specifies the locations of the source and destination operands, be they in registers or in memory. These include a sufficient number of bits to select N registers from a P×Q (e.g. 32×512) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination). While in one embodiment P=32, alternative embodiments may support more or less registers (e.g., 16). While in one embodiment Q=512 bits, alternative embodiments may support more or less bits (e.g., 128, 1024).

Modifier field 246—its content distinguishes occurrences of instructions in the generic vector instruction format that specify memory access from those that do not; that is, between no memory access 205 instruction templates and memory access 220 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 250—its content distinguishes which one of a variety of different operations to be performed in addition to the base operation. This field is context specific. In one embodiment of the invention, this field is divided into a class field 268, an alpha field 252, and a beta field 254. The augmentation operation field allows common groups of operations to be performed in a single instruction rather than 2, 3 or 4 instructions. Below are some examples of instructions (the nomenclature of which are described in more detail later herein) that use the augmentation field 250 to reduce the number of required instructions.

| Prior Instruction Sequences | Instructions Sequences according to one Embodiment of the Invention |
|---|---|
| vaddps ymm0, ymm1, ymm2 | vaddps zmm0, zmm1 zmm2 |
| vpshufd ymm2, ymm2, 0x55 | vaddps zmm0, zmm1, zmm2 {bbbb} |
| vaddps ymm0, ymm1, ymm2 | vaddps zmm0, zmm1, [rax]{sint8} |
| vpmovsxbd ymm2, [rax] | |
| vcvtdq2ps ymm2, ymm2 | |
| vaddps ymm0, ymm1, ymm2 | |
| vpmovsxbd ymm3, [rax] | vaddps zmm1 {k5}, zmm2, [rax]{sint8} |
| vcvtdq2ps ymm3, ymm3 | |
| vaddps ymm4, ymm2, ymm3 | |
| vblendvps ymm1, ymm5, ymm1, ymm4 | |
| vmaskmovps ymm1, ymm7, [rbx] | vmovaps zmm1 {k7}, [rbx] |
| vbroadcastss ymm0, [rax] | vaddps zmm2{k7}{z}, zmm1, [rax]{1toN} |
| vaddps ymm2, ymm0, ymm1 | |
| vblendvps ymm2, ymm2, ymm1, ymm7 | |

Where [rax] is the base pointer to be used for address generation, and where { } indicates a conversion operation specified by the data manipulation field (described in more detail later here).

Scale field 260—its content allows for the scaling of the index field's content for memory address generation (e.g., for address generation that uses $2^{scale}*index+base$).

Displacement Field 262A—its content is used as part of memory address generation (e.g., for address generation that uses $2^{scale}*index+base+displacement$).

Displacement Factor Field 262B (note that the juxtaposition of displacement field 262A directly over displacement factor field 262B indicates one or the other is used)—its content is used as part of address generation; it specifies a displacement factor that is to be scaled by the size of a memory access (N)—where N is the number of bytes in the memory access (e.g., for address generation that uses $2^{scale}*index+base+scaled\ displacement$). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 274 (described later herein) and the data manipulation field 254C as described later herein. The displacement field 262A and the displacement factor field 262B are optional in the sense that they are not used for the no memory access 205 instruction templates and/or different embodiments may implement only one or none of the two.

Data element width field 264—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 270—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 270 allows for partial vector operations, including loads, stores, arithmetic, logical, etc. Also, this masking can be used for fault suppression (i.e., by masking the destination's data element positions to prevent receipt of the result of any operation that may/will cause a fault—e.g., assume that a vector in memory crosses a page boundary and that the first page but not the second page would cause a page fault, the page fault can be ignored if all data element of the vector that lie on the first page are masked by the write mask). Further, write masks allow for "vectorizing loops" that contain certain types of conditional statements. While embodiments of the invention are described in which the write mask field's 270 content selects one of a number of write mask registers that contains the write mask to be used (and thus the write mask field's 270 content indirectly identifies that masking to be performed), alternative embodiments instead or additional allow the write mask field's 270 content to directly specify the masking to be performed. Further, zeroing allows for performance improvements when: 1) register renaming is used on instructions whose destination operand is not also a source (also call non-ternary instructions) because during the register renaming pipeline stage the destination is no longer an implicit source (no data elements from the current destination register need be copied to the renamed destination register or somehow carried along with the operation because any data element that is not the result of operation (any masked data element) will be zeroed); and 2) during the write back stage because zeros are being written.

Immediate field 272—its content allows for the specification of an immediate. This field is optional in the sense that is it not present in an implementation of the generic vector friendly format that does not support immediate and it is not present in instructions that do not use an immediate.

Instruction Template Class Selection

Class field 268—its content distinguishes between different classes of instructions. With reference to FIGS. 2A-B, the contents of this field select between class A and class B instructions. In FIGS. 2A-B, rounded corner squares are used to indicate a specific value is present in a field (e.g., class A 268A and class B 268B for the class field 268 respectively in FIGS. 2A-B).

No-Memory Access Instruction Templates of Class A

In the case of the non-memory access 205 instruction templates of class A, the alpha field 252 is interpreted as an RS field 252A, whose content distinguishes which one of the different augmentation operation types are to be performed (e.g., round 252A.1 and data transform 252A.2 are respectively specified for the no memory access, round type operation 210 and the no memory access, data transform type operation 215 instruction templates), while the beta field 254 distinguishes which of the operations of the specified type is to be performed. In FIG. 2, rounded corner blocks are used to indicate a specific value is present (e.g., no memory access 246A in the modifier field 246; round 252A.1 and data transform 252A.2 for alpha field 252/rs field 252A). In the no memory access 205 instruction templates, the scale field 260, the displacement field 262A, and the displacement scale field 262B are not present.

No-Memory Access Instruction Templates—Full Round Control Type Operation

In the no memory access full round control type operation 210 instruction template, the beta field 254 is interpreted as a round control field 254A, whose content(s) provide static rounding. While in the described embodiments of the invention the round control field 254A includes a suppress all floating point exceptions (SAE) field 256 and a round operation field 258, alternative embodiments may support encoding both these concepts into the same field or only have one or the other of these concepts/fields (e.g., may have only the round operation field 258).

SAE field 256—its content distinguishes whether or not to disable the exception event reporting; when the SAE field's 256 content indicates suppression is enabled, a given instruction does not report any kind of floating-point exception flag and does not raise any floating point exception handler.

Round operation field 258—its content distinguishes which one of a group of rounding operations to perform (e.g., Round-up, Round-down, Round-towards-zero and Round-to-nearest). Thus, the round operation field 258 allows for the changing of the rounding mode on a per instruction basis, and thus is particularly useful when this is required. In one embodiment of the invention where a processor includes a control register for specifying rounding modes, the round operation field's 258 content overrides that register value (Being able to choose the rounding mode without having to perform a save-modify-restore on such a control register is advantageous).

No Memory Access Instruction Templates—Data Transform Type Operation

In the no memory access data transform type operation 215 instruction template, the beta field 254 is interpreted as a data transform field 254B, whose content distinguishes which one of a number of data transforms is to be performed (e.g., no data transform, swizzle, broadcast).

Memory Access Instruction Templates of Class A

In the case of a memory access 220 instruction template of class A, the alpha field 252 is interpreted as an eviction hint field 252B, whose content distinguishes which one of the eviction hints is to be used (in FIG. 2A, temporal 252B.1 and non-temporal 252B.2 are respectively specified for the memory access, temporal 225 instruction template and the memory access, non-temporal 230 instruction template), while the beta field 254 is interpreted as a data manipulation field 254C, whose content distinguishes which one of a number of data manipulation operations (also known as primitives) is to be performed (e.g., no manipulation; broadcast; up conversion of a source; and down conversion of a destination). The memory access 220 instruction templates include the scale field 260, and optionally the displacement field 262A or the displacement scale field 262B.

Vector Memory Instructions perform vector loads from and vector stores to memory, with conversion support. As with regular vector instructions, vector memory instructions transfer data from/to memory in a data element-wise fashion, with the elements that are actually transferred dictated by the contents of the vector mask that is selected as the write mask. In FIG. 2A, rounded corner squares are used to indicate a specific value is present in a field (e.g., memory access 246B for the modifier field 246; temporal 252B.1 and non-temporal 252B.2 for the alpha field 252/eviction hint field 252B).

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 252 is interpreted as a write mask control (Z) field 252C, whose content distinguishes whether the write masking controlled by the write mask field 270 should be a merging or a zeroing.

No-Memory Access Instruction Templates of Class B

In the case of the non-memory access 205 instruction templates of class B, part of the beta field 254 is interpreted as an RL field 257A, whose content distinguishes which one of the different augmentation operation types are to be performed (e.g., round 257A.1 and vector length (VSIZE) 257A.2 are respectively specified for the no memory access, write mask control, partial round control type operation 212 instruction template and the no memory access, write mask control, VSIZE type operation 217 instruction template), while the rest of the beta field 254 distinguishes which of the operations of the specified type is to be performed. In FIG. 2, rounded corner blocks are used to indicate a specific value is present (e.g., no memory access 246A in the modifier field 246; round 257A.1 and VSIZE 257A.2 for the RL field 257A). In the no memory access 205 instruction templates, the scale field 260, the displacement field 262A, and the displacement scale field 262B are not present.

No-Memory Access Instruction Templates—Write Mask Control Partial Round Control Type Operation In the no memory access, write mask control, partial round control type operation 210 instruction template, the rest of the beta field 254 is interpreted as a round operation field 259A and exception event reporting is disabled (a given instruction does not report any kind of floating-point exception flag and does not raise any floating point exception handler).

Round operation field 259A—just as round operation field 258, its content distinguishes which one of a group of rounding operations to perform (e.g., Round-up, Round-down, Round-towards-zero and Round-to-nearest). Thus, the round operation field 259A allows for the changing of the rounding mode on a per instruction basis, and thus is particularly useful when this is required. In one embodiment of the invention where a processor includes a control register for specifying rounding modes, the round operation field's 259A content overrides that register value (Being able to choose the rounding mode without having to perform a save-modify-restore on such a control register is advantageous).

No Memory Access Instruction Templates—Write Mask Control, VSIZE Type Operation

In the no memory access, write mask control, VSIZE type operation 217 instruction template, the rest of the beta field 254 is interpreted as a vector length field 259B, whose content distinguishes which one of a number of data vector length is to be performed on (e.g., 128, 256, or 512 bits).

Memory Access Instruction Templates of Class B

In the case of a memory access 220 instruction template of class B, part of the beta field 254 is interpreted as a broadcast field 257B, whose content distinguishes whether or not the broadcast type data manipulation operation is to be performed, while the rest of the beta field 254 is interpreted the vector length field 259B. The memory access 220 instruction templates include the scale field 260, and optionally the displacement field 262A or the displacement scale field 262B.

Additional Comments Regarding Fields

With regard to the generic vector friendly instruction format 200, a full opcode field 274 is shown including the format field 240, the base operation field 242, and the data element width field 264. While one embodiment is shown where the full opcode field 274 includes all of these fields, the full opcode field 274 includes less than all of these fields in embodiments that do not support all of them. The full opcode field 274 provides the operation code.

The augmentation operation field 250, the data element width field 264, and the write mask field 270 allow these features to be specified on a per instruction basis in the generic vector friendly instruction format.

The combination of write mask field and data element width field create typed instructions in that they allow the mask to be applied based on different data element widths.

The instruction format requires a relatively small number of bits because it reuses different fields for different purposes based on the contents of other fields. For instance, one perspective is that the modifier field's content chooses between the no memory access 205 instructions templates on FIGS. 2A-B and the memory access 220 instruction templates on FIGS. 2A-B; while the class field 268's content chooses within those non-memory access 205 instruction templates between instruction templates 210/215 of FIG. 2A and 212/217 of FIG. 2B; and while the class field 268's content chooses within those memory access 220 instruction templates between instruction templates 225/230 of FIG. 2A and 227 of FIG. 2B. From another perspective, the class field 268's content chooses between the class A and class B instruction templates respectively of FIGS. 2A and B; while the modifier field's content chooses within those class A instruction templates between instruction templates 205 and 220 of FIG. 2A; and while the modifier field's content chooses within those class B instruction templates between instruction templates 205 and 220 of FIG. 2B. In the case of the class field's content indicating a class A instruction template, the content of the modifier field 246 chooses the interpretation of the alpha field 252 (between the rs field 252A and the EH field 252B). In a related manner, the contents of the modifier field 246 and the class field 268 chose whether the alpha field is interpreted as the rs field 252A, the EH field 252B, or the write mask control (Z) field 252C. In the case of the class and modifier fields indicating a class A no memory access operation, the interpretation of the augmentation field's beta field changes based on the rs field's content; while in the case of the class and modifier fields indicating a class B no memory access operation, the interpretation of the beta field depends on the contents of the RL field. In the case of the class and modifier fields indicating a class A memory access operation, the interpretation of the augmentation field's beta field changes based on the base operation field's content; while in the case of the class and modifier fields indicating a class B memory access operation, the interpretation of the augmentation field's beta field's broadcast field 257B changes based on the base operation field's contents. Thus, the combination of the base operation field, modifier field and the augmentation operation field allow for an even wider variety of augmentation operations to be specified.

The various instruction templates found within class A and class B are beneficial in different situations. Class B is useful when zeroing-writemasking or smaller vector lengths are desired for performance reasons. For example, zeroing allows avoiding fake dependences when renaming is used since we no longer need to artificially merge with the destination; as another example, vector length control eases store-load forwarding issues when emulating shorter vector sizes with the vector mask. Class A is useful when it is desirable to: 1) allow floating point exceptions (i.e., when the contents of the SAE field indicate no) while using rounding-mode controls at the same time; 2) be able to use upconversion, swizzling, swap, and/or downconversion; 3) operate on the graphics data type. For instance, upconversion, swizzling, swap, downconversion, and the graphics data type reduce the number of instructions required when working with sources in a different format; as another example, the ability to allow exceptions provides full IEEE compliance with directed rounding-modes. Also, in some embodiments of the invention, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the invention. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Exemplary Specific Vector Friendly Instruction Format—FIGS. 3A-D

FIG. 3A is a block diagram illustrating an exemplary specific vector friendly instruction format according to embodiments of the invention. FIG. 3A shows a specific vector friendly instruction format 300 that is specific in the sense that it specifies the location, size, interpretation, and order of the fields, as well as values for some of those fields. The specific vector friendly instruction format 300 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIG. 2 into which the fields from FIG. 3A map are illustrated.

It should be understood that although embodiments of the invention are described with reference to the specific vector friendly instruction format 300 in the context of the generic vector friendly instruction format 200 for illustrative purposes, the invention is not limited to the specific vector friendly instruction format 300 except where claimed. For example, the generic vector friendly instruction format 200 contemplates a variety of possible sizes for the various fields, while the specific vector friendly instruction format 300 is shown as having fields of specific sizes. By way of specific example, while the data element width field 264 is illustrated as a one bit field in the specific vector friendly instruction format 300, the invention is not so limited (that is, the generic vector friendly instruction format 200 contemplates other sizes of the data element width field 264).

Format—FIG. 3A

The generic vector friendly instruction format 200 includes the following fields listed below in the order illustrated in FIG. 3A.

EVEX Prefix (Bytes 0-3)

EVEX Prefix 302—is encoded in a four-byte form.

Format Field 240 (EVEX Byte 0, bits [7:0])—the first byte (EVEX Byte 0) is the format field 240 and it contains 0x62 (the unique value used for distinguishing the vector friendly instruction format in one embodiment of the invention).

The second-fourth bytes (EVEX Bytes 1-3) include a number of bit fields providing specific capability.

REX field 305 (EVEX Byte 1, bits [7-5])—consists of a EVEX.R bit field (EVEX Byte 1, bit [7]-R), EVEX.X bit field (EVEX byte 1, bit [6]-X), and 257BEX byte 1, bit[5]-B). The EVEX.R, EVEX.X, and EVEX.B bit fields provide the same functionality as the corresponding VEX bit fields, and are encoded using 1s complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 310—this is the first part of the REX' field 310 and is the EVEX.R' bit field (EVEX Byte 1, bit [4]-R') that is used to encode either the upper 16 or lower 16 of the extended 32 register set. In one embodiment of the invention, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the invention do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 315 (EVEX byte 1, bits [3:0]-mmmm)—its content encodes an implied leading opcode byte (0F, 0F 38, or 0F 3A).

Data element width field 264 (EVEX byte 2, bit [7]-W)—is represented by the notation EVEX.W. EVEX.W is used to define the granularity (size) of the datatype (either 32-bit data elements or 64-bit data elements).

EVEX.vvvv 320 (EVEX Byte 2, bits [6:3]-vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in is complement form for certain vector shifts; or 3) EVEX.vvvv does not encode any operand, the field is reserved and should contain 1111b. Thus, EVEX.vvvv field 320 encodes the 4 low-order bits of the first source register specifier stored in inverted (1s complement) form. Depending on the instruction, an extra different EVEX bit field is used to extend the specifier size to 32 registers.

EVEX.U 268 Class field (EVEX byte 2, bit [2]-U)—If EVEX.0=0, it indicates class A or EVEX.U0; if EVEX.0=1, it indicates class B or EVEX.U1.

Prefix encoding field 325 (EVEX byte 2, bits [1:0]-pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 252 (EVEX byte 3, bit [7]-EH; also known as EVEX.EH, EVEX.rs, EVEX.RL, EVEX.write mask control, and EVEX.N; also illustrated with α)—as previously described, this field is context specific. Additional description is provided later herein.

Beta field 254 (EVEX byte 3, bits [6:4]-SSS, also known as EVEX.$s_{2-0}$, EVEX.$r_{2-0}$ EVEX.rr1, EVEX.LL0, EVEX.LLB; also illustrated with βββ)—as previously described, this field is context specific. Additional description is provided later herein.

REX' field 310—this is the remainder of the REX' field and is the EVEX. V' bit field (EVEX Byte 3, bit [3]-V') that may be used to encode either the upper 16 or lower 16 of the extended 32 register set. This bit is stored in bit inverted format. A value of 1 is used to encode the lower 16 registers. In other words, V'VVVV is formed by combining EVEX. V', EVEX.vvvv.

Write mask field 270 (EVEX byte 3, bits [2:0]-kkk)—its content specifies the index of a register in the write mask registers as previously described. In one embodiment of the invention, the specific value EVEX.kkk=000 has a special behavior implying no write mask is used for the particular instruction (this may be implemented in a variety of ways including the use of a write mask hardwired to all ones or hardware that bypasses the masking hardware).

Real Opcode Field 330 (Byte 4)

This is also known as the opcode byte. Part of the opcode is specified in this field.

MOD R/M Field 340 (Byte 5)

Modifier field 246 (MODR/M.MOD, bits [7-6]-MOD field 342)—As previously described, the MOD field's 342 content distinguishes between memory access and non-memory access operations. This field will be further described later herein.

MODR/M.reg field 344, bits [5-3]—the role of ModR/M.reg field can be summarized to two situations: ModR/M.reg encodes either the destination register operand or a source register operand, or ModR/M.reg is treated as an opcode extension and not used to encode any instruction operand.

MODR/M.r/m field 346, bits [2-0]—The role of ModR/M.r/m field may include the following: ModR/M.r/m encodes the instruction operand that references a memory address, or ModR/M.r/m encodes either the destination register operand or a source register operand.

Scale, Index, Base (SIB) Byte (Byte 6)

Scale field 260 (SIB.SS, bits [7-6]—As previously described, the scale field's 260 content is used for memory address generation. This field will be further described later herein.

SIB.xxx 354 (bits [5-3] and SIB.bbb 356 (bits [2-0])—the contents of these fields have been previously referred to with regard to the register indexes Xxxx and Bbbb.

Displacement Byte(s) (Byte 7 or Bytes 7-10)

Displacement field 262A (Bytes 7-10)—when MOD field 342 contains 10, bytes 7-10 are the displacement field 262A, and it works the same as the legacy 32-bit displacement (disp32) and works at byte granularity.

Displacement factor field 262B (Byte 7)—when MOD field 342 contains 01, byte 7 is the displacement factor field 262B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 262B is a reinterpretation of disp8; when using displacement factor field 262B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 262B substitutes the legacy x86 instruction set 8-bit displacement. Thus, the displacement factor field 262B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset).

Immediate

Immediate field 272 operates as previously described.

Full Opcode Field—FIG. 3B

FIG. 3B is a block diagram illustrating the fields of the specific vector friendly instruction format 300 that make up the full opcode field 274 according to one embodiment of the invention. Specifically, the full opcode field 274 includes the format field 240, the base operation field 242, and the data element width (W) field 264. The base operation field 242 includes the prefix encoding field 325, the opcode map field 315, and the real opcode field 330.

Register Index Field—FIG. 3C

FIG. 3C is a block diagram illustrating the fields of the specific vector friendly instruction format 300 that make up the register index field 244 according to one embodiment of the invention. Specifically, the register index field 244 includes the REX field 305, the REX' field 310, the MODR/M.reg field 344, the MODR/M.r/m field 346, the VVVV field 320, xxx field 354, and the bbb field 356.

Figure 3D:
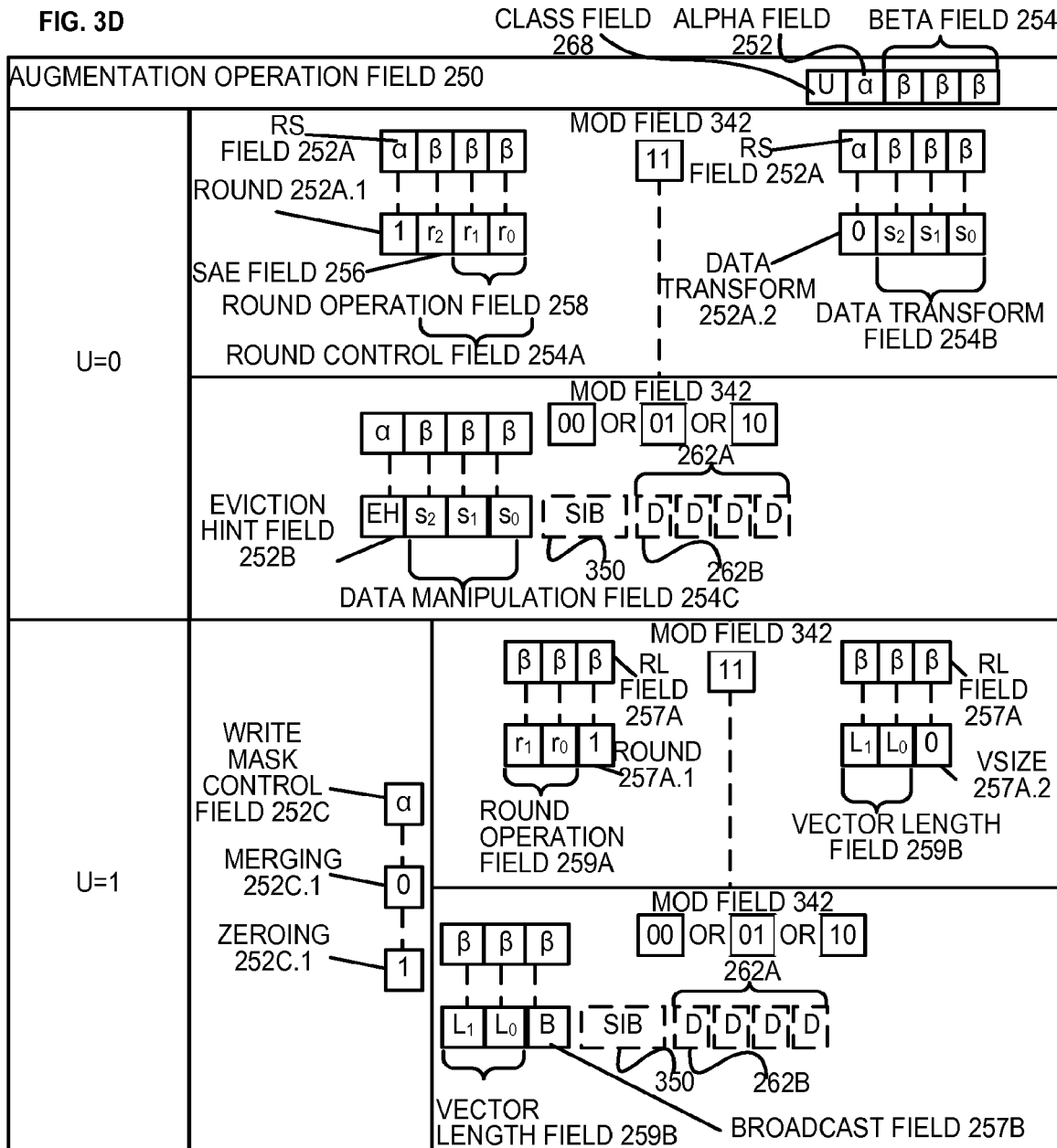
FIG. 3D is a block diagram illustrating the fields of the specific vector friendly instruction format 300 that make up the augmentation operation field 250 according to one embodiment of the invention.

Augmentation Operation Field—FIG. 3D

FIG. 3D is a block diagram illustrating the fields of the specific vector friendly instruction format 300 that make up the augmentation operation field 250 according to one embodiment of the invention. When the class (U) field 268 contains 0 it signifies EVEX.U0 (class A 268A); when it contains 1 it signifies EVEX.U1 (class B 268B). When U=0 and the MOD field 342 contains 11 (signifying a no memory access operation), the alpha field 252 (EVEX byte 3, bit [7]-EH) is interpreted as the rs field 252A. When the rs field 252A contains a 1 (round 252A.1), the beta field 254 (EVEX byte 3, bits [6:4]-SSS) is interpreted as the round control field 254A. The round control field 254A includes a one bit SAE field 256 and a two bit round operation field 258. When the rs field 252A contains a 0 (data transform 252A.), the beta field 254 (EVEX byte 3, bits [6:4]-SSS) is interpreted as a three bit data transform field 254B. When U=0 and the MOD field 342 contains 00, 01, or 10 (signifying a memory access operation), the alpha field 252 (EVEX byte 3, bit [7]-EH) is interpreted as the eviction hint (EH) field 252B and the beta field 254 (EVEX byte 3, bits [6:4]-SSS) is interpreted as a three bit data manipulation field 254C.

When U=1, the alpha field 252 (EVEX byte 3, bit [7]-EH) is interpreted as the write mask control (Z) field 252C. When U=1 and the MOD field 342 contains 11 (signifying a no memory access operation), part of the beta field 254 (EVEX byte 3, bit [4]-$S_0$) is interpreted as the RL field 257A; when it contains a 1 (round 257A.1) the rest of the beta field 254 (EVEX byte 3, bit [6-5]-$S_{2-1}$) is interpreted as the round operation field 259A, while when the RL field 257A contains a 0 (VSIZE 257.A2) the rest of the beta field 254 (EVEX byte 3, bit [6-5]-$S_{2-1}$) is interpreted as the vector length field 259B (EVEX byte 3, bit [6-5]-$L_{1-0}$). When U=1 and the MOD field 342 contains 00, 01, or 10 (signifying a memory access operation), the beta field 254 (EVEX byte 3, bits [6:4]-SSS) is interpreted as the vector length field 259B (EVEX byte 3, bit [6-5]-$L_{1-0}$) and the broadcast field 257B (EVEX byte 3, bit [4]-B).

Some Additional Points

The vector format extends the number of registers to 32 (REX').

Non-destructive source register encoding (applicable to three and four operand syntax): This is the first source operand in the instruction syntax. It is represented by the notation, EVEX.vvvv. This field is encoded using is complement form (inverted form), i.e. ZMM0 is encoded as 1111B, ZMM15 is encoded as 0000B. Note that an extra bit field in EVEX is needed to extend the source to 32 registers.

EVEX.W defines the datatype size (32-bits or 64-bits) for certain of the instructions.

32 extended register set encoding: EVEX prefix provide additional bit field to encode 32 registers per source with the following dedicated bit fields: EVEX.R' and EVEX.V' (together with EVEX.X for register-register formats).

Compaction of SIMD prefix: Legacy SSE instructions effectively use SIMD prefixes (66H, F2H, F3H) as an opcode extension field. EVEX prefix encoding allows the functional capability of such legacy SSE instructions using 512 bit vector length.

Compaction of two-byte and three-byte opcode: More recently introduced legacy SSE instructions employ two and three-byte opcode. The one or two leading bytes are: 0FH, and 0FH 3AH/0FH 38H. The one-byte escape (0FH) and two-byte escape (0FH 3AH, 0FH 38H) can also be interpreted as an opcode extension field. The EVEX.mmm field provides compaction to allow many legacy instruction to be encoded without the constant byte sequence, 0FH, 0FH 3AH, 0FH 38H.

Figure 4A:
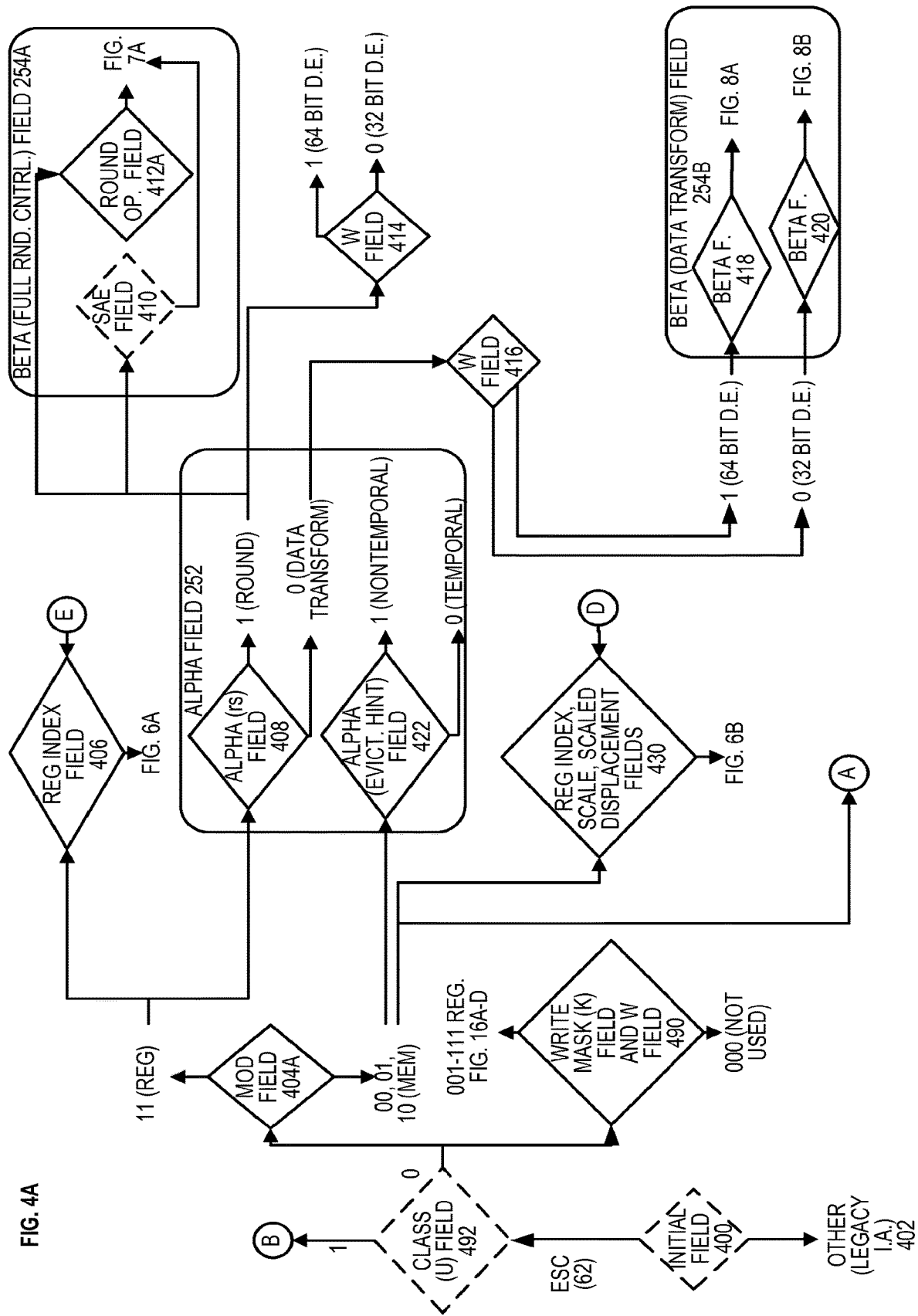
FIG. 4A is part of a flow diagram showing the inter relationship of some of the fields of the vector friendly instruction format according to one embodiment of the invention.

Exemplary Flow Diagram Showing the Interrelationship of Some of the Fields of Vector Friendly Instruction Format—FIGS. 4A-4E FIGS. 4A-4D illustrate a flow diagram showing the interrelationship of some of the fields of the vector friendly instruction format according to one embodiment of the invention; while FIG. 4E is an exploded view of each of blocks 415A-H according to one embodiment of the invention. In block 400, it is determined whether the value of the initial field indicates the vector friendly instruction format (e.g., 0x62). If not, control passes to block 402 where the instruction is handled according to one of the other formats of the instruction set. If so, control passes to block 492.

In block 492, it is determined whether the content of the class (U) field indicates class A or class B instruction templates. In the case of class A, control passes to two separate blocks: block 404A and 490. Otherwise, control passes to through circled B to two separate blocks on FIG. 4C: block 404B and block 493.

In block 404A, it is determined whether the content of the modifier field indicates a no memory access operation or a memory access operation. In the case of a no memory access operation (e.g., MOD field 342=11), control passes to blocks 406 and 408. In the case of a memory access operation (e.g., MOD field 342=00, 01, or 10), control passes to each of block 422, block 430, and block 440A (on FIG. 4B through the circled A).

A rounded corner box labeled alpha field 252 encompasses block 408 and block 422 because they represent the different interpretations of the alpha field 252. Specifically, block 408 represents the alpha field's 252 interpretation as the rs field 252A, while block 422 represents when the alpha field's 252 interpretation as the eviction hint field 252B.

In block 406, the contents of the register index field 244 are used as illustrated in FIG. 6A.

In block 408, it is determined whether the rs field's 252A content indicates a round type operation (e.g., rs field 252A=1) or a data transform type operation (e.g., rs field 252A=0). In the former, control passes to each of block 410, block 412A, and block 414. In the latter case, control passes to block 416.

A rounded corner box labeled beta (round control) field 254A encompasses block 410 and block 412A. Block 410 illustrates a decision regarding the SAE field's 256 content (whether or not to suppress floating point exceptions), while block 412A illustrates a decision based on the round operation field's 258 content (distinguishing one of the group of possible rounding operations). The decisions made in block 410 and 412A are illustrated in FIG. 7A.

Blocks 414, 416, 442, 448, 454, 460, 468, and 474 all illustrate a decision regarding the content of the data element width (w) field 264. As illustrated in FIG. 4, the data element width field 264 is a 1 bit field in the specific vector friendly instruction format 300 of FIG. 3A. As such, these blocks decide whether the data element width is 64 bits (e.g., 1) or 32 bits (e.g., 0). With regard to block 414, this decision marks the end of this branch of the flow. In contrast, control passes from block 416 to block 418 or block 420 for the 64 bit and 32 bit data element widths, respectively.

A rounded corner box labeled beta (data transform) field 254B encompasses both block 418 and block 420; and thus represents the case where the beta field 254 is interpreted as the data transform field 254B. In blocks 418 and 420, the content of the data transform field 254B is used to distinguish which one of a number of data transform operations is to be performed. The groups of possible data transform operations for block 418 and block 420 are respectively shown in FIG. 8A and FIG. 8B.

In block 422, the content of the eviction hint field 252B is used to distinguish which one of the group of possible eviction hint options should be used. FIG. 4 illustrates the use of a 1 bit eviction hint field 252B from the specific vector friendly instruction format 300. Specifically, the eviction hint options are non-temporal (1) and temporal (0). This marks the end of this branch of the flow diagram.

In block 430, the contents of the register index field 244, the scale field 260, and the displacement field 262A or the displacement factor field 262B are used as indicated in FIG. 6B. This marks the end of this branch of the flow diagram.

In block 440A, the content of the base operation field 242 is used to distinguish which one of a group of different memory access operations is to be performed. The following table illustrates the group of supported memory access operations according to one embodiment of the invention, as well as the control flow from block 440A for each. Alternative embodiments of the invention may support more, less, or different memory access operations.

| Memory Access Operation Type | Block |
|---|---|
| Load/Operation Integer (load/op int) | 442 |
| Load/Operation Floating Point (load/op fp) | 448 |
| Load Integer (load int) | 454 |
| Load Floating Point (load fp) | 460 |
| Store Integer (store int) | 468 |
| Store Floating Point (store fp) | 474 |
| Load Graphics (load gr) | 480 |

-continued

| Memory Access Operation Type | Block |
|---|---|
| Load Packed Graphics (load p · gr) | 482 |
| Store Graphics (store gr) | 484 |

As previously described, blocks 442, 448, 454, 460, 468, and 474 determine the change in control flow based on the data element width; the control flow is illustrated in the below table.

| Block | 64 bit | 32 bit |
|---|---|---|
| 442 | 444A as illustrated in FIG. 12A | 446A as illustrated in FIG. 12B |
| 448 | 450A as illustrated in FIG. 12C | 452A as illustrated in FIG. 12D |
| 454 | 456 as illustrated in FIG. 13A | 458 as illustrated in FIG. 13B |
| 460 | 462 as illustrated in FIG. 13C | 464 as illustrated in FIG. 13D |
| 468 | 470 as illustrated in FIG. 14A | 472 as illustrated in FIG. 14B |
| 474 | 476 as illustrated in FIG. 14C | 478 as illustrated in FIG. 14D |

Similarly, the decision of blocks 480, 482, and 484 are respectively illustrated in FIGS. 15A, 15B, and 15C. A rounded corner box labeled beta (data manipulation) field 254C encompasses blocks 444A, 446A, 450A, 452A, 456, 458, 462, 464, 470, 472, 476, 478, 480, 482, and 484; thereby illustrating that the content of the data manipulation field 254C distinguishes which one of the group of possible data manipulation operations is to be performed.

In block 490, the content of the write mask (k) field 270 and the content of the data element width (w) field 264 are used to determine the write mask to be used in the operation. FIG. 4 illustrates the embodiment in which there are eight write mask registers and the register 000 indicates that no write mask should be used. Where the write mask field's 270 content indicates other than 000, control passes to FIG. 16A-D.

In block 404B, it is determined whether the content of the modifier field indicates a no memory access operation or a memory access operation. In the case of a no memory access operation (e.g., MOD field 342=11), control passes to blocks 406 (on FIG. 4A through the circled E) and 495. In the case of a memory access operation (e.g., MOD field 342=00, 01, or 10), control passes to each of block 498, block 430 (on FIG. 4A through the circled D), and block 440B (on FIG. 4D through the circled C).

A rounded corner box labeled part of beta field 254 encompasses block 495, block 412B, and block 498 because they represent the different interpretations of part of the beta field 254. Specifically, block 495 represents part of the beta field's 254 interpretation as the RL field 257 A, while a rounded corner box labeled broadcast field 257B on FIG. 4D represents this part of the beta field's 254 interpretation as the broadcast field 257B.

In block 495, it is determined whether the RL field's 257A content indicates a round type operation (e.g., RL field 257A=1) or a vector length type operation (e.g., RL field 257A=0). In the former, control passes to each of block 412B and block 415A. In the latter case, control passes to each of block 498 and block 415B.

Block 412B illustrates a decision based on the round operation field's 259A content (distinguishing one of the group of possible rounding operations). The decision made in block 412B is illustrated in FIG. 7B.

Blocks 415A-H all illustrate a decision regarding the width of data element on which to operate. As illustrated, the supported data elements for class B (when U=1) are 64 bit, 32 bit, 16 bit, and 8 bit. Exemplary manners of performing these blocks are describe later herein with reference to FIG. 4E. Blocks 415A-B respectively mark the end of these branches of the flow diagram. With regard to 415A, the lines to the 16 bit and 8 bit data element widths are shown as dashed because in one embodiment of the invention these are not supported; rather, if there is a no memory access type operation for class B that is operating on 16 bit or 8 bit data elements, then the content of RL field 257 A is expected to be 0, and thus cause control to flow from block 495 to blocks 415B and 498 (in other words, the partial rounding is not available).

In block 498, the content of the vector length (LL) field 259B is used to determine the size of the vector to be operated on. FIG. 4 illustrates the embodiment in which the following are supported: 1) 128 bit (00); 2) 256 bit (01); 512 bit (10); while (11) is reserved. The reserved 11 may be used for different purposes for different types of instructions or for different embodiments of the invention. For example, 11 could be used for the following exemplary purposes: 1) to designate a vector length of 1024 bits; or 2) to designate that a dynamic vector length register should be used. Different embodiments may implement the dynamic vector length register(s) differently, including a special register used to encode vector length that is readable and writable by programs. A dynamic vector length register stores a value to be used for the vector length of the instruction. While different embodiments may support a number of different vector lengths through a dynamic vector length register, one embodiment of the invention supports a multiple of 128-bit (e.g., 128, 256, 512, 1024, 2048 . . . ). Where there is a set of one or more registers that function as dynamic vector length registers, different embodiments of the invention may select from those registers using different techniques (e.g., based on the type of instruction).

In block 440B, the content of the base operation field 242 is used to distinguish which one of a group of different memory access operations is to be performed. The following table illustrates the group of supported memory access operations according to one embodiment of the invention, as well as the control flow from block 440B for each. Alternative embodiments of the invention may support more, less, or different memory access operations.

| Memory Access Operation Type | Block |
|---|---|
| Load/Operation Integer (load/op int) | 415C |
| Load/Operation Floating Point (load/op fp) | 415D |
| Load Integer (load int) | 415E |
| Load Floating Point (load fp) | 415F |
| Store Integer (store int) | 415G |
| Store Floating Point (store fp) | 415H |

As previously described, blocks 415C-H determine the change in control flow based on the data element width; the control flow is illustrated in the below table.

| Block | 64 bit | 32 bit | 16 bit | 8 bit |
|---|---|---|---|---|
| 415C | 444B as illustrated in FIG. 12A | 446B as illustrated in FIG. 12B | branch of the flow ends | branch of the flow ends |

-continued

| Block | 64 bit | 32 bit | 16 bit | 8 bit |
|---|---|---|---|---|
| 415D | 450B as illustrated in FIG. 12C | 452B as illustrated in FIG. 12D | branch of the flow ends | branch of the flow ends |
| 415E | branch of the flow ends | branch of the flow ends | branch of the flow ends | branch of the flow ends |
| 415F | branch of the flow ends | branch of the flow ends | branch of the flow ends | branch of the flow ends |
| 415G | branch of the flow ends | branch of the flow ends | branch of the flow ends | branch of the flow ends |
| 415H | branch of the flow ends | branch of the flow ends | branch of the flow ends | branch of the flow ends |

The rounded corner box labeled broadcast field 257B encompasses blocks 444B, 446B, 450B, and 452B; thereby illustrating that the content of the broadcast field 257B distinguishes whether a broadcast operation is to be performed. As illustrated, one embodiment of the invention allows the content of the broadcast (b) field 257B select whether a broadcast operation is performed or not for the data element widths of 64 bit and 32 bit, that is not an option for the 16 bit and 8 bit data element widths; rather, if there is a memory access type operation for class B that is operating on 16 bit or 8 bit data elements, then the content of the broadcast (B) field 257B is expected to be 0.

In block 493, the content of the alpha field 252 (write mask control (Z) field 252C), the content of the write mask (k) field 270, and a determination of the data element width are used to determine the write mask operation to be performed (merging or zeroing) and the write mask to be used in the operation. In some embodiments of the invention, the alpha field 252 write mask control (Z field 252C) is expected to be zero (for zero-masking) on memory access operations that perform stores. The determination of the data element width is done in the same manner as block 415. FIG. 4 illustrates the embodiment in which there are eight write mask registers and the register 000 indicates that no write mask should be used. Where the write mask field's 270 content indicates other than 000, control passes to FIG. 16D-E.

FIG. 4E is an exploded view of each of blocks 415A-H according to one embodiment of the invention. Specifically, a single flow 415 is illustrated which represent the flow for each of blocks 415A-H. In block 417A, some or all of the content of the real opcode field 330 is used to select between two sets of data element widths: a first set 417A.1 (e.g., including 64 bit and 32 bit) and second set 417A.2 (e.g., 16 bit and 8 bit). While data element width is determine for the first set 417 A.1 based on the data element width (w) field 264 as illustrated in block 417B; within the second set 471A.2, there are two manners of determining the data element width: 417A.2.2 (based just on the real opcode field 330) and 417A.2.1 (based on the data element width (w) field 264 as illustrated in block 417C). As illustrated in FIG. 4, the data element width field 264 is a 1 bit field in the specific vector friendly instruction format 300 of FIG. 3A. As such, these block 417B decides whether the data element width is 64 bits (e.g., 1) or 32 bits (e.g., 0); while block 417C decides whether the data element width is 16 bits (e.g., 1) or 8 bits (e.g., 0). While FIG. 4E illustrates the involvement of the real opcode field 417A in determining the data element width, alternative embodiments may be implemented to use just the w field (e.g., have a one bit w field and support only two data element sizes; have a two bit w field and support the four data element sizes).

While embodiments of the invention have been described with reference to FIG. 4, alternative embodiments may use different flows. For example, as illustrated with the blocks 480, 482, and 484, operations that support only one data element width need not have the data element width decision (e.g., block 442A) and do not require two beta field decisions (e.g., blocks 444A and 446A); an alternative embodiment may only support one data element width for all such operations, support both data element widths on all types of operations (which would require data element width and extra beta field decisions on the load graphics, load packed graphics, and store graphics operations), or not support different data element widths on some of the other operations (e.g., not support different data element width for the load/op operations). In a similar context, alternative embodiment may not support different data element widths on one or more of the no-memory access round type operation and the no-memory access data transform type operation (in the former, blocks 414 and 415A would not be present; in the latter, block 415B would not be present, while block 416 would not be present and blocks 418 and 420 would be merged). As another example, different embodiments of the invention: may not include the class (U) field 268 and support only one of the class A or B instruction templates; may include the SAE field 256 and not the round operation field 258; may not include the round operation field 259A; may not include the eviction hit field 252B; may not include the round type operation in either or both of class A and B instruction templates; may not include the data transform type operation; may not include the vector length field 259B in either or both of the no memory access 205 and memory access 220; support only one or the other of the load/op and load operations; may not include the write mask field 270; may not include the write mask control (Z) field 252C; and/or may not include the vector length field 259(B).

Figure 5:
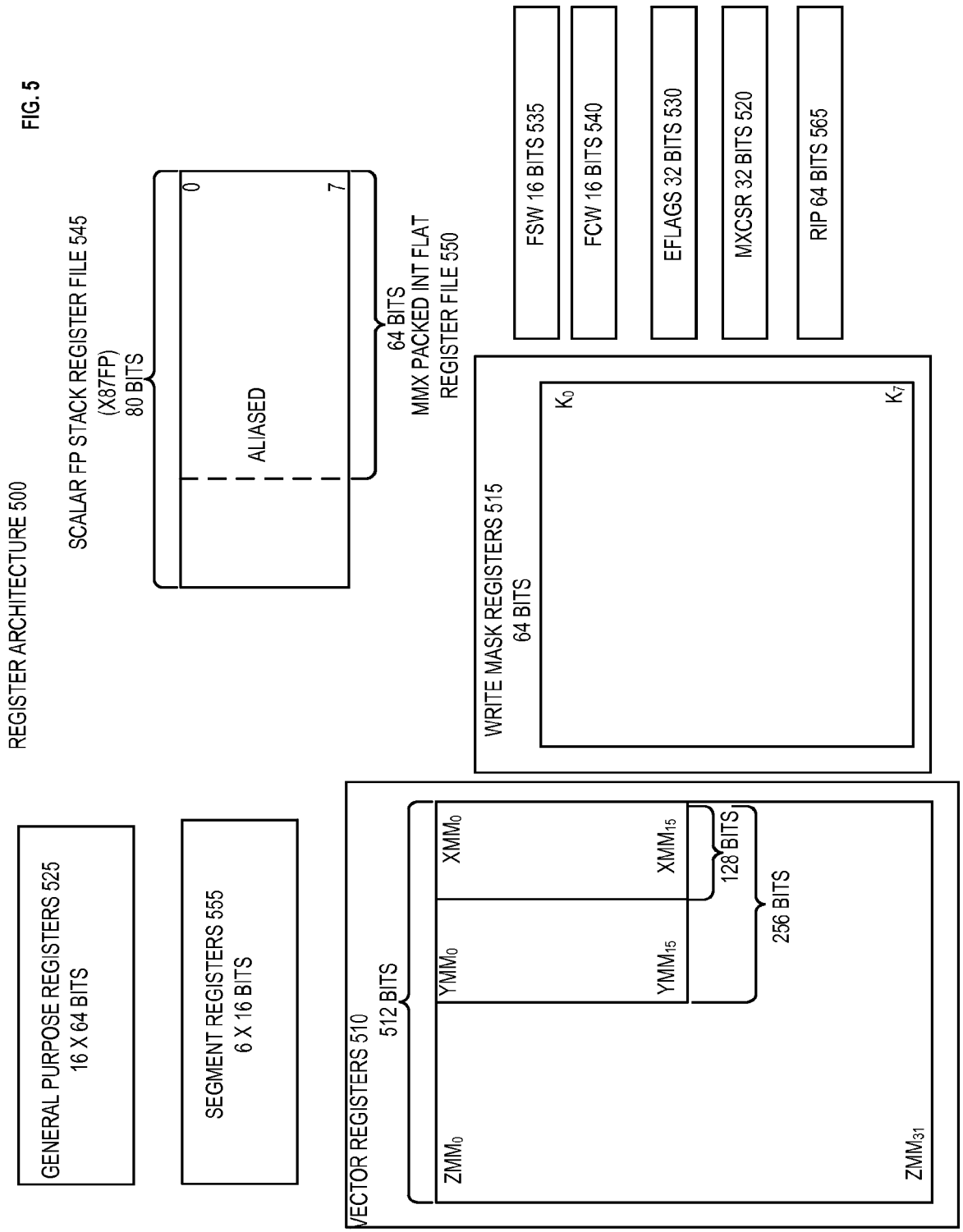
FIG. 5 is a block diagram of a register architecture 500 according to one embodiment of the invention.

Exemplary Register Architecture—FIG. 5

FIG. 5 is a block diagram of a register architecture 500 according to one embodiment of the invention. The register files and registers of the register architecture are listed below:

Vector register file 510—in the embodiment illustrated, there are 32 vector registers that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 300 operates on these overlaid register file as illustrated in the below tables.

| Adjustable Vector Length | Class | Operations | Registers |
|---|---|---|---|
| Instruction Templates that do not include the vector length field 259B | A (FIG. 2A; U = 0) | 210, 215, 225, 230 | zmm registers (the vector length is 64 byte) |
| | B (FIG. 2B; U = 1) | 212 | zmm registers (the vector length is 64 byte) |
| Instruction Templates that do not include the vector length field 259B | B (FIG. 2B; U = 1) | 217, 227 | zmm, ymm, or xmm registers (the vector length is 64 byte, 32 byte, or 16 byte) depending on the vector length field 259B |

In other words, the vector length field 259B selects between a maximum length and one or more other shorter lengths, where each such shorter length is half the length of the preceding length; and instructions templates without the vector length field 259B operate on the maximum vector length. Further, in one embodiment, the class B instruction templates of the specific vector friendly instruction format 300 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 515—in the embodiment illustrated, there are 8 write mask registers (k0 through k7), each 64 bits in size. As previously described, in one embodiment of the invention the vector mask register k0 cannot be used as a write mask; when the encoding that would normally indicate k0 is used for a write mask, it selects a hardwired write mask of 0xFFFF, effectively disabling write masking for that instruction.

Multimedia Extensions Control Status Register (MXCSR) 520—in the embodiment illustrated, this 32-bit register provides status and control bits used in floating-point operations.

General-purpose registers 525—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Extended flags (EFLAGS) register 530—in the embodiment illustrated, this 32 bit register is used to record the results of many instructions.

Floating Point Control Word (FCW) register 540 and Floating Point Status Word (FSW) register 530—in the embodiment illustrated, these registers are used by x87 instruction set extensions to set rounding modes, exception masks and flags in the case of the FCW, and to keep track of exceptions in the case of the FSW.

Scalar floating point stack register file (x87 stack) 545 on which is aliased the MMX packed integer flat register file 550—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Segment registers 555—in the illustrated embodiment, there are six 16 bit registers use to store data used for segmented address generation.

RIP register 565—in the illustrated embodiment, this 64 bit register that stores the instruction pointer.

Alternative embodiments of the invention may use wider or narrower registers. Additionally, alternative embodiments of the invention may use more, less, or different register files and registers.

Register Index Field, Scale Field, Displacement Field, and Displacement Factor Field Flows—FIGS. 6A-6C Modifier Field=No-Memory Access—FIG. 6A FIG. 6A is a flow diagram for the register index field 244 for a no memory access type operation according to embodiments of the invention. FIG. 6A begins with an oval 600 which indicates that register to register addressing is being performed according to mod field 342 (=11). From block 600, a control passes to block 605.

In block 605, bits are selected from the register index field 244 to address registers. With regard to the specific vector friendly instruction format 300, the existing x86 instructions set with extensions allows for a wide variety of different register addressing options based upon the REX field 305, the reg field 344, the r/m field 346, the VVVV field 320, the xxx field 354, and the bbb field 356. The REX' field 310 extends these options. From block 605, control passes to block 610.

In block 610, register A is selected (e.g., zmm19) and control passes to block 615. In block 615, register B is selected (e.g., zmm5) and control optionally passes to block 620. In block 625, register C is selected (e.g., zmm7). Register A may be a source operand register; register B may be a source operand register, a destination operand register, or a source/destination operand register; and register C may be a source operand register, a destination operand register, or a source/destination operand.

Modifier Field=Memory Access—FIG. 6B

FIG. 6B is a flow diagram illustrating the use of the register index field 244, the scale field 260, the displacement field 262A, and the displacement factor field 262B for a memory access type operation according to embodiments of the invention. FIG. 6B begins with an oval 630 indicating register-memory addressing (mod field 342=00, 01, or 10). From 630, control passes to block 635.

In block 635, bits are selected from the register index field to address registers and control passes to block 640.

In block 640, register A is selected (e.g., zmm19) and control optionally passes to block 645. In block 645, register B is selected (e.g., zmm31) and control passes to block 650. In the case where block 645 is not used, control passes directly from block 640 to block 650.

In block 650, the contents of the REX field 305, the REX' field 310, the mod r/m field 340, the SIB byte 350, and the displacement field 262A or the displacement factor field 262B are used to address memory; specifically, the index and the base are pulled from the REX field 305 and the SIB byte 350, while the content of the scale field 260 (ss field 352) is pulled from the SIB byte 350. From block 650, control passes to block 660.

In block 660, the memory access mode is determined (e.g., based on the content of the mod field 342). Where the memory access mode is the no displacement mode (mod field 342=00), control passes to block 665 where the address is generated as follows: $2^{ss}$*index+base.

Where the memory access mode is the un-scaled displacement mode (mod field 342=10), control passes to block 670 in which the address is generated as follows: $2^{ss}$*index+base+disp32. In the case where the memory access mode is the scaled displacement mode (mod field 342=01), control passes to block 675 in which the address is generated as follows: $2^{ss}$*index+base+scaled displacement; where the scaled displacement (disp8*n)=the content of the displacement factor field 262B multiplied by the memory access size (N), where N is dependent upon the contents of the full opcode field 274 (e.g., the base operation field and/or the data element width field) and the augmentation operation field 250 (e.g., the class field 268 and the data manipulation field 254C, the vector length field 259B, and/or the broadcast field 257B).

Scaled Displacement—FIG. 6C

FIG. 6C is a table illustrates the differences between disp8, disp32, and variations of the scaled displacement according to embodiments of the invention. The columns of the table are: 1) "byte" which indicates addresses incremented by bytes; 2) "disp8 field" which is a 1 byte field used to store from −128 to 127; 3) "disp32 field" which is a 4 byte field used to store from −2$^{31}$ to 2$^{31}$-1; 4) "disp32*N field" which is a 1 byte field used to store from −128 to 127, which column has sub-columns with "N=1," "N=2," and "N=64."

The values in the rows in the "byte" column increase down the column. The second column, the third column, and each of the sub-columns include a blackened circle in the rows for address that can be generated by that field. It is worth noting that the disp8 field, the disp32 field, and where N=1 have a blackened dot for every byte with their range signifying that these field increment on a byte granularity. In contrast, the N=2 column increments by two bytes and accordingly only has a blackened dot for every other byte within its range; as such, it has a wider range but a courser granularity as compared to the disp8 field, while at the same time it requires one fourth the bytes of the disp32 field. The N=64 column increments by 64 bytes and accordingly only has a blackened dot for every 64th byte within its range; as such, it has a wider range but a courser granularity as compared to the disp8 field and N=2, while at the same time it again requires one fourth the bytes of the disp32 field.

Rounding Field Tables—FIG. 7A-B

FIG. 7A is a table illustrating the group of possible operations that may be specified by the round control field 254A according to embodiments of the invention. FIG. 7A shows a first column contains the possible content of the beta field 254 (which is acting as the round control field 254A and which is broken down into the SAE field 256 and the round operation field 258).

Similarly, FIG. 7B is a table illustrating the group of possible operations that may be specified by the round control field 259A according to embodiments of the invention. In the case of class B instruction templates, there is no SAE field 256 and floating point exception suppression is always active.

Note that in one embodiment in which some instructions already allow the specification of the rounding mode statically via immediate bits, the immediate bits takes precedence over the rounding mode operation field 258 and 259A.

Data Types

The following table lists some exemplary data types used herein (some of which are described in Microsoft's® DirectX® 10 (see Microsoft®, DirectX®, Data Conversion Rules (Aug. 17, 2010)):

UNORM indicates an unsigned normalized integer, meaning that for an n-bit number, all 0's means 0.0f, and all 1's means 1.0f. A sequence of evenly spaced floating point values from 0.0f to 1.0f are represented, e.g. a 2-bit UNORM represents 0.0f, ⅓, ⅔, and 1.0f.

SNORM indicates a signed normalized integer, meaning that for an n-bit 2's complement number, the maximum value means 1.0f (e.g. the 5-bit value 01111 maps to 1.0f), and the minimum value means −1.0f (e.g. the 5-bit value 10000 maps to −1.0f). In addition, the second-minimum number maps to −1.0f (e.g. the 5-bit value 10001 maps to −1.0f). There are thus two integer representations for −1.0f. There is a single representation for 0.0f, and a single representation for 1.0f. This results in a set of integer representations for evenly spaced floating point values in the range (−1.0f . . . 0.0f), and also a complementary set of representations for numbers in the range (0.0f . . . 1.0f).

As previously described, SIMD technology is especially suited to processors that can logically divide the bits in a register into a number of fixed/sized data elements, each of which represents a separate value. This type of data is referred to as the packed data type or vector data type, and operands of this data type are referred to as packed data operands or vector operands. Typically the data elements of a vector operand are of the same data type; the data type of a given data element is referred to as the data element data type. Where the data element data type of all of the data elements is the same, then the vector operand may be referred to as being of that data type (e.g., where all of the data elements of a vector operand are of the 32-bit floating-point data element data type, then the vector operand may be referred to as a 32-bit floating-point vector operand).

Embodiments of the invention are described which support single value data element data types and multiple value data element data types. The single value data element data types store in each data element a single value; examples of single value data element data types used in some embodiments of the invention are 32-bit floating-point, 64-bit floating-point, 32-bit unsigned integer, 64-bit unsigned integer, 32-bit signed integer, and 64-bit signed integer. The multiple value data element data types store in each data element position a packet with multiple values contained therein; examples of multiple value data element data types

| | |
|---|---|
| FLOAT10 | 10-bit floating-point number (unsigned) |
| FLOAT11 | 11-bit floating-point number (unsigned) |
| FLOAT16 | 16-bit floating-point number |
| FLOAT16RZ | a float16 with the rounding mode being round toward zero (RZ) |
| FLOAT32 | 32-bit floating-point number |
| FLOAT64 | 64-bit floating-point number |
| UNIT8 | 8-bit value that maps to an integer number in the range [0, 255] |
| UNIT16 | 16-bit value that maps to an integer number in the range [0, 65535] |
| UNIT32 | 32-bit value that maps to an integer number in the range [0, $2^{32}$ − 1] |
| UNIT64 | 64-bit value that maps to an integer number |
| SINT8 | 8-bit value that maps to an integer number in the range [−128, 127] |
| SINT16 | 16-bit value that maps to an integer number in the range [−32768, 32767] |
| SINT32 | 32-bit value that maps to an integer number in the range [−$2^{31}$, $2^{31}$ − 1] |
| SINT64 | 64-bit value that maps to an integer number |
| UNORM2 | 2-bit value that maps to a floating-point number in the range [0, 1] |
| UNORM8 | 8-bit value that maps to a floating-point number in the range [0, 1] |
| UNORM10 | 10-bit value that maps to a floating-point number in the range [0, 1] |
| UNORM16 | 16-bit value that maps to a floating-point number in the range [0, 1] |
| SNORM8 | 8-bit value that maps to a floating-point number in the range [−1, 1] |
| SNORM16 | 16-bit value that maps to a floating-point number in the range [−1, 1] |
| SRGB8 | 8-bit value that maps through a gamma correction function (generally implemented as a lookup table) to a floating-point number in the range [0, 1] | used in some embodiments of the invention are the packed graphics data element data types described below:

UNORM10A10B10C2D: A 32-bit packet of three UNORM10 values and one UNORM2 value, begin with the last 2b (10b) field located in the most-significant bits of the 32b field (e.g., unorm2D [31-30] float 10C [29-20] float 10B [20-10] float 10A [9-0], where D-A signify slot position and the preceding names/numbers signify the format).

FLOAT11A11B10C: A 32-bit packet of two FLOAT11 values and one FLOAT10 value, begin the last one located in the higher order bits (e.g., float 10C [31-22] float 11B [21-11] float 11A [10-0]).

It should be noted that while the different values in a packet of the multiple value data element data types above is represented by different numbers of bits, alternative embodiments may have different configurations (e.g., more of the values represented by the different number of bits, all of the values represented by the same number of bits).

While embodiments are described that support both a single value data element data type and a multiple value data element data type, alternative embodiments may support one or the other. In addition, while embodiments of the invention are described that utilize certain data types, alternative embodiments of the invention may utilize more, less, or different data types.

Data Transform Field Tables—FIGS. 8A and 8B

FIGS. 8A-8B are tables illustrating the groups of possible data transform operations that may be specified by the data transform field according to embodiments of the invention. The first column in both tables illustrates the possible values of the content of the data transform field 254B; the second column the function, and the third column the usage.

Data Element Size Field=64 Bit—FIG. 8A

FIG. 8A is a table illustrating the group of possible data transform operations that may be specified by the data transform field when the data element width is 64 bits according to embodiments of the invention. This table is referred to as the 64-bit Register SwizzUpConv swizzle primitives and it is representation of the block 418. Notation: dcba denotes the 64-bit elements that form one 256-bit block in the source (with 'a' least-significant and 'd' most-significant), so aaaa means that the least-significant element of the 256-bit block in the source is replicated to all four elements of the same 256-bit block in the destination; the depicted pattern is then repeated for the two 256-bit blocks in the source and destination. The notation 'hgfe dcba' is used to denote a full source register, where 'a' is the least-significant element and 'h' is the most-significant element. However, since each 256-bit block performs the same permutation for register swizzles, only the least-significant block is illustrated.

Data Element Size Field=32 Bit—FIG. 8B

FIG. 8B is a table illustrating the group of possible data transform operations that may be specified by the data transform field when the data element width is 32 bits according to embodiments of the invention. This table is referred to as the 32-bit Register SwizzUpConv swizzle primitives and it is representation of the block 420. Notation: dcba denotes the 32-bit elements that form one 128-bit block in the source (with 'a' least-significant and 'd' most-significant), so aaaa means that the least-significant element of the 128-bit block in the source is replicated to all four elements of the same 128-bit block in the destination; the depicted pattern is then repeated for all four 128-bit blocks in the source and destination. The phrase 'ponm lkji hgfe dcba' is used to denote a source register, where 'a' is the least-significant element and 'p' is the most-significant element. However, since each 128-bit block performs the same permutation for register swizzles, only the least-significant block is shown.

FIG. 8B calls out two exemplary operations to further illustrate the meaning of all of the operations shown in FIGS. 8A-8B: the cross-product swizzle 815 which is illustrated in FIG. 9 and the broadcast an element across 4-element packets 820 illustrated in FIG. 10A.

Exemplary Swizzle Operation—FIG. 9

FIG. 9 is a block diagram illustrating the cross product swizzle 815 according to embodiments of the invention. FIG. 9 shows a source operand 900 and a destination operand 910 that are both 512 bits wide and broken into consecutive 128 blocks (referred to as packet positions 3-0), where each block is broken into four 32 bit data elements (e.g., the contents of packet position 0 in the source operand 900 are D0 C0 B0 A0, while the contents of packet position 0 in the destination operand 910 are D0 A0 C0 B0.

Exemplary Broadcast Operations—FIGS. 10A-10C

FIG. 10A is a block diagram illustrating the broadcast of an element across 4-element packets 820 according to embodiments of the invention. FIG. 10A shows a source operand 1000 and a destination operand 1010 that are both 512 bits wide and broken into consecutive 128 blocks (referred to as packet positions 3-0), where each block is broken into four 32 bit data elements (e.g., the contents of packet position 0 in the source operand 1000 are D0 C0 B0 A0, while the contents of packet position 0 in the destination operand 1010 are A0 A0 A0 A0; the contents of packet position 1 in the source operand 1000 are D1 C1 B1 A1, while the contents of packet position 1 in the destination operand 1010 are A1 A1 A1 A1).

While FIG. 10A is an example broadcast for a no memory access operation, FIGS. 10B-10C are example broadcasts for memory access operations. When the source memory operand contains fewer than the total number of elements, it can be broadcast (repeated) to form the full number of elements of the effective source operand (16 for 32-bit instructions, 8 for 64-bit instructions). These types of broadcast operations are referred to in FIGS. 12A-12D. There are two broadcast granularities:

1-element granularity where the 1 element of the source memory operand is broadcast 16 times to form a full 16-element effective source operand (for 32-bit instructions), or 8 times to form a full 8-element effective source operand (for 64-bit instructions). FIG. 10B is a block diagram illustrating the broadcast of 1-element granularity for a 32 bit data element width according to embodiments of the invention. An example of the operation is labeled 1210 in FIG. 12B. FIG. 10B shows a source operand 1020 sourced from memory having one 32 bit data element (A0) and a destination operand 1030 that is 512 bits wide and contains sixteen 32 bit data elements (all of the data elements are A0 in the destination operand 1030). 1-element broadcasts useful for instructions that mix vector and scalar sources, where one of the sources is common across the different operations.

4-element granularity where the 4 elements of the source memory operand is broadcast 4 times to form a full 16-element effective source operand (for 32-bit instructions), or 2 times to form a full 8-element effective source operand (for 64-bit instructions). FIG. 10C is a block diagram illustrating the broadcast 4-element granularity for 32 bit data elements according to embodiments of the invention. An example of the operation is labeled 1220 in FIG. 12B. FIG. 10C shows a source operand 1040 sourced from memory having four 32 bit data elements (D0 C0 B0 A0) and a destination operand 1050 that is 512 bits wide and broken into consecutive 128 blocks (referred to as packet positions 3-0), where each block is broken into four 32 bit data elements (e.g., the contents in each of the packet positions 3-0 of the destination operand 1050 are D0 C0 B0 A0). 4 to 16 broadcasts are very useful for AOS (array of structures) source code, where the computation is performed over an array of packed values (like color components RGBA); in this case, 4 to 16 is advantageous when there is a common packet used across the different operations of a vector instruction (a 16-element vector is considered an array of 4 packets of 4 elements each).

Base Operation Field Tables—FIGS. 11A and 11B

Opcode Map Field—FIG. 11A

FIG. 11A is a table illustrating the group of possible opcode maps that may be specified by the opcode map field according to embodiments of the invention. The first column illustrates the possible values of the content of the opcode map field 315; the second column the implied leading opcode bytes, and the third column whether an immediate may be present.

Prefix Encoding Field—FIG. 11B

FIG. 11B is a table illustrating the group of possible prefix encodings that may be specified by the opcode map field according to embodiments of the invention. The first column illustrates the possible values of the content of the prefix encoding field 325; and the second column the meaning of that prefix.

Data Manipulation Field Tables—FIGS. 12-15

FIGS. 12-15 are tables illustrating the groups of possible data manipulation operations and broadcast operation that may be respectively specified by the data manipulation field 254C and, for FIGS. 12A-D the broadcast field 257B, according to embodiments of the invention. The first column in the tables illustrates the possible values of the content of the data manipulation field 254C; the second column the function, and the third column the usage.

Data Manipulation Field Tables for Load/OP—FIGS. 12A-12D

FIGS. 12A-12D are tables illustrating the groups of possible data manipulation operations and broadcast operation that may be respectively specified by the data manipulation field 254C and the broadcast field 257B for the load/op instructions according to embodiments of the invention. In the case of the exemplary specific vector friendly instruction format in FIGS. 3A-D, the data manipulation field 254C is a three bit field and the broadcast field 257B is a one bit field. In the illustrated embodiments, the broadcast field's 257B content selects between the first two rows in the tables found in FIGS. 12A-D; in other words, its contents selects between the equivalent of 000 and 001 in the data manipulation field 254C. This is illustrated in FIGS. 12A-D using bracket that includes only the first two rows of the tables.

Load/OP Integer and Data Element Size Field=64 Bit—FIG. 12A

FIG. 12A is a table illustrating the group of possible data manipulation operations that may be specified by the data manipulation field 254C and broadcast field 257B for a load/op int where the data element width is 64 bits according to embodiments of the invention. This table is referred to as the 64-bit Integer Load-op SwizzUpConv$_{i64}$ (Quadword) swizzle/convert primitives and it is a representation of the block 444A and block 444B.

Load/OP Integer and Data Element Size Field=32 Bit—FIG. 12B

FIG. 12B is a table illustrating the group of possible data manipulation operations that may be specified by the data manipulation field 254C and broadcast field 257B for a load/op int where the data element width is 32 bits according to embodiments of the invention. This table is referred to as the 32-bit Integer Load-op SwizzUpConv$_{i32}$ swizzle/convert primitives and it is a representation of the block 446A and block 446B.

Load/OP Floating Point and Data Element Size Field=64 Bit—FIG. 12C

FIG. 12C is a table illustrating the group of possible data manipulation operations that may be specified by the data manipulation field 254C and broadcast field 257B for a load/op fp where the data element width is 64 bits according to embodiments of the invention. This table is referred to as the 64-bit Floating-point Load-op SwizzUpConv$_{f64}$ swizzle/convert primitives and it is a representation of the block 450A and block 450B.

Load/OP Floating Point and Data Element Size Field=32 Bit—FIG. 12D

FIG. 12D is a table illustrating the group of possible data manipulation operations that may be specified by the data manipulation field 254C and broadcast field 257B for a load/op fp where the data element width is 32 bits according to embodiments of the invention. This table is referred to as the 32-bit Floating-point Load-op SwizzUpConv$_{f32}$ swizzle/convert primitives and it is a representation of the block 452A and block 452B.

Data Manipulation Field Tables for Load—FIGS. 13A-13D

FIGS. 13A-13D are tables illustrating the groups of possible data manipulation operations that may be specified by the data manipulation field for the load instructions according to embodiments of the invention.

Load Integer and Data Element Size Field=64 Bit—FIG. 13A

FIG. 13A is a table illustrating the group of possible data manipulation operations that may be specified by the data manipulation field 254C for a load int where the data element width is 64 bits according to embodiments of the invention. This table is referred to as the UpConv$_{i64}$ and it is a representation of the block 456.

Load Integer and Data Element Size Field=32 Bit—FIG. 13B

FIG. 13B is a table illustrating the group of possible data manipulation operations that may be specified by the data manipulation field 254C for a load fp where the data element width is 32 bits according to embodiments of the invention. This table is referred to as the UpConv$_{i32}$ and it is a representation of the block 458.

Load Floating Point and Data Element Size Field=64 Bit—FIG. 13C

FIG. 13C is a table illustrating the group of possible data manipulation operations that may be specified by the data manipulation field 254C for a load fp where the data element width is 64 bits according to embodiments of the invention. This table is referred to as the UpConv$_{f64}$ and it is a representation of the block 462.

Load Floating Point and Data Element Size Field=32 Bit—FIG. 13D

FIG. 13D is a table illustrating the group of possible data manipulation operations that may be specified by the data manipulation field 254C for a load fp where the data element width is 32 bits according to embodiments of the invention. This table is referred to as the UpConv$_{f32}$ and it is a representation of the block 464.

Additional Point

The groups of possible data manipulation operations specified in each of FIGS. 13A-13D (the load/op tables) are a subset of those in the corresponding FIGS. 12A-12D (the load tables). Specifically, the subsets do not include broadcast operations. This is done because certain values in the full opcode field 274 (e.g., those that specify gather or broadcast operations) cannot be used in combination with broadcasts specified in the data manipulation field 254C, and thus such values in the full opcode field 274 can be used only with the loads of FIGS. 12A-12D (the load tables). By way of more specific example, if there is a value in the full opcode field 274 that specifies a broadcast operation, the data manipulation field 254C cannot also indicate a broadcast operation. While certain embodiments of the invention include the separate load/op and load operations with separate load/op and load tables, alternative embodiments need not have this enforcement mechanism (e.g., they may support only load/op, they may support only load, they may determine that a broadcast in the full opcode field 274 causes a broadcast in the data manipulation field 254C to be ignore).

Data Manipulation Field Tables for Store—FIGS. 14A-14D

FIGS. 14A-14D are tables illustrating the groups of possible data manipulation operations that may be specified by the data manipulation field for the store instructions according to embodiments of the invention.

Store Integer and Data Element Size Field=64 Bit—FIG. 14A

FIG. 14A is a table illustrating the group of possible data manipulation operations that may be specified by the data manipulation field 254C for a store int where the data element width is 64 bits according to embodiments of the invention. This table is referred to as the DownConv$_{i64}$ and it is a representation of the block 470.

Store Integer and Data Element Size Field=32 Bit—FIG. 14B

FIG. 14B is a table illustrating the group of possible data manipulation operations that may be specified by the data manipulation field 254C for a store int where the data element width is 32 bits according to embodiments of the invention. This table is referred to as the DownConv$_{i32}$ and it is a representation of the block 4 72.

Store Floating Point and Data Element Size Field=64 Bit—FIG. 14C

FIG. 14C is a table illustrating the group of possible data manipulation operations that may be specified by the data manipulation field 254C for a store fp where the data element width is 64 bits according to embodiments of the invention. This table is referred to as the DownConv$_{f64}$ and it is a representation of the block 476.

Store Floating Point and Data Element Size Field=32 Bit—FIG. 14D

FIG. 14D is a table illustrating the group of possible data manipulation operations that may be specified by the data manipulation field 254C for a store fp where the data element width is 64 bits according to embodiments of the invention. This table is referred to as the DownConv$_{f32}$ and it is a representation of the block 478.

Data Manipulation Field Tables for the Graphics Data Type—FIGS. 15A-15C

FIGS. 15A-15C are tables illustrating the groups of possible data manipulation operations that may be specified by the data manipulation field for the instructions that operate on the graphics data types according to embodiments of the invention.

Load Graphics—FIG. 15A

FIG. 15A is a table illustrating the group of possible data manipulation operations that may be specified by the data manipulation field 254C for a load graphics where the data element width is 32 bits according to embodiments of the invention. This table is referred to as the UpConv$_{g32}$ and it is a representation of the block 480.

Load Packed Graphics—FIG. 15B

FIG. 15B is a table illustrating the group of possible data manipulation operations that may be specified by the data manipulation field 254C for a load packed graphics where the data element width is 32 bits according to embodiments of the invention. This table is referred to as the UpConv$_{pg32}$ and it is a representation of the block 482.

Store Graphics—FIG. 15C

FIG. 15C is a table illustrating the group of possible data manipulation operations that may be specified by the data manipulation field 254C for a store graphics where the data element width is 32 bits according to embodiments of the invention. This table is referred to as the UpConv$_{g32}$ and it is a representation of the block 484.

Write Mask Field—FIGS. 16A-D

FIGS. 16A-16B illustrate two merging operations performed with different write masks and with the second source and destination being the same according to embodiments of the invention. FIG. 16A is a block diagram illustrating an exemplary operation 1600 that merges using the write mask in write mask register K1 where the data element width is 32 bits and where the second source and destination are the same according to embodiments of the invention. FIG. 16A shows a source operand 1605; a source/destination operand 1610; the content of the mask register K1 1615 (with the lower 16 bits including a mix of ones and zeros); and the destination operand 1620. Each of the lower 16 bit positions in the mask register K1 corresponds to one of the data element positions (K1 [0] to data element position 0, K1 [1] to data element position 1, and so one). For each data element position in the destination operand 1620, it contains the content of that data element position in the source/destination 1610 or the result of the operation (illustrated as an add) depending on whether the corresponding bit position in the mask register K1 is a zero or 1, respectively. In other embodiments, source/destination operand 1610 is replaced with a second source operand. In those embodiments, the destination operand 1620 contains the contents of the destination operand 1620 from before the operation in those of the data element positions in which the corresponding bit positions of the mask register K1 are zero (if any) and contains the result of the operation in those of the data element positions in which of the corresponding bit positions of the mask register K1 are 1 (if any).

As previously described, one embodiment of the invention uses K0 to indicate no masking should be performed. FIG. 16B is a block diagram illustrating an exemplary operation 1625 that merges using the hardwired mask of all ones (the hardwired write mask is used by instructions that specify write mask register k0) where the data element width is 32 bits and where the second source and destination are the same according to embodiments of the invention. FIG. 16B is identical to FIG. 16A, except that K1 1615 is replaced with hardwired mask 1630 and that destination operand 1620 is replaced with destination operand 1635. The hardwired mask 1630 is all ones, and thus the destination operand 1635 contains data elements representative of the result of the operation.

FIG. 16C is a block diagram illustrating the correspondence of bits in the write mask registers to the data element positions of a 512 bit vector for the 8, 16, 32, and 64 bit data element widths according to embodiments of the invention. Specifically, a 64 bit register $K_N$ 1640 is illustrated, where all 64 bits are used when the data element width is 8 bits, only the least significant 32 bits are used when the data element width is 16 bits, only the least significant 16 bits are used when the data element width is 32 bits, and only the least significant 8 bits are used when the data element width is 64 bits. For a 256 bit vector, only the least significant 32 bits are used when the data element width is 8 bits, only the least significant 16 bits are used when the data element width is 16 bits, only the least significant 8 bits are used when the data element width is 32 bits, and only the least significant 4 bits are used when the data element width is 64 bits. For a 128 bit vector, only the least significant 16 bits are used when the data element width is 8 bits, only the least significant 8 bits are used when the data element width is 16 bits, only the least significant 2 bits are used when the data element width is 32 bits, and only the least significant 2 bits are used when the data element width is 64 bits.

The value of a given mask register can be set up as a direct result of a vector comparison instruction, transferred from a GP register, or calculated as a direct result of a logical operation between two masks.

FIG. 16D is a block diagram illustrating an exemplary operation 1660 that merges using the write mask in writemask register K1 where the data element width is 32 bits and where the second source and destination are different according to embodiments of the invention.

FIG. 16E is a block diagram illustrating an exemplary operation 1666 that zeros using the write mask in writemask register K1 where the data element width is 32 bits and where the second source and destination are different according to embodiments of the invention. While the zeroing operation is illustrated only relative to an operation where the destination is different from the sources, zeroing also works where the second source and destination are the same.

Exemplary Templates and Instructions—FIGS. 17-18

The following notations are provided by way of introduction to FIGS. 17-18.

Operand Notation

| Notation | Meaning |
|---|---|
| zmm1 | A vector register operand in the argument1 field of the instruction. The 64 byte vector registers are: zmm0 through zmm31 |
| zmm2 | A vector register operand in the argument2 field of the instruction. The 64 byte vector registers are: zmm0 through zmm31 |
| zmm3 | A vector register operand in the argument3 field of the instruction. The 64 byte vector registers are: zmm0 through zmm31 |
| $S_{f32}(zmm/m)$ | A vector floating-point 32-bit swizzle/conversion. |
| $S_{f64}(zmm/m)$ | A vector floating-point 64-bit swizzle/conversion. |
| $S_{i32}(zmm/m)$ | A vector integer 32-bit swizzle/conversion. |
| $S_{i64}(zmm/m)$ | A vector integer 64-bit swizzle/conversion. |
| $U_{f32}(m)$ | A floating-point 32-bit load Upconversion. |
| $U_{g32}(m)$ | A graphics floating-point 32-bit load Upconversion. |
| $U_{pg32}(m)$ | A packed graphics floating-point 32-bit load Upconversion. |
| $U_{i32}(m)$ | An integer 32-bit load Upconversion. |
| $U_{f64}(m)$ | A floating-point 64-bit load Upconversion. |
| $U_{i64}(m)$ | An integer 64-bit load Upconversion. |
| $D_{f32}(zmm)$ | A floating-point 32-bit store Downconversion. |
| $D_{g32}(zmm)$ | A graphics floating-point 32-bit store Downconversion. |
| $D_{i32}(zmm)$ | An integer 32-bit store Downconversion. |
| $D_{f64}(zmm)$ | A floating-point 64-bit store Downconversion. |
| $D_{i64}(zmm)$ | An integer 64-bit store Downconversion. |
| m | A memory operand. |
| $m_t$ | A memory operand that may have a EH hint attribute. |
| $mv_t$ | A vector memory operand that may have a EH hint attribute. This memory operand is encoded using ModRM and VSIB bytes. It can be seen as a set of pointers where each pointer is equal to BASE + V INDEX[i] × SCALE |
| effective_address | Used to denote the full effective address when dealing with a memory operand. |
| imm8 | An immediate byte value. |
| SRC[a-b] | A bit-field from an operand ranging from LSB b to MSB a. |

Vector Operand Value Notation

| Notation | Meaning |
|---|---|
| zmm1[i + 31:i] | The value of the element located between bit i and bit i + 31 of the argument1 vector operand. |
| zmm2[i + 31:i] | The value of the element located between bit i and bit i + 31 of the argument2 vector operand. |
| k1 [i] | Specifies the i-th bit in the vector mask register k1. |
| {k1} | A mask register operand in the write mask field of the instruction used with merging behavior. The 64 bit mask registers are: k0 through k7 |
| {k1}{z} | A mask register operand in the write mask field of the instruction used with zeroing behavior. The 64 bit mask registers are: k0 through k7 |

SwizzUpConv, FullUpConv and DownConv function conventions

| Swizzle/ conversion used | Function used in operation description |
|---|---|
| $S_{f32}(zmm/m)$ | $SwizzUpConvLoad_{f32}(zmm/m)$ |
| $S_{f64}(zmm/m)$ | $SwizzUpConvLoad_{f64}(zmm/m)$ |
| $S_{i32}(zmm/m)$ | $SwizzUpConvLoad_{i32}(zmm/m)$ |
| $S_{i64}(zmm/m)$ | $SwizzUpConvLoad_{i64}(zmm/m)$ |
| $U_{f32}(m)$ | $UpConvLoad_{f32}(m)$ |
| $U_{g32}(m)$ | $UpConvLoad_{g32}(m)$ |
| $U_{pg32}(m)$ | $UpConvLoad_{pg32}(m)$ |
| $U_{i32}(m)$ | $UpConvLoad_{i32}(m)$ |
| $U_{f64}(m)$ | $UpConvLoad_{f64}(m)$ |

-continued

| Swizzle/<br>conversion used | Function used in<br>operation description |
|---|---|
| $U_{i64}(m)$ | $UpConvLoad_{i64}(m)$ |
| $D_{f32}(zmm)$ | $DownConvStore_{f32}(zmm)$ or |
| | $DownConvStore_{f32}(zmm[xx:yy])$ |
| $D_{g32}(zmm)$ | $DownConvStore_{g32}(zmm)$ or |
| | $DownC\ onv\ Store_{g32}(zmm[xx:yy])$ |
| $D_{i32}(zmm)$ | $DownConvStore_{i32}(zmm)$ or |
| | $DownConvStore_{i32}(zmm[xx:yy])$ |
| $D_{f64}(zmm)$ | $DownConvStore_{f64}(zmm)$ or |
| | $DownConvStore_{f64}(zmm[xx:yy])$ |
| $D_{i64}(zmm)$ | $DownConvStore_{i64}(zmm)$ or |
| | $DownConvStore_{i64}(zmm[xx:yy])$ |

Exemplary Instruction Encodings for EVEX.U0—FIGS. 17A-D

FIG. 17A illustrates a subset of fields from an exemplary specific vector friendly instruction format according to embodiments of the invention. Specifically, FIG. 17A shows an EVEX Prefix 302, a Real Opcode Field 330, and a MOD R/M Field 340. In this embodiment, the Format Field 240 contains 0x62 to indicate that the instruction format is the vector friendly instruction format.

FIGS. 17B-17D each illustrates a subset of fields from an exemplary specific vector friendly instruction encoded in the specific vector friend instruction format of FIG. 17A according to embodiments of the invention. In the description of FIG. 17B-17D, the specific uses of some fields are described to demonstrate possible encodings of those fields for various exemplary configurations of the VADDPS instruction. In each of the FIGS. 17B-17D, the Format Field 240 contains 0x62 to indicate that the instruction is encoded in the vector friendly instruction format and the real opcode field 330 contains the VADDPS opcode. FIGS. 17B-17D each illustrates an encoding of the VADDPS instruction in the EVEX.U0 class according to embodiments of the invention; FIG. 17B and FIG. 17C each illustrates an EXEV.U0 encoding of VADDPS in a no memory access 205 instruction template while FIG. 17D illustrates an EVEX.U0 encoding of VADDPS in a memory access 220 instruction template. The VADDPS instruction adds packed single-prevision floating-point values from a first register or memory operand (e.g. zmm3) to a second register (e.g. zmm2) and stores the result in a third register (e.g. zmm1) according to a writemask (e.g. k1). This instruction allows for various round operations, data transform operations, or data manipulation operations depending on the encoding of the instruction. This instruction may be described by the following instruction mnemonic: EVEX.U0.NDS.512.0F 58/r VADDPS zmm1 {k1}, zmm2, $S_{f32}$ (zmm3/mV) {eh}.

FIG. 17B illustrates an encoding of the VADDPS instruction in the no memory access, full round control type operation 210 instruction template. The data element width field 264 is 0 to indicate 32 bit data element width. The class field 268 (i.e. EVEX.U) is set to 0 to indicate the EVEX.U0 class. The alpha field 252 is interpreted as a RS field 252A (i.e. EVEX.rs) and is set to 1 (i.e. RS field 252A.1) to select the round control type operation. Since the alpha field 252 is acting as RS field 252A.1, the beta field 254 is interpreted as a round operation field 258 (i.e. EVEX.$r_{2-0}$). Specifically, EVEX.$r_2$ is interpreted as a SAE field 256 while EVEX.$r_{1-0}$ act as the round control field 254A. The modifier field 246 (i.e. MODR/M.MOD 342) is set to 11 to indicate no memory access (i.e. register zmm3 is the first source operand instead of a memory operand).

FIG. 17C illustrates an encoding of the VADDPS instruction in the no memory access, data transform type operation 215 instruction template. The encoding of FIG. 17C is identical to FIG. 17B except for the alpha field 252 and the beta field 254. The alpha field 252 is interpreted as a RS field 252A (i.e. EVEX.rs) and is set to 0 (i.e. RS field 252A.2) to select the data transform type operation. Since the alpha field 252 is acting as RS field 252A.2, the beta field 254 is interpreted as a data transform field 254B (i.e. EVEX.$r_{2-0}$).

FIG. 17D illustrates an encoding of the VADDPS instruction in the memory access 220 instruction template. The data element width field 264 is 0 to indicate 32 bit data element width. The class field 268 (i.e. EVEX.U) is set to 0 to indicate the EVEX.U0 class. The alpha field 252 is interpreted as an eviction hint field 252B (i.e. EVEX.EH). The beta field 254 is interpreted as a data manipulation field 254C (i.e. EVEX.$s_{2-0}$). The modifier field 246 (i.e. MODR/M.MOD 342) is set to either 00, 01, or 10 to indicate that the first source operand is a memory operand; this is shown in FIG. 17D as $\overline{11}$ (i.e. any input except 11).

Exemplary Instruction Encoding for EVEX U1—FIGS. 18A-18F

FIG. 18A illustrates a subset of fields from an exemplary specific vector friendly instruction format according to embodiments of the invention. Specifically, FIG. 18A shows an EVEX Prefix 302, a Real Opcode Field 330, and a MOD R/M Field 340. In this embodiment, the Format Field 240 contains 0x62 to indicate that the instruction format is the vector friendly instruction format.

FIGS. 18B-18F each illustrates a subset of fields from an exemplary specific vector friendly instruction encoded in the specific vector friend instruction format of FIG. 18A according to embodiments of the invention. In the description of FIG. 18B-18F, the specific uses of some fields are described to demonstrate possible encodings of those fields for various exemplary configurations of the VADDPS instruction. In each of the FIGS. 18B-18F the Format Field 240 contains 0x62 to indicate that the instruction is encoded in the vector friendly instruction format and the real opcode field 330 contains the VADDPS opcode. FIGS. 18B-18F each illustrates an encoding of the VADDPS instruction in the EVEX.U1 class according to embodiments of the invention; FIG. 18B-18E each illustrates an EXEV.U1 encoding of VADDPS in a no memory access 205 instruction template while FIG. 18F illustrates an EVEX.U1 encoding of VADDPS in a memory access 220 instruction template.

FIG. 18B illustrates an encoding of the VADDPS instruction in the no memory access, write mask control, partial round control type operation 212 instruction template. The data element width field 264 is 0 to indicate 32 bit data element width. The class field 268 (i.e. EVEX.U) is set to 1 to indicate the EVEX.U1 class. The alpha field 252 is interpreted as a write mask control field 252C (selecting between a merging or zeroing writemask). The least significant bit of the beta field 254 is interpreted as an RL field 257A and is set to 1 to indicate a partial round type operation (i.e. round 257A.1). The two most significant bits of the beta field 254 are interpreted as a round operation field 259A. The modifier field 246 (i.e. MODR/M.MOD 342) is set to 11 to indicate no memory access (i.e. register zmm3 is the first source operand instead of a memory operand). In this encoding, the VADDPS instruction adds a packed single-precision floating-point value from a first register (e.g. zmm3) to a second register (e.g. zmm2) and stores the rounded result in a third register (e.g. zmm1) according to a writemask (e.g. k1). This may be described by the following mnemonic: EVEX.U1.NDS.512.0F.W0 58/r VADDPS zmm1 {k1} {z}, zmm2, zmm3 {er} for zeroing-writemasking and the same without the {z} for merging-writemasking. While the other mnemonics show below in this section all include {z}, it should be understood that the same mnemonic without the {z} is similarly also possible.

FIGS. 18C-18E each illustrates an encoding of the VADDPS instruction in the no memory access, write mask control, VSIZE type operation 217 instruction template. The encoding of FIGS. 18C-18E are identical to FIG. 17B except for the beta field. In each of FIGS. 18C-18E, the least significant bit of the beta field 254 is interpreted as an RL field 257A and is set to 0 to indicate a VSIZE type operation 257A.2. The two most significant bits of the beta field 254 are interpreted as a vector length field 259B.

In FIG. 18C, the vector length field 259B is set to 10 to indicate a vector size of 512 bits. In FIG. 18D, the vector length field 259B is set to 01 to indicate a vector size of 256 bits. In FIG. 18E, the vector length field 259B is set to 00 to indicate a vector size of 128 bits. In this encoding, the VADDPS instruction adds a packed single-precision floating-point value from a first register (e.g. zmm3) to a second register (e.g. zmm2) and stores the result in a third register (e.g. zmm1) according to a writemask (e.g. k1). FIG. 18C may be described by the following mnemonic: EVEX.U1.NDS.512.0F.W0 58/r VADDPS zmm1 {k1} {z}, zmm2, zmm3. FIG. 18D may be described by the following mnemonic: EVEX.U1.NDS.256.0F.W0 58/r VADDPS ymm1 {k1} {z}, ymm2, ymm3. FIG. 18E may be described by the following mnemonic: EVEX.U1.NDS.128.0F.W0 58/r VADDPS xmm1 {k1} {z}, xmm2, zmm3.

FIG. 18F illustrates an encoding of the VADDPS instruction in the memory access, write mask control 227 instruction template. The data element width field 264 is 0 to indicate 32 bit data element width. The class field 268 (i.e. EVEX.U) is set to 1 to indicate the EVEX.U1 class. The alpha field 252 is interpreted as a write mask control field 252C (selecting between a merging or zeroing writemask). The least significant bit of the beta field 254 is interpreted as a broadcast field 257B. The two most significant bits of the beta field 254 are interpreted as a vector length field 259B. The modifier field 246 (i.e. MODR/M.MOD 342) is set to either 00, 01, or 10 to indicate that the first source operand is a memory operand; this is shown in FIG. 18F as $\overline{11}$ (i.e. any input except 11). In this encoding, the VADDPS instruction adds a packed single-precision floating-point value from a memory operand, that can be broadcast upon loading, to a first register (e.g. zmm2) and stores the result in a second register (e.g. zmm1) according to a writemask (e.g. k1). When the vector length field indicates vectors of 512 bits, this may be described by the following mnemonic: EVEX.U1.NDS.512.0F.W0 58/r VADDPS zmm1 {k1} {z}, zmm2, $B_{32}$ (mV). When the vector length field indicates vectors of 256 bits, this may be described by the following mnemonic: EVEX.U1.NDS.256.0F.W0 58/r VADDPS ymm1 {k1} {z}, ymm2, $B_{32}$ (mV). When the vector length field indicates vectors of 128 bits, this may be described by the following mnemonic: EVEX.U1.NDS.128.0F.W0 58/r VADDPS xmm1 {k1} {z}, xmm2, B32 (mV).

Exemplary Displacement8*N Values

Figure 4B:
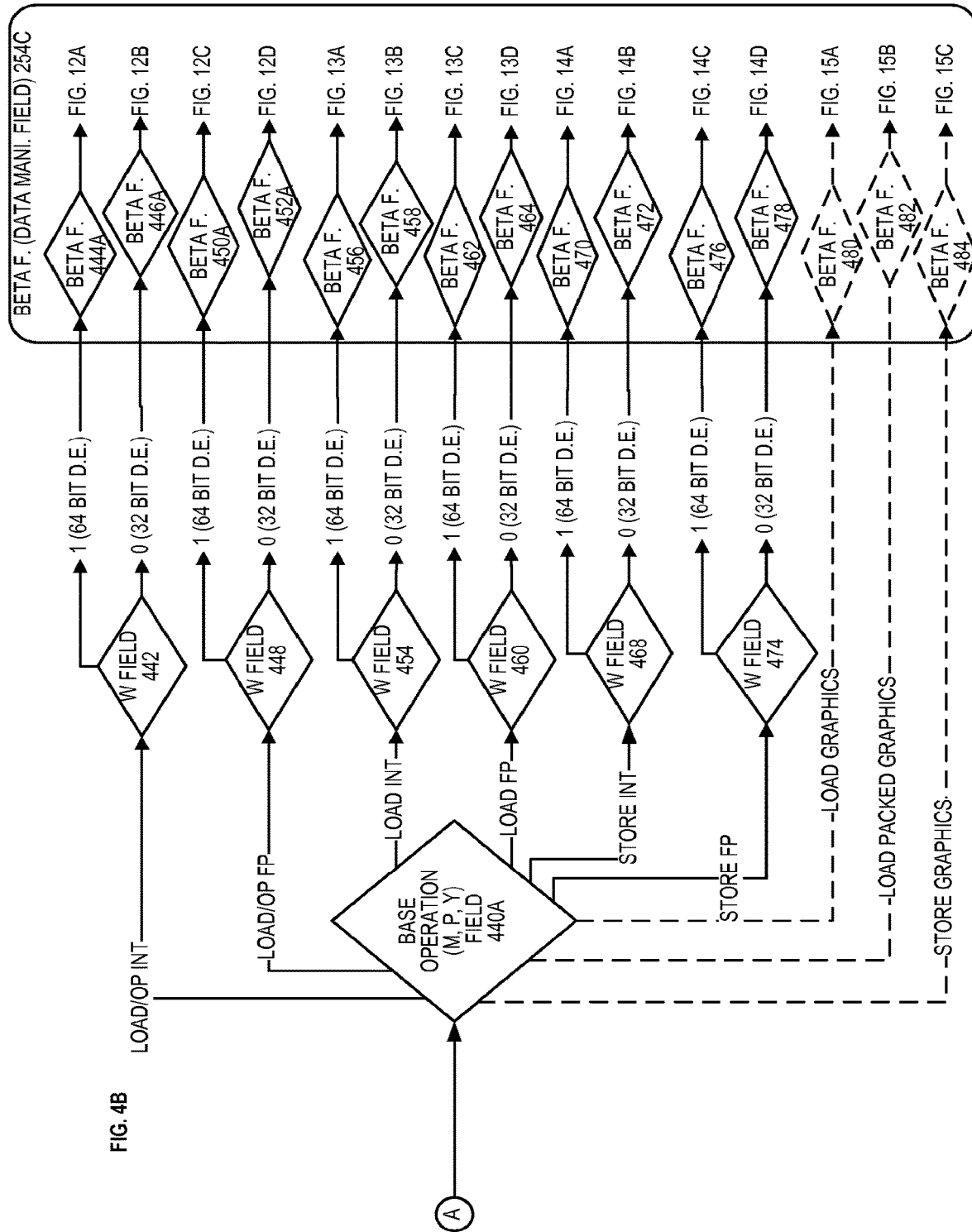
FIG. 4B is a second part of the flow diagram showing the inter relationship of some of the fields of the vector friendly instruction format according to one embodiment of the invention.

In one embodiment of the invention, the memory access size N is determined based on contents of two or more of the base operation field, the data element width field, and the augmentation operation field depending on the instruction template being used and other factors as described below. In one embodiment of the invention, with regard to U=0 (Class A), the below tables show the size of the vector (or element) being accessed in memory and, analogously, the displacement factor for compressed displacement (disp8*N). Note that some instructions work at element granularity instead of full vector granularity at the level of memory, and hence should use the "element level" column in the tables below. The function column's label (e.g., $U/S_{i64}$) signifies the memory access type specified by the base operation field (e.g., $U/S_i$ signifies load int and load/op int) and data element width (e.g., $_{64}$ is a 64 bit data element width). The values in this column are the possible values of the data manipulation field 254C in the embodiment of FIG. 3. Referring to FIG. 4B, the various memory access types are shown flowing (in some cases through a data element width decision) to their data manipulation FIGS. 12A-15C; the various tables 12A-15C drive the selection of N's value, and thus are placed on columns 2 and 3 as appropriate. By way of example, a load/op int 64 bit data element width memory access operation flows to FIG. 12A, at which the data manipulation field's 254C content is used to both select the data manipulation operation (as indicted in FIG. 12A) and the value of N (as indicated below). By way of another example, a load int 64 bit data element width memory access operation (which indicates a broadcast in the base operation field 242) flows to FIG. 13A, at which the data manipulation field's 254C content is used to both select the data manipulation operation (as indicted in FIG. 13A, which does not include broadcast data transforms) and the value of N (as indicated below). Thus, the second column is for instructions whose base operation field 242 does not specify a broadcast or element level memory access; the third column's first sub-column is for instructions whose base operation field 242 specifies a broadcast but does not specify an element level memory access; and the third column's second sub-column is for instructions whose base operation field 242 specifies a broadcast or an element level memory access.

SwizzleUpConvert$_{i64}$ and UpConvert$_{i64}$

| | FIG. 12A No broadcast or element level memory access specified by base operation field | | FIG. 13A |
|---|---|---|---|
| Function $S/U_{i64}$ | | 4 to 16 broadcast specified by base operation field | 1 to 16 broadcast or element level memory access specified by base operation field |
| 000 | 64 | 32 | 8 |
| 001 | 8 | NA | NA |
| 010 | 32 | NA | NA |
| 011 | NA | NA | NA |
| 100 | NA | NA | NA |
| 101 | NA | NA | NA |
| 110 | NA | NA | NA |
| 111 | NA | NA | NA |

SwizzleUpConvert$_{i32}$ and UpConvert$_{i32}$

| | FIG. 12B | FIG. 13B | |
|---|---|---|---|
| Function S/U$_{i32}$ | No broadcast or element level memory access specified by base operation field | 4 to 16 broadcast specified by base operation field | 1 to 16 broadcast or element level memory access specified by base operation field |
| 000 | 64 | 16 | 4 |
| 001 | 4 | NA | NA |
| 010 | 16 | NA | NA |
| 011 | NA | NA | NA |
| 100 | 16 | 4 | 1 |
| 101 | 16 | 4 | 1 |
| 110 | 32 | 8 | 2 |
| 111 | 32 | 8 | 2 |

SwizzleUpConvert$_{f64}$ and UpConvert$_{f64}$

| | FIG. 12C | FIG. 13C | |
|---|---|---|---|
| Function S/U$_{f64}$ | No broadcast or element level memory access specified by base operation field | 4 to 16 broadcast specified by base operation field | 1 to 16 broadcast or element level memory access specified by base operation field |
| 000 | 64 | 32 | 8 |
| 001 | 8 | NA | NA |
| 010 | 32 | NA | NA |
| 011 | NA | NA | NA |
| 100 | NA | NA | NA |
| 101 | NA | NA | NA |
| 110 | NA | NA | NA |
| 111 | NA | NA | NA |

SwizzleUpConvert$_{f32}$ and UpConvert$_{f32}$

| | FIG. 12D | FIG. 13D | |
|---|---|---|---|
| Function S/U$_{f32}$ | No broadcast or element level memory access specified by base operation field | 4 to 16 broadcast specified by base operation field | 1 to 16 broadcast or element level memory access specified by base operation field |
| 000 | 64 | 16 | 4 |
| 001 | 4 | NA | NA |
| 010 | 16 | NA | NA |
| 011 | NA | 8 | 2 |
| 100 | 16 | 4 | 1 |
| 101 | 16 | 4 | 1 |
| 110 | 32 | 8 | 2 |
| 111 | 32 | 8 | 2 |

Down Conversion$_{i64}$

| | FIG. 14A | | FIG. 14A |
|---|---|---|---|
| Function D$_{i64}$ | Regular store specified by base operation field | Not Applicable | Element level memory access specified by base operation field |
| 000 | 64 | NA | 8 |
| 001 | NA | NA | NA |
| 010 | NA | NA | NA |
| 011 | NA | NA | NA |
| 100 | NA | NA | NA |
| 101 | NA | NA | NA |
| 110 | NA | NA | NA |
| 111 | NA | NA | NA |

Down Conversion$_{i32}$

| | FIG. 14B | | FIG. 14B |
|---|---|---|---|
| Function D$_{i32}$ | Regular store specified by base operation field | Not Applicable | Element level memory access specified by base operation field 1 |
| 000 | 64. | NA | 4 |
| 001 | NA | NA | NA |
| 010 | NA | NA | NA |
| 011 | NA | NA | NA |
| 100 | 16 | NA | 1 |
| 101 | 16 | NA | 1 |
| 110 | 32 | NA | 2 |
| 111 | 32 | NA | 2 |

Down Conversion$_{f64}$

| | FIG. 14C | | FIG. 14C |
|---|---|---|---|
| Function D$_{f64}$ | Regular store specified by base operation field | Not Applicable | Element level memory access specified by base operation field |
| 000 | 64 | NA | 8 |
| 001 | NA | NA | NA |
| 010 | NA | NA | NA |
| 011 | NA | NA | NA |
| 100 | NA | NA | NA |
| 101 | NA | NA | NA |
| 110 | NA | NA | NA |
| 111 | NA | NA | NA |

Down Conversion$_{f32}$

| | FIG. 14D | | FIG. 14D |
|---|---|---|---|
| Function D$_{f32}$ | Regular store specified by base operation field | Not Applicable | Element level memory access specified by base operation field |
| 000 | 64 | NA | 4 |
| 001 | NA | NA | NA |

UpConvert$_{g32}$

| | FIG. 15A | FIG. 15A | |
|---|---|---|---|
| Function U$_{g32}$ | No broadcast or element level memory access specified by base operation field | 4 to 16 broadcast specified by base operation field | 1 to 16 broadcast or element level memory access specified by base operation field |
| 000 | 64 | 16 | 4 |
| 001 | NA | NA | NA |
| 010 | 16 | 4 | 1 |
| 011 | NA | NA | NA |
| 100 | 16 | 4 | 1 |
| 101 | 16 | 4 | 1 |
| 110 | 32 | 8 | 2 |
| 111 | 32 | 8 | 2 |

UpConvert$_{pg32}$

| | FIG. 15B | FIG. 15B | |
|---|---|---|---|
| Function U$_{pg32}$ | No broadcast or element level memory access specified by base operation field | 4 to 16 broadcast specified by base operation field | 1 to 16 broadcast or element level memory access specified by base operation field |
| 000 | 64 | 16 | 4 |
| 001 | 64 | 16 | 4 |
| 010 | 64 | 16 | 4 |
| 011 | 64 | 16 | 4 |
| 100 | 64 | 16 | 4 |
| 101 | 64 | 16 | 4 |
| 110 | 64 | 16 | 4 |
| 111 | 64 | 16 | 4 |

DownConversion$_{g32}$

| | FIG. 15C | | FIG. 15C |
|---|---|---|---|
| Function D$_{g32}$ | Regular store specified by base operation field | Not Applicable | Element level memory access specified by base operation field |
| 000 | 64 | NA | 4 |
| 001 | NA | NA | NA |
| 010 | NA | NA | NA |
| 011 | 32 | NA | 2 |
| 100 | 16 | NA | 1 |
| 101 | 16 | NA | 1 |
| 110 | 32 | NA | 2 |
| 111 | 32 | NA | 2 |

In one embodiment of the invention, with regard to U=1 (Class B), various instructions have the ability to use a compressed displacement by using disp8 in conjunction with a memory access size N that is determined based on the vector length (determined by the content of the vector length field 259B), the type of vector operation and whether broadcast is being performed (the value of the base operation field 242 and/or the broadcast field 257B), and the data element width (determined by the content of the real opcode field 330 and/or the data element width field 264 as described in FIG. 4E), for different types of instructions. In general, the memory access size N corresponds to the number of bytes in the memory input (e.g., 64 when the accessing a full 512-bit memory vector). In one embodiment of the invention, the first table below explains some of the terms use in the second table below, and the second table below gives the value of N for various types of instructions. A Tuple in the below tables is a packed structure of data in memory.

| | |
|---|---|
| Full | Reads a full vector. Accepts broadcasts (load-op). e.g., VADDPS zmm1, zmm2, zmm3/B(mem) |
| FullMem | Reads a full vector. Does not accept broadcasts (load only). e.g., VMOVAPS zmm1, m512 |
| Scalar | Reads a single element from memory to do a scalar operation: VADDSS xmm1, xmm2, m32 |
| Tuple1 | Reads a single element from memory. e.g., VBROADCASTSS zmm1, m32 |
| Tuple2 | Reads only 2 elements from memory. e.g., VBROADCASTF32X2 zmm1, m64 |
| Tuple4 | Reads only 4 elements from memory. e.g., , VBROADCASTF32X4 zmm1 m128 |
| Tuple8 | Reads only 8 elements from memory. e.g., VBROADCASTF32X8 zmm1, m256 |
| Half | Reads only half of the total elements from memory. e.g., VCVTPS2PD zmml, B(mem) // only reads 8 SP input values to get 8 DP results |
| HalfMem | Same above, but memory only (it does not accept broadcasts). e.g., VPMOVZXBW zmm1, mem // only reads 32 byte input values to get to 32 Word results |
| QuarterMem | Reads only a quarter of the total elements from memory. e.g., VPMOVZXBD zmm1, mem // only reads 16 byte input values to get 16Dword results |
| EighthMem | Reads only a quarter of the total elements from memory. e.g., VPMOVZXBQ zmm1, mem // only reads 8 byte input values to get 8 Qword results |
| Mem128 | Reads only a package of m128 bits from memory. It does not allow broadcasts. |

| Disp8*N Format | Broadcast | Input Size | Broadcast | N (disp8*N) 128-bit | N (disp8*N) 256-bit | N (disp8*N) 512-bit | Comment |
|---|---|---|---|---|---|---|---|
| Full | 0 | 32 bit | None | 16 | 32 | 64 | LoadOp |
| | 1 | 32 bit | {1toX} | 4 | 4 | 4 | |
| | 0 | 64 bit | None | 16 | 32 | 64 | |
| | 1 | 64 bit | {1toX} | 8 | 8 | 8 | |
| FullMem | 0 | N/A | None | 16 | 32 | 64 | Load/Store + |
| | 1 | | N/A | N/A | N/A | N/A | SubDword |
| Tuple1/Scalar | 0 | 8 bit | None | 1 | 1 | 1 | Broadcast/Extra |
| | 1 | 8 bit | N/A | N/A | N/A | N/A | ct/Insert (1 |
| | 0 | 16 bit | None | 2 | 2 | 2 | element) + |
| | 1 | 16 bit | N/A | N/A | N/A | NA | Gather/Scatter + |
| | 0 | 32 bit | None | 4 | 4 | 4 | Scalar |
| | 1 | 32 bit | N/A | N/A | N/A | N/A | |
| | 0 | 64 bit | None | 8 | 8 | 8 | |
| | 1 | 64 bit | N/A | N/A | N/A | N/A | |
| Tuple2 | 0 | 32 bit | None | 8 | 8 | 8 | Broadcast |
| | 1 | 32 bit | N/A | N/A | N/A | N/A | (2 elements) |
| | 0 | 64 bit | None | N/A | 16 | 16 | |
| | 1 | 64 bit | N/A | N/A | N/A | N/A | |
| Tuple4 | 0 | 32 bit | None | N/A | 16 | 16 | Broadcast |
| | 1 | 32 bit | N/A | N/A | N/A | N/A | (4 elements) |
| | 0 | 64 bit | None | N/A | N/A | 32 | |
| | 1 | 64 bit | N/A | N/A | N/A | N/A | |
| Tuple8 | 0 | 32 bit | None | N/A | N/A | 32 | Broadcast |
| | 1 | 32 bit | N/A | N/A | N/A | N/A | (8 elements) |
| | 0 | 64 bit | N/A | N/A | N/A | N/A | |
| | 1 | 64 bit | N/A | N/A | N/A | N/A | |
| Half | 0 | 32 bit | None | 8 | 16 | 32 | LoadOp |
| | 1 | 32 bit | {1toX} | 4 | 4 | 4 | (Half mem size) |
| | 0 | 64 bit | N/A | N/A | N/A | N/A | |
| | 1 | 64 bit | N/A | N/A | N/A | N/A | |
| HalfMem | 0 | N/A | None | 8 | 1.6 | 32 | Load/Store + |
| | 1 | | N/A | N/A | N/A | N/A | SubDword |
| | | | | | | | (Half mem size) |
| QuarterMem | 0 | N/A | None | 4 | 8 | 16 | Load/Store + |
| | 1 | | N/A | N/A | N/A | N/A | SubDword |
| | | | | | | | (Quarter mem size) |
| EighthMem | 0 | N/A | None | 2 | 4 | 8 | Load/Store + |
| | 1 | | N/A | N/A | N/A | N/A | SubDword |
| | | | | | | | (Eighth mem size) |
| Mem128 | 0 | N/A | None | 16 | 16 | 16 | Shift with shift |
| | 1 | | N/A | N/A | N/A | N/A | count from memory |

Reserving Bits

Also, in some embodiments of the invention, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose out-of-order cores intended for general-purpose computing that support only class B. Another processor that does not have a separate graphics core, may include one more general purpose in-order or out-of-order cores that support both class A and class B. Of course, features from one class may also be implement in the other class in different embodiments of the invention. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

| Types of Instructions | Write Mask Control Field 252C | Broadcast Field 257B |
|---|---|---|
| Loads/broadcast/inserts | | R |
| Byte/Word operations with memory | | R |
| Gather/scatter | R | R |
| Extracts/stores | R | R |
| Compares | R | |

With regard to loads, broadcast, and inserts, one embodiment of the invention implements different versions of broadcast with the base operation field, and thus the broadcast field 257B is not needed. For byte/word operations, one embodiment of the invention does not support broadcasts with the broadcast field 257B because the hardware cost of supporting this feature was not currently justified. As for gather (which is a type of load), one embodiment of the invention implements different versions of broadcast with the base operation field, and thus the broadcast field 257B is not needed. With regard to scatter, extracts and stores, one embodiment does not support broadcasts with the broadcast field 257B because these types of instructions have a register source (not a memory source) and a memory destination, and broadcast is only meaningful when memory is the source. The mask of a gather instruction is a completion mask; and thus a merging writemask operation is currently the desired operation. Performing zeroing writemask on a store, scatter, or extract would zero a location in memory— an operation for which a vector store, scatter, or extract is not typically used. For compares, in one embodiment of the invention, zeroing writemasking would be unnatural since the compares already writes 0 if the comparison result is negative (e.g., the two elements compared are not equal in case of equality comparison), and thus might interfere with how the comparison result is interpreted.

Exemplary Pipelines—FIGS. 19-22

FIGS. 19-22 are block diagrams illustrating which fields of the instruction templates in FIG. 2A are utilized in different stages of four exemplary processor pipelines according to embodiments of the invention. It should be noted that at the level of understanding required, the illustrated pipeline stages and their function are well-known. Each of FIGS. 19-22 include an A, B, and C figure respectively illustrating the no memory access, full round control type operation 210 instruction template; the no memory access, data transform type operation 215 instruction template; and the memory access 225/230 instruction templates. While each of the FIGS. 19-22 shows a different exemplary pipeline, the same pipeline is shown in each of the A-C figures for each figure number. For example, FIG. 19A shows the no memory access, full round control type operation 210 instruction template and a first exemplary instruction pipeline; FIG. 19B shows the no memory access data transform type operation 215 and the same exemplary pipeline as in FIG. 19A; whereas FIG. 20A shows the no memory access, full round type control operation 210 instruction template and the second exemplary processor pipeline.

FIGS. 19-22 respectively illustrate processor pipeline 1900, processor pipeline 2000, processor pipeline 2100, and processor pipeline 2200. Where the pipeline stage name is the same across the different exemplary pipelines, the same reference numeral was used for ease of understanding; however, this does not imply that the same name pipeline stages across the different exemplary pipelines are the same, just that they perform a similar operation (although it may include more or less sub operations).

Exemplary Generic Pipeline—FIG. 19

The processor pipeline 1900 is represents a generic processor pipeline, and thus it includes a fetch stage 1910, a decode stage 1920, a register read/memory read stage 1930, a data transform stage 1940, an execute stage 1950, and a write back/memory write stage 1960.

Brackets and arrowed lines from the instruction templates to the processor pipeline stages illustrate the fields that are utilized by different ones of the pipeline stages. For example, in FIG. 19A, all of the fields are utilized by the decode stage 1920; the register index field 244 is utilized by the register read/memory read stage 1930; the base operation field 292, the rs field 252A (round 252A.1), the SAE field 256, the round operation field 258, and the data element width field 264 are utilized by the execute stage 1950; the data element width field 264 is also utilized by the write back/write memory stage 1960; and the write mask field 270 is used by the execute stage 1950 or the write back/memory write stage 1960 (The use of the write mask field 270 optionally in two different stages represents that the write mask field could disable the execution of the operation on the masked data elements in the execute stage 1950 (thereby preventing those data element positions from being updated in the write/memory write stage 1960), or the execution stage 1950 could perform the operation and the write mask be applied during the write/memory write stage 1960 to prevent the updating of the masked data element positions).

It should be noted that the arrowed lines do not necessarily represent the only stage(s) utilized by the different fields, but do represent where that field will likely have the largest impact. As between the A and B figures, it will be noted that the main difference is that the augmentation operation field 250 is utilized by the execute stage 1950 for the round operation; the augmentation operation field 250 is utilized by the data transform stage 1940 for the data transform type operation; and the line from the data element width field 264 to the execute stage 1950 is moved to the data transform stage 1940. FIG. 19C shows the base operation field 242 instead going to the register read/memory read stage 1930; the EH field 252B of the augmentation operation field 250 being utilized by the register read/memory read stage 1930; the scale field 260, the displacement field 262A/displacement factor field 262B, the write mask field 270, and the data element width field 264 being optionally utilized by the register read/memory read stage 1930 or the write back/memory write 1960 depending on whether it is a memory read or memory write operation. Since it is well-known the pipeline stages that would utilize the immediate field 272, a mapping for that field is not represented in order not to obscure the invention.

Exemplary in-Order Pipeline—FIG. 20

The processor pipeline 2000 represents an in order processor pipeline and has the same named pipeline stages as the processor pipeline 1900, but has a length decoding stage 2012 inserted between the fetch stage 1910 and the decode stage 1920.

The mappings for FIGS. 20A-20C are essentially identical to those in FIGS. 19A-19C.

First Exemplary Out-of-Order Pipeline—FIG. 21

The processor pipeline 2100 represents an first exemplary out of order pipeline that has the same named pipeline stages as the processor pipeline 2000, but also has the following: 1) an allocate stage 2122, a renaming stage 2124, and a schedule stage 2126 inserted between the decode stage 1920 and the register read/memory read stage 1930; and 2) a reorder buffer (rob) read stage 2162, an exception handling stage 2164, and a commit stage 2166 added after the write back/memory write stage 1960.

In FIGS. 21A-21C, the mappings are generally the same as the mappings in FIGS. 20A-20C, with the following exceptions: 1) that the register index field 244 and the modifier field 246 are utilized by the renaming stage 2124; 2) in only FIG. 21A, the write mask field 270 is also optionally used by the exception handling stage 2164 to suppress exceptions on masked data element positions; and 3) in only FIG. 21A, the SAE field 256 is used optionally by the execute stage 1950 and the exception handling stage 2164 depending on where floating point exceptions will be suppressed.

Second Exemplary Out-of-Order Pipeline—FIG. 22

The processor pipeline 2200 represents a second exemplary out of order pipeline that has the same named processor pipeline stages as the processor pipeline 2100, with the exception that the data transform and execution stages have been merged to form and an execute/data transform stage 2245.

The mappings in FIGS. 22A-22C are essentially the same as those in FIGS. 21A-21C, with the exception that the mappings that went separately to the data transform stage 1940 and the execute stage 1950 instead go to the execute/data transform stage 2245.

Class B Instructions Templates on the Exemplary Pipelines

The below table illustrates how to modify FIGS. 19-22 to accommodate the fields of the instruction templates in FIG. 2B according to embodiments of the invention.

| Field | FIG. | Pipeline Stage |
|---|---|---|
| Write Mask Control Field (Z) 252C | 19A-22C | Write Back/Memory Write 1960 and or Execute 1950/2245 |
| Round 257A.1. | 21A-22C | Renaming; 2124 |
| | 19A, 20A, 21A 22A | Execute 1950 Execute/Data Transform 2245 |
| | 21A, 22A | Exception Handling 2164 |
| Round Operation Field 259A | 19A, 20A, 21A 22A | Execute 1950 Execute/Data Transform 2245 |
| VSIZE Field 267A.2 | 19B, 20B, 21B, 22B 21B, 22B | Decode 1920 |
| | | Renaming 2124 |
| | 19B, 20B, 21B, 22B | Register read/Memory read 1930 |
| | 19B, 20B, 21B 22B | Execute 1950 Execute/Data Transform 2245 |
| | 19B, 20B, 21B, 22B | Write Back/Memory Write 1960 |
| Vector Length Field 259B | 19B-C, 20B-C, 21B-C, 22B-C | Decode 1920 |
| | 21B-C, 22B-C | Renaming 2124 |
| | 19-B.-C, 20B-C, 21B-C., 22B-C | Register read/Memory read 1930 |
| | 19B-C, 20B-C, 21B-C 22B-C | Execute 1950 Execute/Data Transfarm 2245 |
| | 19B-C, 20B-C, 21B-C, 22B-C | Write Back/Memory Write 1960 |
| Broadcast Field 257B | 19C, 20C, 21C 22C | Data Transform 1940 Execute/Data Transform 2245 |
| | 19C, 20C, 21C, 22C | Memory Read 1930 |

Decode Stages 1920

A variety of different well known decode units could be used in the decode stages 1920. For example, the decode unit may decode each macro instruction into a single wide micro instruction. As another example, the decode unit may decode some macro instructions into single wide micro instructions, but others into multiple wide micro instructions. As another example particularly suited for out of order processor pipelines, the decode unit may decode each macro instruction into one or more micro-ops, where each of the micro-ops may be issued and execute out of order.

It should also be noted that a decode unit may be implemented with one or more decoders and each decoder may be implemented as a programmable logic array (PLA), as is well known in the art. By way of example, a given decode unit may: 1) have steering logic to direct different macro instructions to different decoders; 2) a first decoder that may decode a subset of the instruction set (but more of it than the second, third, and fourth decoders) and generate two micro-ops at a time; 3) a second, third, and fourth decoder that may each decode only a subset of the entire instruction set and generate only one micro-op at a time; 4) a micro-sequencer ROM that may decode only a subset of the entire instruction set and generate four micro-ops at a time; and 5) multiplexing logic feed by the decoders and the micro-sequencer ROM that determine whose output is provided to a micro-op queue. Other embodiments of the decoder unit may have more or less decoders that decode more or less instructions and instruction subsets. For example, one embodiment may have a second, third, and fourth decoder that may each generate two micro-ops at a time; and may include a micro-sequencer ROM that generates eight micro-ops at a time.

Figure 23B:
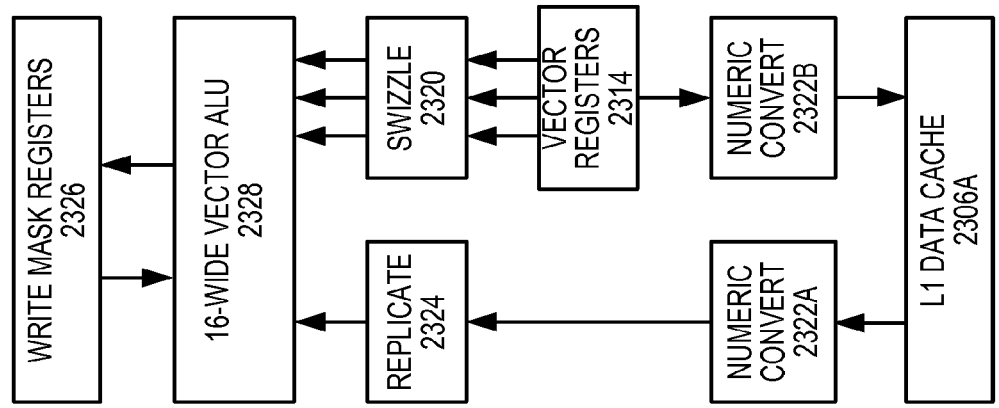
FIG. 23B is an exploded view of part of the CPU core in FIG. 23A according to embodiments of the invention.
Figure 23A:
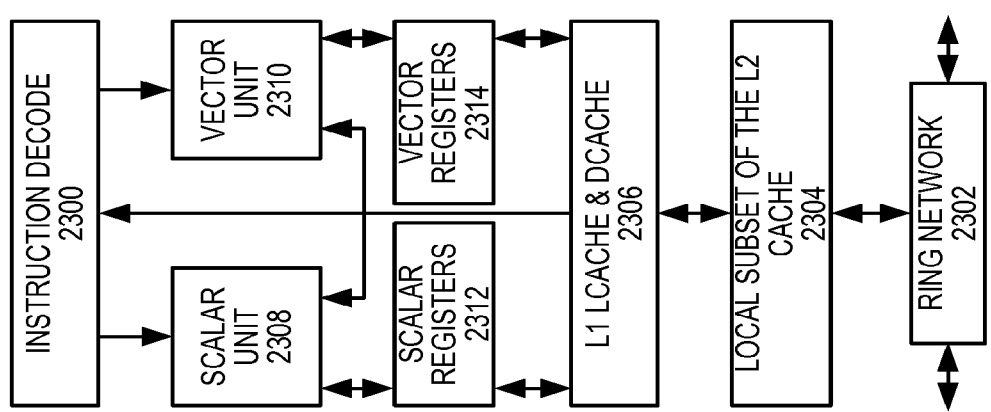
FIG. 23A is a block diagram of a single CPU core, along with its connection to the on-die interconnect network 2302 and with its local subset of the level 2 (L2) cache 2304, according to embodiments of the invention.
Figure 24:
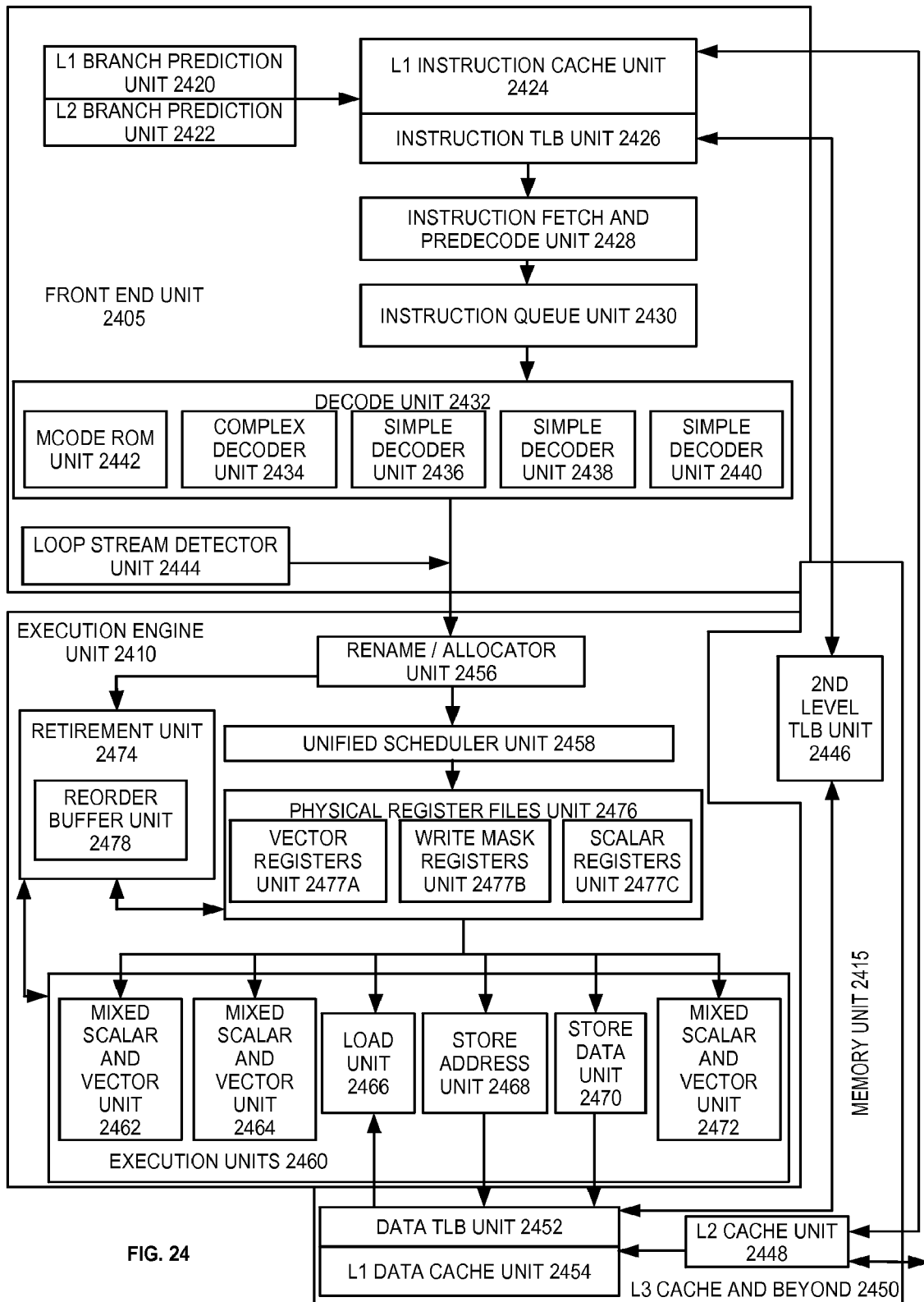
FIG. 24 is a block diagram illustrating an exemplary out-of-order architecture according to embodiments of the invention.

Exemplary Processor Architectures—FIGS. 23-24

Exemplary in-Order Processor Architecture—FIGS. 23A-23B

FIGS. 23A-B illustrate a block diagram of an exemplary in-order processor architecture. This exemplary embodiment is designed around multiple instantiations of an in-order CPU core that is augmented with a wide vector processor (VPU). Cores communicate through a high-bandwidth interconnect network with some fixed function logic, memory I/O interfaces, and other necessary I/O logic, depending on the exact application. For example, an implementation of this embodiment as a stand-alone GPU would typically include a PCIe bus.

FIG. 23A is a block diagram of a single CPU core, along with its connection to the on-die interconnect network 2302 and with its local subset of the level 2 (L2) cache 2304, according to embodiments of the invention. An instruction decoder 2300 supports the x86 instruction set with an extension including the specific vector instruction format 300. While in one embodiment of the invention (to simplify the design) a scalar unit 2308 and a vector unit 2310 use separate register sets (respectively, scalar registers 2312 and vector registers 2314) and data transferred between them is written to memory and then read back in from a level 1 (L1) cache 2306, alternative embodiments of the invention may use a different approach (e.g., use a single register set or include a communication path that allow data to be transferred between the two register files without being written and read back).

The L1 cache 2306 allows low-latency accesses to cache memory into the scalar and vector units. Together with load-op instructions in the vector friendly instruction format, this means that the L1 cache 2306 can be treated somewhat like an extended register file. This significantly improves the performance of many algorithms, especially with the eviction hint field 252B.

The local subset of the L2 cache 2304 is part of a global L2 cache that is divided into separate local subsets, one per CPU core. Each CPU has a direct access path to its own local subset of the L2 cache 2304. Data read by a CPU core is stored in its L2 cache subset 2304 and can be accessed quickly, in parallel with other CPUs accessing their own local L2 cache subsets. Data written by a CPU core is stored in its own L2 cache subset 2304 and is flushed from other subsets, if necessary. The ring network ensures coherency for shared data.

FIG. 23B is an exploded view of part of the CPU core in FIG. 23A according to embodiments of the invention. FIG. 23B includes an L1 data cache 2306A part of the L1 cache 2304, as well as more detail regarding the vector unit 2310 and the vector registers 2314. Specifically, the vector unit 2310 is a 16-wide vector processing unit (VPU) (see the 16-wide ALU 2328), which executes integer, single-precision float, and double-precision float instructions. The VPU supports swizzling the register inputs with swizzle unit 2320, numeric conversion with numeric convert units 2322A-B, and replication with replication unit 2324 on the memory input. Write mask registers 2326 allow predicating the resulting vector writes.

Register data can be swizzled in a variety of ways, e.g. to support matrix multiplication. Data from memory can be replicated across the VPU lanes. This is a common operation in both graphics and non-graphics parallel data processing, which significantly increases the cache efficiency.

The ring network is bi-directional to allow agents such as CPU cores, L2 caches and other logic blocks to communicate with each other within the chip. Each ring data-path is 512-bits wide per direction.

Exemplary Out-of-Order Architecture—FIG. 24

FIG. 24 is a block diagram illustrating an exemplary out-of-order architecture according to embodiments of the invention. Specifically, FIG. 24 illustrates a well-known exemplary out-of-order architecture that has been modified to incorporate the vector friendly instruction format and execution thereof. In FIG. 24 arrows denotes a coupling between two or more units and the direction of the arrow indicates a direction of data flow between those units. FIG. 24 includes a front end unit 2405 coupled to an execution engine unit 2410 and a memory unit 2415; the execution engine unit 2410 is further coupled to the memory unit 2415.

The front end unit 2405 includes a level 1 (L1) branch prediction unit 2420 coupled to a level 2 (L2) branch prediction unit 2422. The L1 and L2 brand prediction units 2420 and 2422 are coupled to an L1 instruction cache unit 2424. The L1 instruction cache unit 2424 is coupled to an instruction translation lookaside buffer (TLB) 2426 which is further coupled to an instruction fetch and predecode unit 2428. The instruction fetch and predecode unit 2428 is coupled to an instruction queue unit 2430 which is further coupled a decode unit 2432. The decode unit 2432 comprises a complex decoder unit 2434 and three simple decoder units 2436, 2438, and 2440. The decode unit 2432 includes a micro-code ROM unit 2442. The decode unit 2432 may operate as previously described above in the decode stage section. The L1 instruction cache unit 2424 is further coupled to an L2 cache unit 2448 in the memory unit 2415. The instruction TLB unit 2426 is further coupled to a second level TLB unit 2446 in the memory unit 2415. The decode unit 2432, the micro-code ROM unit 2442, and a loop stream detector unit 2444 are each coupled to a rename/allocator unit 2456 in the execution engine unit 2410.

The execution engine unit 2410 includes the rename/allocator unit 2456 that is coupled to a retirement unit 2474 and a unified scheduler unit 2458. The retirement unit 2474 is further coupled to execution units 2460 and includes a reorder buffer unit 2478. The unified scheduler unit 2458 is further coupled to a physical register files unit 2476 which is coupled to the execution units 2460. The physical register files unit 2476 comprises a vector registers unit 2477A, a write mask registers unit 2477B, and a scalar registers unit 2477C; these register units may provide the vector registers 510, the vector mask registers 515, and the general purpose registers 525; and the physical register files unit 2476 may include additional register files not shown (e.g., the scalar floating point stack register file 545 aliased on the MMX packed integer flat register file 550). The execution units 2460 include three mixed scalar and vector units 2462, 2464, and 2472; a load unit 2466; a store address unit 2468; a store data unit 2470. The load unit 2466, the store address unit 2468, and the store data unit 2470 are each coupled further to a data TLB unit 2452 in the memory unit 2415.

The memory unit 2415 includes the second level TLB unit 2446 which is coupled to the data TLB unit 2452. The data TLB unit 2452 is coupled to an L1 data cache unit 2454. The L1 data cache unit 2454 is further coupled to an L2 cache unit 2448. In some embodiments, the L2 cache unit 2448 is further coupled to L3 and higher cache units 2450 inside and/or outside of the memory unit 2415.

By way of example, the exemplary out-of-order architecture may implement the process pipeline 2200 as follows: 1) the instruction fetch and predecode unit 2428 perform the fetch and length decoding stages 1910 and 2012; 2) the decode unit 2432 performs the decode stage 1920; 3) the rename/allocator unit 2456 performs the allocation stage 2122 and renaming stage 2124; 4) the unified scheduler 2458 performs the schedule stage 2126; 5) the physical register files unit 2476, the reorder buffer unit 2478, and the memory unit 2415 perform the register read/memory read stage 1930; the execution units 2460 perform the execute/data transform stage 2245; 6) the memory unit 2415 and the reorder buffer unit 2478 perform the write back/memory write stage 1960; 7) the retirement unit 2474 performs the ROB read 2162 stage; 8) various units may be involved in the exception handling stage 2164; and 9) the retirement unit 2474 and the physical register files unit 2476 perform the commit stage 2166.

Figure 29:
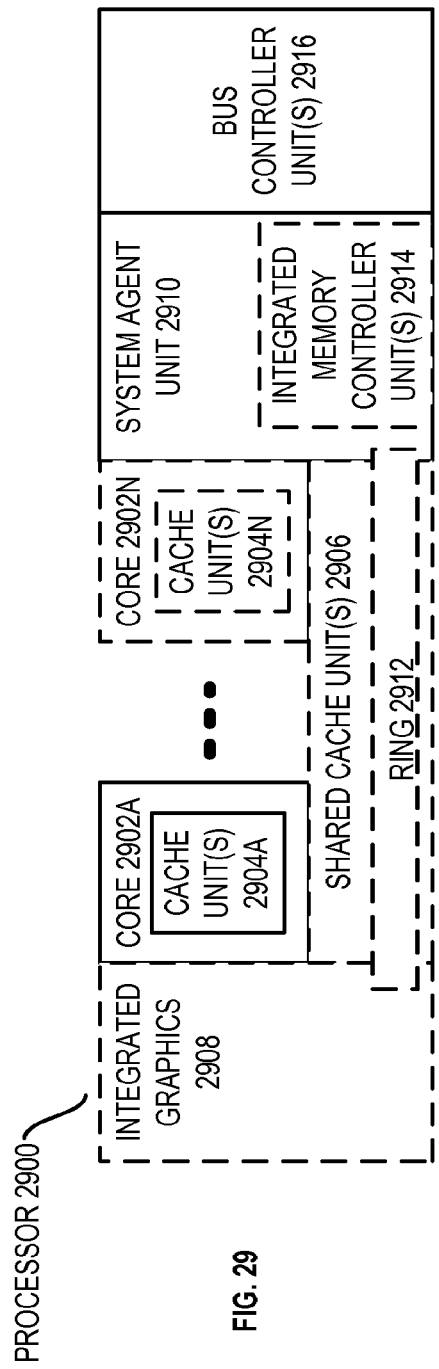
FIG. 29 is a block diagram of a single core processor and a multicore processor 2900 with integrated memory controller and graphics according to embodiments of the invention.

Exemplary Single Core and Multicore Processors—FIG. 29

FIG. 29 is a block diagram of a single core processor and a multicore processor 2900 with integrated memory controller and graphics according to embodiments of the invention. The solid lined boxes in FIG. 29 illustrate a processor 2900 with a single core 2902A, a system agent 2910, a set of one or more bus controller units 2916, while the optional addition of the dashed lined boxes illustrates an alternative processor 2900 with multiple cores 2902A-N, a set of one or more integrated memory controller unit(s) 2914 in the system agent unit 2910, and an integrated graphics logic 2908.

The memory hierarchy includes one or more levels of cache within the cores, a set or one or more shared cache units 2906, and external memory (not shown) coupled to the set of integrated memory controller units 2914. The set of shared cache units 2906 may include one or more mid-level caches, such as level 2 (L2), level 3 (L3), level 4 (L4), or other levels of cache, a last level cache (LLC), and/or combinations thereof. While in one embodiment a ring based interconnect unit 2912 interconnects the integrated graphics logic 2908, the set of shared cache units 2906, and the system agent unit 2910, alternative embodiments may use any number of well-known techniques for interconnecting such units.

In some embodiments, one or more of the cores 2902A-N are capable of multi-threading. The system agent 2910 includes those components coordinating and operating cores 2902A-N. The system agent unit 2910 may include for example a power control unit (PCU) and a display unit. The PCU may be or include logic and components needed for regulating the power state of the cores 2902A-N and the integrated graphics logic 2908. The display unit is for driving one or more externally connected displays.

The cores 2902A-N may be homogenous or heterogeneous in terms of architecture and/or instruction set. For example, some of the cores 2902A-N may be in order (e.g., like that shown in FIGS. 23A and 23B) while others are out-of-order (e.g., like that shown in FIG. 24). As another example, two or more of the cores 2902A-N may be capable of executing the same instruction set, while others may be capable of executing only a subset of that instruction set or a different instruction set. At least one of the cores is capable of executing the vector friendly instruction format described herein.

The processor may be a general-purpose processor, such as a Core™ i3, i5, i7, 2 Duo and Quad, Xeon™, or Itanium processors, which are available from Intel Corporation, of Santa Clara, Calif. Alternatively, the processor may be from another company. The processor may be a special-purpose processor, such as, for example, a network or communication processor, compression engine, graphics processor, co-processor, embedded processor, or the like. The processor may be implemented on one or more chips. The processor 2900 may be a part of and/or may be implemented on one or more substrates using any of a number of process technologies, such as, for example, BiCMOS, CMOS, or NMOS.

Exemplary Computer Systems and Processors—FIGS. 25-28

Figure 25:
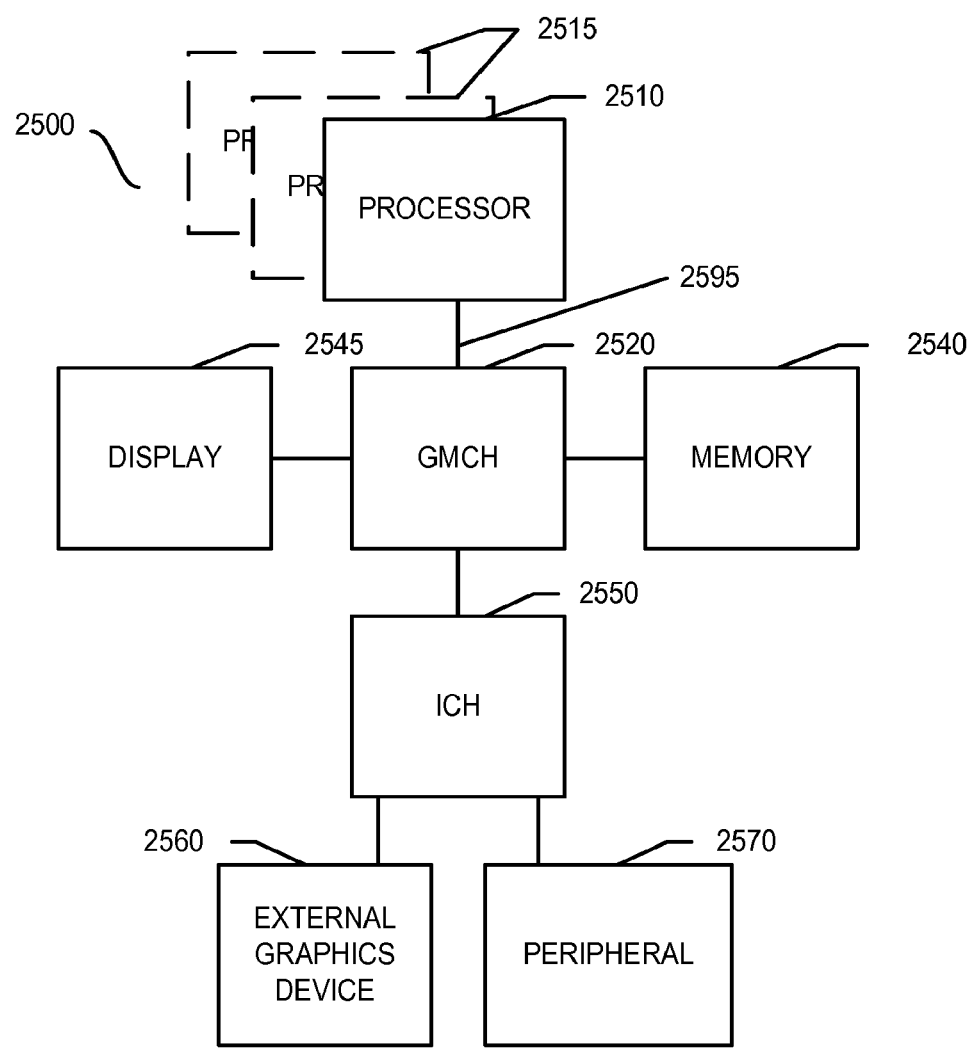
FIG. 25 is a block diagram of a system 2500 in accordance with one embodiment of the invention.
Figure 26:
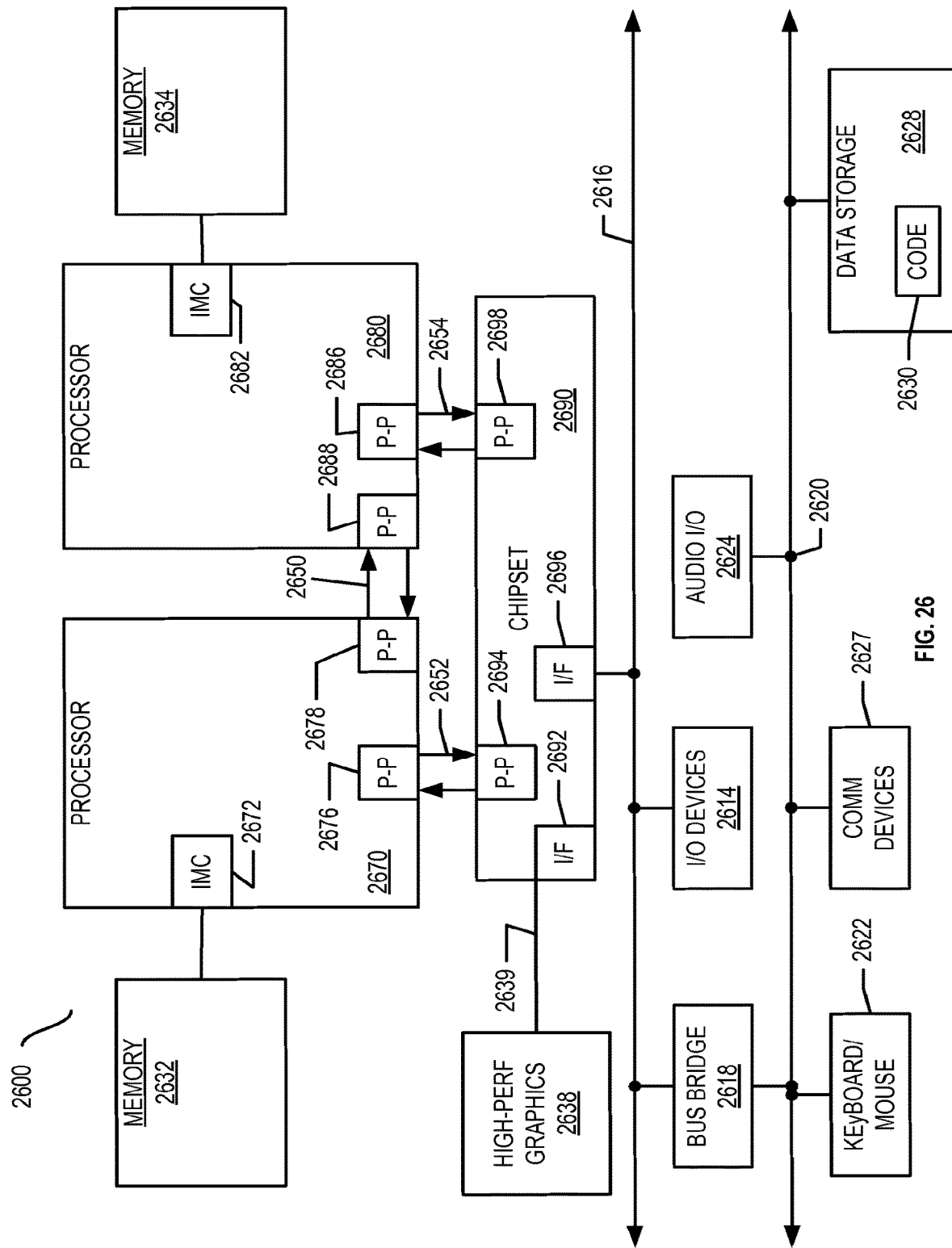
FIG. 26 is a block diagram of a second system 2600 in accordance with an embodiment of the invention.
Figure 27:
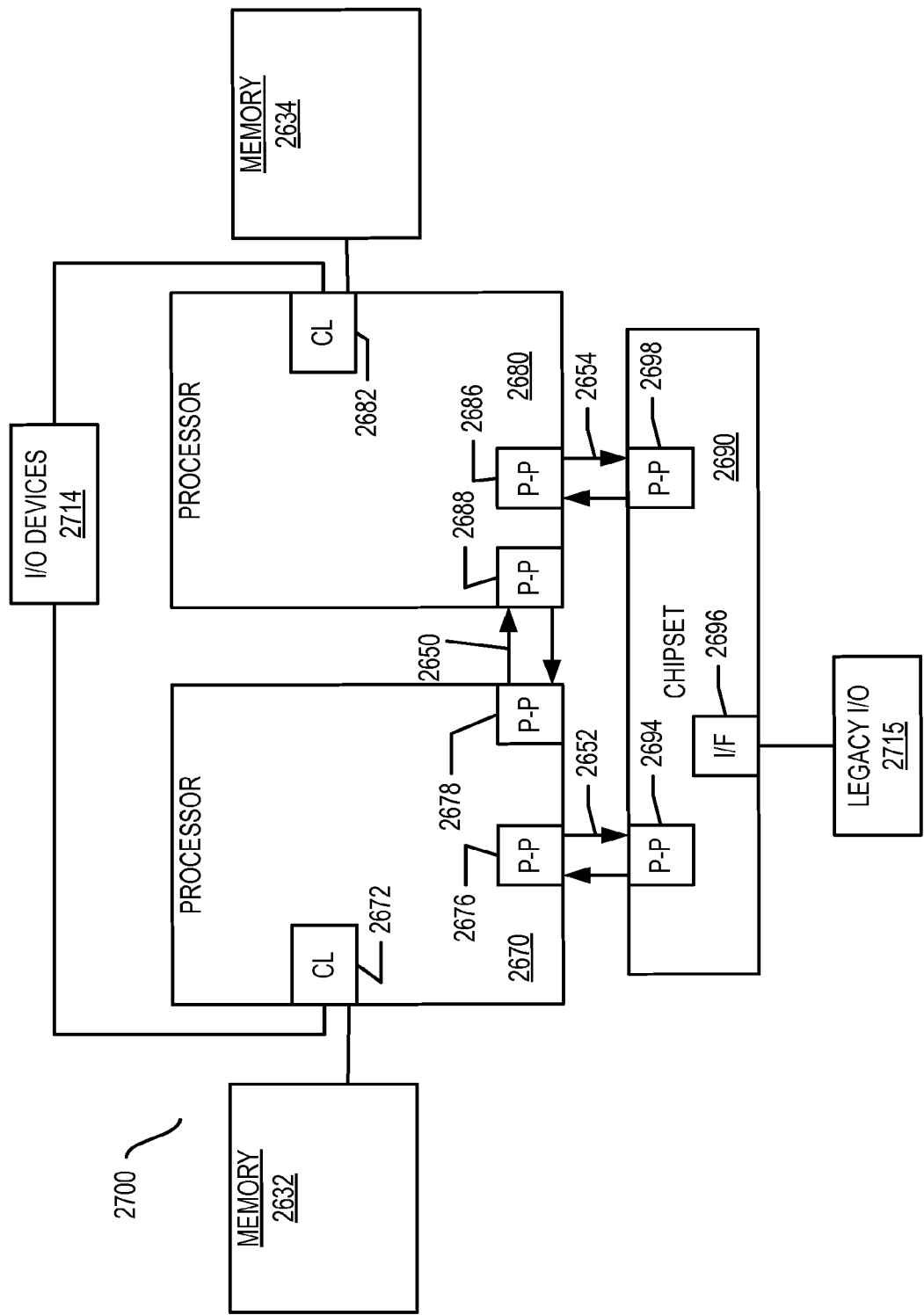
FIG. 27 is a block diagram of a third system 2700 in accordance with an embodiment of the invention.
Figure 28:
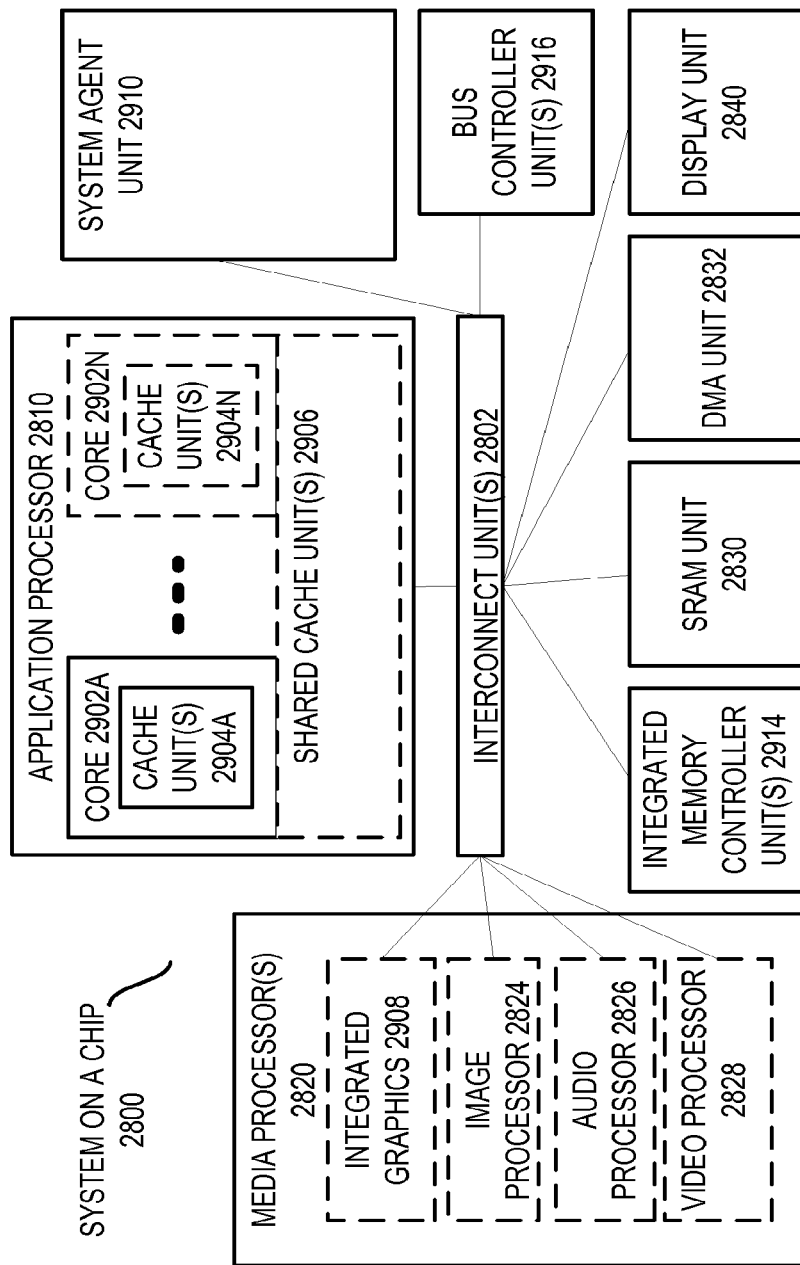
FIG. 28 is a block diagram of a SoC 2800 in accordance with an embodiment of the invention.

FIGS. 25-27 are exemplary systems suitable for including the processor 2900, while FIG. 28 is an exemplary system on a chip (SoC) that may include one or more of the cores 2902. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Referring now to FIG. 25, shown is a block diagram of a system 2500 in accordance with one embodiment of the invention. The system 2500 may include one or more processors 2510, 2515, which are coupled to graphics memory controller hub (GMCH) 2520. The optional nature of additional processors 2515 is denoted in FIG. 25 with broken lines.

Each processor 2510, 2515 may be some version of processor 2900. However, it should be noted that it is unlikely that integrated graphics logic and integrated memory control units would exist in the processors 2510, 2515.

FIG. 25 illustrates that the GMCH 2520 may be coupled to a memory 2540 that may be, for example, a dynamic random access memory (DRAM). The DRAM may, for at least one embodiment, be associated with a non-volatile cache.

The GMCH 2520 may be a chipset, or a portion of a chipset. The GMCH 2520 may communicate with the processor(s) 2510, 2515 and control interaction between the processor(s) 2510, 2515 and memory 2540. The GMCH 2520 may also act as an accelerated bus interface between the processor(s) 2510, 2515 and other elements of the system 2500. For at least one embodiment, the GMCH 2520 communicates with the processor(s) 2510, 2515 via a multi-drop bus, such as a frontside bus (FSB) 2595.

Furthermore, GMCH 2520 is coupled to a display 2545 (such as a flat panel display). GMCH 2520 may include an integrated graphics accelerator. GMCH 2520 is further coupled to an input/output (I/O) controller hub (ICH) 2550, which may be used to couple various peripheral devices to system 2500. Shown for example in the embodiment of FIG. 25 is an external graphics device 2560, which may be a discrete graphics device coupled to ICH 2550, along with another peripheral device 2570.

Alternatively, additional or different processors may also be present in the system 2500. For example, additional processor(s) 2515 may include additional processors(s) that are the same as processor 2510, additional processor(s) that are heterogeneous or asymmetric to processor 2510, accelerators (such as, e.g., graphics accelerators or digital signal processing (DSP) units), field programmable gate arrays, or any other processor. There can be a variety of differences between the physical resources 2510, 2515 in terms of a spectrum of metrics of merit including architectural, micro-architectural, thermal, power consumption characteristics, and the like. These differences may effectively manifest themselves as asymmetry and heterogeneity amongst the processing elements 2510, 2515. For at least one embodiment, the various processing elements 2510, 2515 may reside in the same die package.

Referring now to FIG. 26, shown is a block diagram of a second system 2600 in accordance with an embodiment of the present invention. As shown in FIG. 26, multiprocessor system 2600 is a point-to-point interconnect system, and includes a first processor 2670 and a second processor 2680 coupled via a point-to-point interconnect 2650. As shown in FIG. 26, each of processors 2670 and 2680 may be some version of the processor 2900.

Alternatively, one or more of processors 2670, 2680 may be an element other than a processor, such as an accelerator or a field programmable gate array.

While shown with only two processors 2670, 2680, it is to be understood that the scope of the present invention is not so limited. In other embodiments, one or more additional processing elements may be present in a given processor.

Processor 2670 may further include an integrated memory controller hub (IMC) 2672 and point-to-point (P-P) interfaces 2676 and 2678. Similarly, second processor 2680 may include a IMC 2682 and P-P interfaces 2686 and 2688. Processors 2670, 2680 may exchange data via a point-to-point (PtP) interface 2650 using PtP interface circuits 2678, 2688. As shown in FIG. 26, IMC's 2672 and 2682 couple the processors to respective memories, namely a memory 2632 and a memory 2634, which may be portions of main memory locally attached to the respective processors.

Processors 2670, 2680 may each exchange data with a chipset 2690 via individual P-P interfaces 2652, 2654 using point to point interface circuits 2676, 2694, 2686, 2698. Chipset 2690 may also exchange data with a high-performance graphics circuit 2638 via a high-performance graphics interface 2639.

A shared cache (not shown) may be included in either processor outside of both processors, yet connected with the processors via P-P interconnect, such that either or both processors' local cache information may be stored in the shared cache if a processor is placed into a low power mode.

Chipset 2690 may be coupled to a first bus 2616 via an interface 2696. In one embodiment, first bus 2616 may be a Peripheral Component Interconnect (PCI) bus, or a bus such as a PCI Express bus or another third generation I/O interconnect bus, although the scope of the present invention is not so limited.

As shown in FIG. 26, various I/O devices 2614 may be coupled to first bus 2616, along with a bus bridge 2618 which couples first bus 2616 to a second bus 2620. In one embodiment, second bus 2620 may be a low pin count (LPC) bus. Various devices may be coupled to second bus 2620 including, for example, a keyboard/mouse 2622, communication devices 2626 and a data storage unit 2628 such as a disk drive or other mass storage device which may include code 2630, in one embodiment. Further, an audio I/O 2624 may be coupled to second bus 2620. Note that other architectures are possible. For example, instead of the point-to-point architecture of FIG. 26, a system may implement a multi-drop bus or other such architecture.

Referring now to FIG. 27, shown is a block diagram of a third system 2700 in accordance with an embodiment of the present invention. Like elements in FIGS. 26 and 27 bear like reference numerals; and certain aspects of FIG. 26 have been omitted from FIG. 27 in order to avoid obscuring other aspects of FIG. 27.

FIG. 27 illustrates that the processing elements 2670, 2680 may include integrated memory and I/O control logic ("CL") 2672 and 2682, respectively. For at least one embodiment, the CL 2672, 2682 may include memory controller hub logic (IMC) such as that described above in connection with FIGS. 29 and 26. In addition. CL 2672, 2682 may also include I/O control logic. FIG. 27 illustrates that not only are the memories 2632, 2634 coupled to the CL 2672, 2682, but also that I/O devices 2714 are also coupled to the control logic 2672, 2682. Legacy I/O devices 2715 are coupled to the chipset 2690.

Referring now to FIG. 28, shown is a block diagram of a SoC 2800 in accordance with an embodiment of the present invention. Similar elements in FIG. 29 bear like reference numerals. Also, dashed lined boxes are optional features on more advanced SoCs. In FIG. 28, an interconnect unit(s) 2802 is coupled to: an application processor 2810 which includes a set of one or more cores 2902A-N and shared cache unit(s) 2906; a system agent unit 2910; a bus controller unit(s) 2916; an integrated memory controller unit(s) 2914; a set or one or more media processors 2820 which may include integrated graphics logic 2908, an image processor 2824 for providing still and/or video camera functionality, an audio processor 2826 for providing hardware audio acceleration, and a video processor 2828 for providing video encode/decode acceleration; an static random access memory (SRAM) unit 2830; a direct memory access (DMA) unit 2832; and a display unit 2840 for coupling to one or more external displays.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 2630 illustrated in FIG. 26, may be applied to input data to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks (compact disk read-only memories (CD-ROMs), compact disk rewritables (CD-RWs)), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

Accordingly, embodiments of the invention also include non-transitory, tangible machine-readable media containing instructions the vector friendly instruction format or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 30 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 30 shows a program in a high level language 3002 may be compiled using an x86 compiler 3004 to generate x86 binary code 3006 that may be natively executed by a processor with at least one x86 instruction set core 3016 (it is assume that some of the instructions that were compiled are in the vector friendly instruction format). The processor with at least one x86 instruction set core 3016 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 3004 represents a compiler that is operable to generate x86 binary code 3006 (e.g., object code) that can, with or without additional linkage processing, be executed on the processor with at least one x86 instruction set core 3016. Similarly, FIG. 30 shows the program in the high level language 3002 may be compiled using an alternative instruction set compiler 3008 to generate alternative instruction set binary code 3010 that may be natively executed by a processor without at least one x86 instruction set core 3014 (e.g., a processor with cores that execute the MIPS instruction set of MIPS Technologies of Sunnyvale, Calif. and/or that execute the ARM instruction set of ARM Holdings of Sunnyvale, Calif.). The instruction converter 3012 is used to convert the x86 binary code 3006 into code that may be natively executed by the processor without an x86 instruction set core 3014. This converted code is not likely to be the same as the alternative instruction set binary code 3010 because an instruction converter capable of this is difficult to make; however, the converted code will accomplish the general operation and be made up of instructions from the alternative instruction set. Thus, the instruction converter 3012 represents software, firmware, hardware, or a combination thereof that, through emulation, simulation or any other process, allows a processor or other electronic device that does not have an x86 instruction set processor or core to execute the x86 binary code 3006.

Certain operations of the instruction(s) in the vector friendly instruction format disclosed herein may be performed by hardware components and may be embodied in machine-executable instructions that are used to cause, or at least result in, a circuit or other hardware component programmed with the instructions performing the operations. The circuit may include a general-purpose or special-purpose processor, or logic circuit, to name just a few examples. The operations may also optionally be performed by a combination of hardware and software. Execution logic and/or a processor may include specific or particular circuitry or other logic responsive to a machine instruction or one or more control signals derived from the machine instruction to store an instruction specified result operand. For example, embodiments of the instruction(s) disclosed herein may be executed in one or more the systems of FIGS. 25-28 and embodiments of the instruction(s) in the vector friendly instruction format may be stored in program code to be executed in the systems. Additionally, the processing elements of these figures may utilize one of the detailed pipelines and/or architectures (e.g., the in-order and out-of-order architectures) detailed herein. For example, the decode unit of the in-order architecture may decode the instruction(s), pass the decoded instruction to a vector or scalar unit, etc.

The above description is intended to illustrate preferred embodiments of the present invention. From the discussion above it should also be apparent that especially in such an area of technology, where growth is fast and further advancements are not easily foreseen, the invention can may be modified in arrangement and detail by those skilled in the art without departing from the principles of the present invention within the scope of the accompanying claims and their equivalents. For example, one or more operations of a method may be combined or further broken apart.

ALTERNATIVE EMBODIMENTS

While embodiments have been described which would natively execute the vector friendly instruction format, alternative embodiments of the invention may execute the vector friendly instruction format through an emulation layer running on a processor that executes a different instruction set (e.g., a processor that executes the MIPS instruction set of MIPS Technologies of Sunnyvale, Calif., a processor that executes the ARM instruction set of ARM Holdings of Sunnyvale, Calif.). Also, while the flow diagrams in the figures show a particular order of operations performed by certain embodiments of the invention, it should be understood that such order is exemplary (e.g., alternative embodiments may perform the operations in a different order, combine certain operations, overlap certain operations, etc.).

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate embodiments of the invention. The scope of the invention is not to be determined by the specific examples provided above but only by the claims below.

What is claimed is:

1. An apparatus comprising:
  a processor configured to execute an instruction set, wherein the instruction set includes a first instruction format, wherein the first instruction format has a plurality of fields including a base operation field, a modifier field, a class field, an alpha field, and a beta field, wherein the first instruction format supports different versions of base operations and different augmentation operations through placement of different values in the base operation field, the modifier field, the class field, the alpha field, and the beta field, and wherein only one of the different values may be placed in each of the base operation field, the modifier field, the class field, the alpha field, and the beta field on each occurrence of an instruction in the first instruction format in instruction streams, wherein a first value in the class field specifies a first class and a second value specifies a second class, the processor including,
    a decode unit to decode the occurrences of the instructions in the first instruction format follows:
      distinguish the occurrences of instructions in the first instruction format that specify memory access from those that do not based on the modifier field's content in those different occurrences, wherein the beta field is interpreted as a broadcast field and a vector length field when the modifier field's content specifies memory access, wherein part of the beta field is interpreted as an RL field when the modifier field's content do not specify memory access;
      distinguish, for each of the occurrences that specifies memory access through the modifier field's content, whether to perform a broadcast operation or not and which one of a plurality of vector lengths to use based on the beta field's content and its interpretation as the broadcast field and the vector length field in that occurrence; and
      distinguish, for each of the occurrences that does not specify memory access through the modifier field's content, whether to augment with a round type operation or with a vector length type operation based on the RL field's content in that occurrence, wherein a remainder of the beta field is interpreted as a round operation field when the RL field's content indicates the round type operation, and wherein the remainder of the beta field is instead interpreted as the vector length field when the RL field's content indicates the vector length type operation;

distinguish, for each of the occurrences that does not specify memory access through the modifier field's content and that does specify the round type operation through the RL field's content, which one of a plurality of round operations to apply based on the beta field's content and its interpretation as the round operation field in that occurrence; and distinguish, for each of the occurrences, whether to perform a merging write mask operation or a zeroing write mask operation based on the alpha field's content and its interpretation as a write mask control field in that occurrence.

2. The apparatus of claim 1, wherein the plurality of round operations includes round to nearest, round down, round up, and round toward zero.

3. The apparatus of claim 1, wherein the first instruction format further includes a data element width field, wherein the first instruction format supports through different values in the data element width field specification of different data element widths.

4. The apparatus of claim 3, wherein the different data element widths include 32 bits and 64 bits.

5. The apparatus of claim 1, wherein the first instruction format also supports through different values in a real opcode field inside the base operation field the specification of an 8 bit and a 16 bit data element width.

6. The apparatus of claim 1, wherein the first instruction format further includes a real opcode field inside the base operation field, wherein the real opcode field's content distinguishes whether the data element width field's content selects between a 64 bit and a 32 bit data element size or selects between a 16 bit and an 8 bit data element size for each of the occurrences.

7. The apparatus of claim 1, wherein the plurality of vector lengths include 128 bits, 256 bits, and 512 bits.

8. The apparatus of claim 1, wherein the broadcast operation includes 1-element granularity broadcast.

9. The apparatus of claim 1, wherein at least certain of the different base operations operate on two source operands and a destination operand does not overwrite either of the two source operands.

10. The apparatus of claim 1, wherein at least certain of the different base operations operate on two source operands and a destination operand overwrites one of the two source operands.

11. The apparatus of claim 1, wherein the second class supports the modifier field's content specifying a memory access operation with a scaled displacement, in which case the first instruction format includes a displacement factor field and fields from which a scale, an index, and a base are pulled, wherein the scaled displacement is generated based on multiplying the size of a memory access by the displacement factor field's content, and wherein the scale, index, base, and scaled displacement are used to generate an address for the memory access.

12. The apparatus of claim 11, wherein the address is generated by $2^{scale}$+the index+the base+the scaled displacement.

13. The apparatus of claim 11, wherein the displacement factor field's content is interpreted as a signed value between −128 and 127.

14. The apparatus of claim 11, wherein the supported sizes of the memory access are 1 byte, 2 bytes, 4 bytes, 8 bytes, 16 bytes, 32 bytes, and 64 bytes.

15. An apparatus comprising:

an instruction converter to convert an instruction from a first instruction set to one or more instructions of a different second instruction set, wherein the first instruction set includes a first instruction format, wherein the first instruction format has a plurality of fields including a base operation field, a modifier field, an alpha field, and a beta field, wherein the first instruction format supports different versions of base operations and different augmentation operations through placement of different values in the base operation field, the modifier field, the alpha field, and the beta field, and wherein only one of the different values may be placed in each of the base operation field, the modifier field, the alpha field, and the beta field on each occurrence of an instruction in the first instruction format in instruction streams, the instruction converter to determine the occurrences of the instructions in the first instruction format for translation as follows:

distinguish the occurrences of instructions in the first instruction format that specify memory access from those that do not based on the modifier field's content in those different occurrences, wherein the beta field is interpreted as a broadcast field and a vector length field when the modifier field's content specifies memory access, wherein part of the beta field is interpreted as an RL field when the modifier field's content do not specify memory access;

distinguish, for each of the occurrences that specifies memory access through the modifier field's content, whether to perform a broadcast operation or not and which one of a plurality of vector lengths to use based on the beta field's content and its interpretation as the broadcast field and the vector length field in that occurrence; and distinguish, for each of the occurrences that does not specify memory access through the modifier field's content, whether to augment with a round type operation or with a vector length type operation based on the RL field's content in that occurrence, wherein a remainder of the beta field is interpreted as a round operation field when the RL field's content indicates the round type operation, and wherein the remainder of the beta field is instead interpreted as the vector length field when the RL field's content indicates the vector length type operation;

distinguish, for each of the occurrences that does not specify memory access through the modifier field's content and that does specify the round type operation through the RL field's content, which one of a plurality of round operations to apply based on the beta field's content and its interpretation as the round operation field in that occurrence; and distinguish, for each of the occurrences, whether to perform a merging write mask operation or a zeroing write mask operation based on the alpha field's content and its interpretation as a write mask control field in that occurrence; and a processor coupled with the instruction converter, the processor to decode and execute the one or more instructions of the second different instruction set, which have been converted from the instruction of the first instruction set.

16. The apparatus of claim 15, wherein the plurality of round operations includes round to nearest, round down, round up, and round toward zero.

17. The apparatus of claim 15, wherein the first instruction format further includes a data element width field, wherein the first instruction format supports through different values in the data element width field specification of different data element widths.

18. The apparatus of claim 17, wherein the different data element widths include 32 bits and 64 bits.

19. The apparatus of claim 15, wherein the first instruction format also supports through different values in a real opcode field inside the base operation field the specification of an 8 bit and a 16 bit data element width.

20. The apparatus of claim 15, wherein the first instruction format further includes a real opcode field inside the base operation field, wherein the real opcode field's content distinguishes whether the data element width field's content selects between a 64 bit and a 32 bit data element size or selects between a 16 bit and an 8 bit data element size for each of the occurrences.

21. The apparatus of claim 15, wherein the plurality of vector lengths include 128 bits, 256 bits, and 512 bits.

22. The apparatus of claim 15, wherein p includes 1-element granularity broadcast.

23. The apparatus of claim 15, wherein at least certain of the different base operations operate on two source operands and a destination operand does not overwrite either of the two source operands.

24. The apparatus of claim 15, wherein at least certain of the different base operations operate on two source operands and a destination operand overwrites one of the two source operands.

25. The apparatus of claim 15, wherein the first instruction format supports the modifier field's content specifying a memory access operation with a scaled displacement, in which case the first instruction format includes a displacement factor field and fields from which a scale, an index, and a base are pulled, wherein the scaled displacement is generated based on multiplying the size of a memory access by the displacement factor field's content, and wherein the scale, index, base, and scaled displacement are used to generate an address for the memory access.

26. The apparatus of claim 25, wherein the address is generated by $2^{scale}$+the index+the base+the scaled displacement.

27. The apparatus of claim 25, wherein the displacement factor field's content is interpreted as a signed value between −128 and 127.

28. The apparatus of claim 25, wherein the supported sizes of the memory access are 1 byte, 2 bytes, 4 bytes, 8 bytes, 16 bytes, 32 bytes, and 64 bytes.

* * * * *